US010811068B2

(12) United States Patent
Li et al.

(10) Patent No.: US 10,811,068 B2
(45) Date of Patent: Oct. 20, 2020

(54) VARYING ENERGY BARRIERS OF MAGNETIC TUNNEL JUNCTIONS (MTJS) IN DIFFERENT MAGNETO-RESISTIVE RANDOM ACCESS MEMORY (MRAM) ARRAYS IN A SEMICONDUCTOR DIE TO FACILITATE USE OF MRAM FOR DIFFERENT MEMORY APPLICATIONS

(71) Applicant: QUALCOMM Incorporated, San Diego, CA (US)

(72) Inventors: Xia Li, San Diego, CA (US); Wei-Chuan Chen, Scarsdale, NY (US); Wah Nam Hsu, San Diego, CA (US); Seung Hyuk Kang, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 16/247,247

(22) Filed: Jan. 14, 2019

(65) Prior Publication Data

US 2019/0147930 A1 May 16, 2019

Related U.S. Application Data

(62) Division of application No. 15/688,212, filed on Aug. 28, 2017, now abandoned.

(51) Int. Cl.
*G11C 11/16* (2006.01)
*H01F 10/32* (2006.01)
(Continued)

(52) U.S. Cl.
CPC ............ *G11C 11/161* (2013.01); *G11C 11/15* (2013.01); *G11C 11/1653* (2013.01);
(Continued)

(58) Field of Classification Search
CPC .............................. G11C 11/161; H01L 43/12
See application file for complete search history.

(56) References Cited

U.S. PATENT DOCUMENTS 9,437,272 B1    9/2016  Lu et al.
2003/0235071 A1  12/2003 Okazawa
(Continued)

FOREIGN PATENT DOCUMENTS

JP    2007324269 A  * 12/2007  ......... G11C 19/0808
JP    2007324269 A    12/2007
WO   2015148059 A1    10/2015

OTHER PUBLICATIONS

Barr, Michael, "Types of Memory in Embedded Systems," Embedded Systems Programming, BARR group, May 2001, pp. 103-104.
(Continued)

*Primary Examiner* — Thao X Le
*Assistant Examiner* — Laura M Dykes
(74) *Attorney, Agent, or Firm* — Withrow & Terranova, PLLC

(57) ABSTRACT

Varying energy barriers of magnetic tunnel junctions (MTJs) in different magneto-resistive random access memory (MRAM) arrays in a semiconductor die to facilitate use of MRAM for different memory applications is disclosed. In one aspect, energy barriers of MTJs in different MRAM arrays are varied. The energy barrier of an MTJ affects its write performance as the amount of switching current required to switch the magnetic orientation of a free layer of the MTJ is a function of its energy barrier. Thus, by varying the energy barriers of the MTJs in different MRAM arrays in a semiconductor die, different MRAM arrays may be used for different types of memory provided in the semiconductor die while still achieving distinct performance specifications. The energy barrier of an MTJ can be varied by varying the
(Continued)

materials, heights, widths, and/or other characteristics of MTJ stacks.

15 Claims, 54 Drawing Sheets

(51) Int. Cl.
  G11C 11/15 (2006.01)
  H01L 43/08 (2006.01)
  H01L 27/22 (2006.01)
  H01L 43/12 (2006.01)
(52) U.S. Cl.
  CPC ...... *G11C 11/1659* (2013.01); *G11C 11/1675* (2013.01); *H01F 10/3295* (2013.01); *H01L 27/228* (2013.01); *H01L 43/08* (2013.01); *H01L 43/12* (2013.01)

(56) References Cited

U.S. PATENT DOCUMENTS

| | | | |
|---|---|---|---|
| 2004/0023065 A1* | 2/2004 | Daughton | A45B 25/12 428/811.1 |
| 2005/0002229 A1 | 1/2005 | Matsutera et al. | |
| 2005/0063221 A1 | 3/2005 | Motoyoshi | |
| 2009/0303779 A1 | 12/2009 | Chen et al. | |
| 2011/0277508 A1 | 11/2011 | Osawa et al. | |
| 2012/0002466 A1 | 1/2012 | Higo et al. | |
| 2012/0088125 A1 | 4/2012 | Nishiyama et al. | |
| 2012/0201075 A1 | 8/2012 | Zhu et al. | |
| 2013/0130406 A1 | 5/2013 | Zhu et al. | |
| 2014/0015073 A1 | 1/2014 | Lee et al. | |
| 2014/0264668 A1* | 9/2014 | Lee | H01L 43/12 257/421 |
| 2015/0371694 A1 | 12/2015 | Solihin | |
| 2016/0020250 A1 | 1/2016 | Li et al. | |
| 2016/0254445 A1 | 9/2016 | Tahmasebi et al. | |
| 2017/0092845 A1* | 3/2017 | Chuang | G11C 11/161 |
| 2019/0066746 A1 | 2/2019 | Li et al. | |

OTHER PUBLICATIONS

Chen, John Y. et al., "Design/Technology Enablers for Computing Applications," 2016 IEEE International Electron Devices Meeting (IEDM), Dec. 4, 2016, San Francisco, California, 273 slides.

Meena, Jagan Singh et al., "Overview of emerging nonvolatile memory technologies", Nanoscale Research Letter, 2014, 9:526, 33 pages.

Slaughter, J.M. et al., "Technology for Reliable Spin-Torque MRAM Products," 2016 IEEE International Electron Devices Meeting (IEDM), 2016, IEEE, pp. 21.5.1 to 21.5.4.

International Search Report and Written Opinion for PCT/US2018/048158, dated Dec. 6, 2018, 17 pages.

International Preliminary Report on Patentability for PCT/US2018/048158, dated Mar. 12, 2020, 10 pages.

* cited by examiner

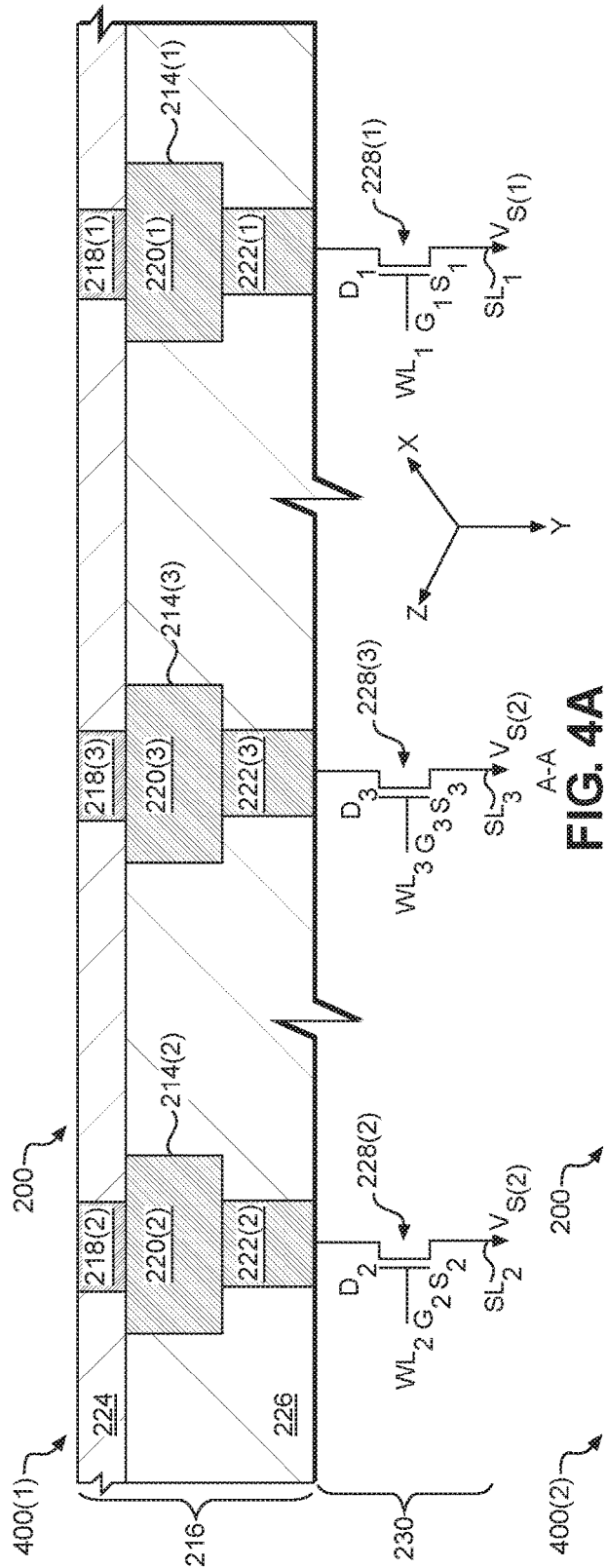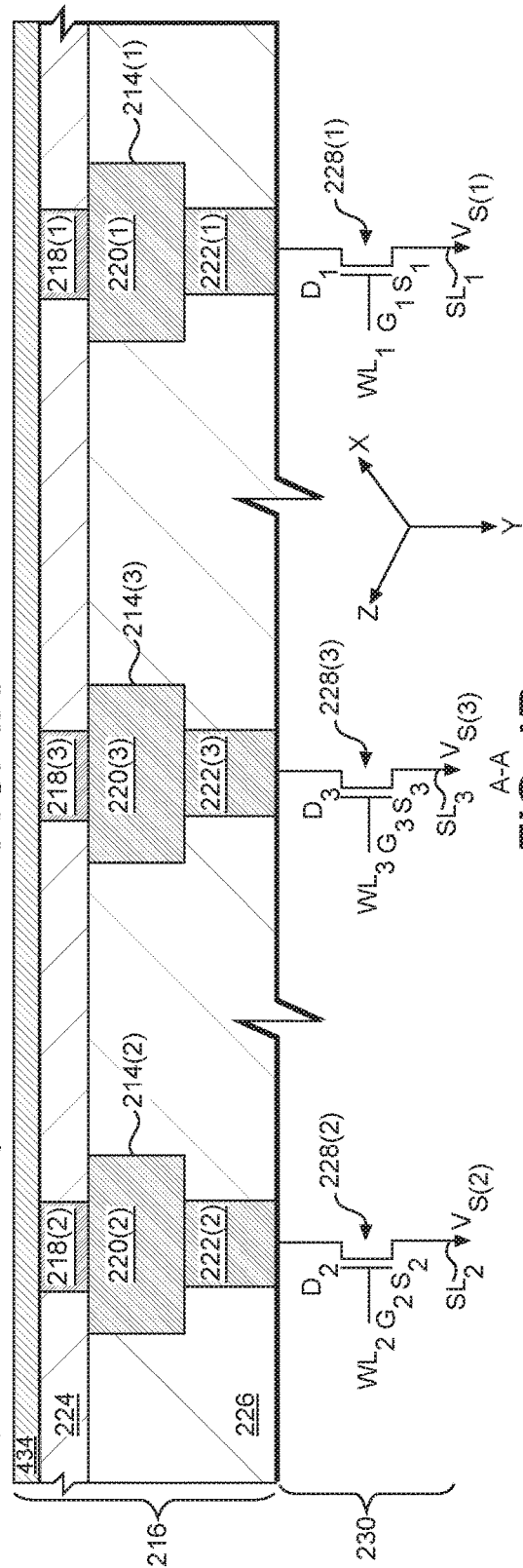

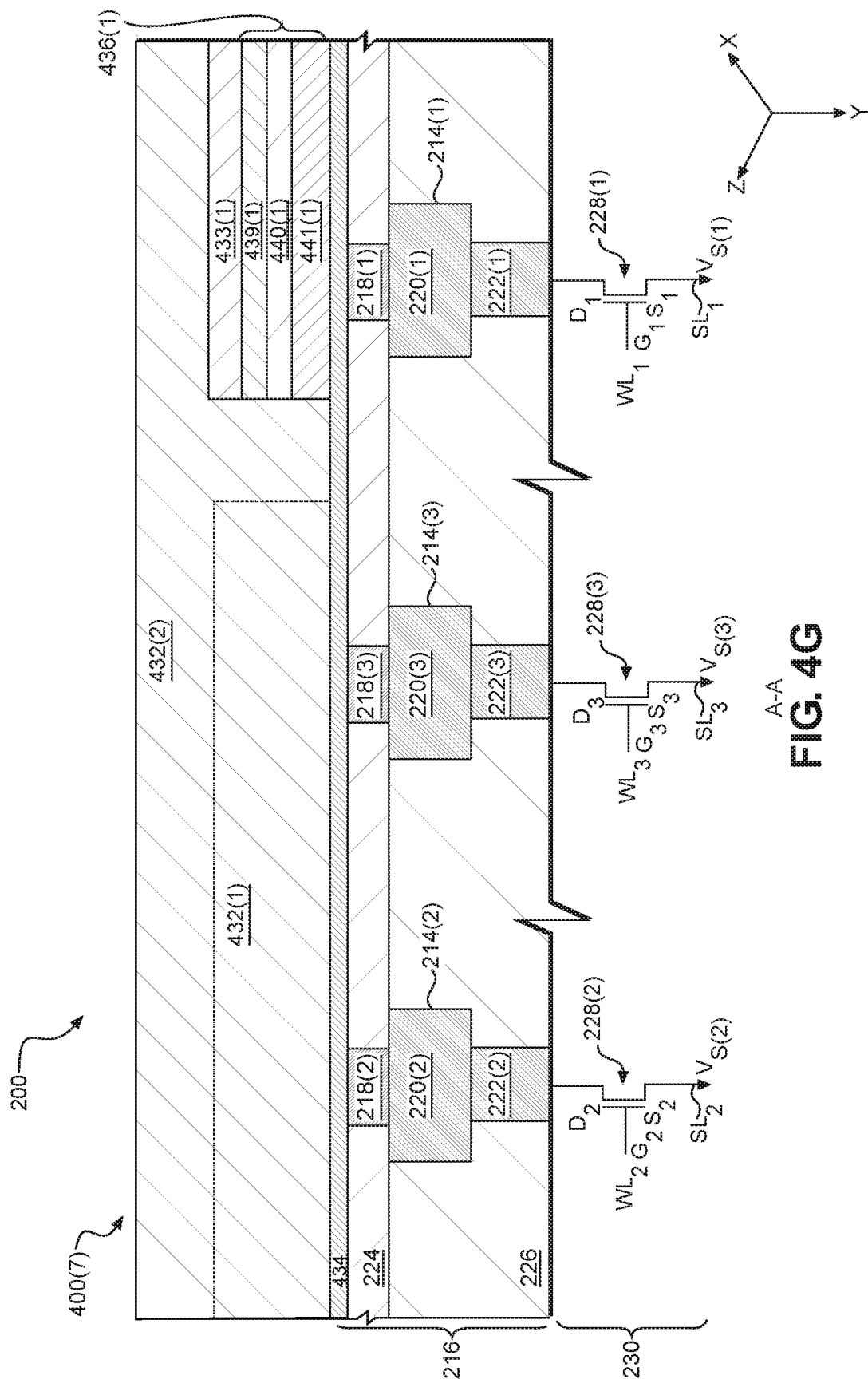

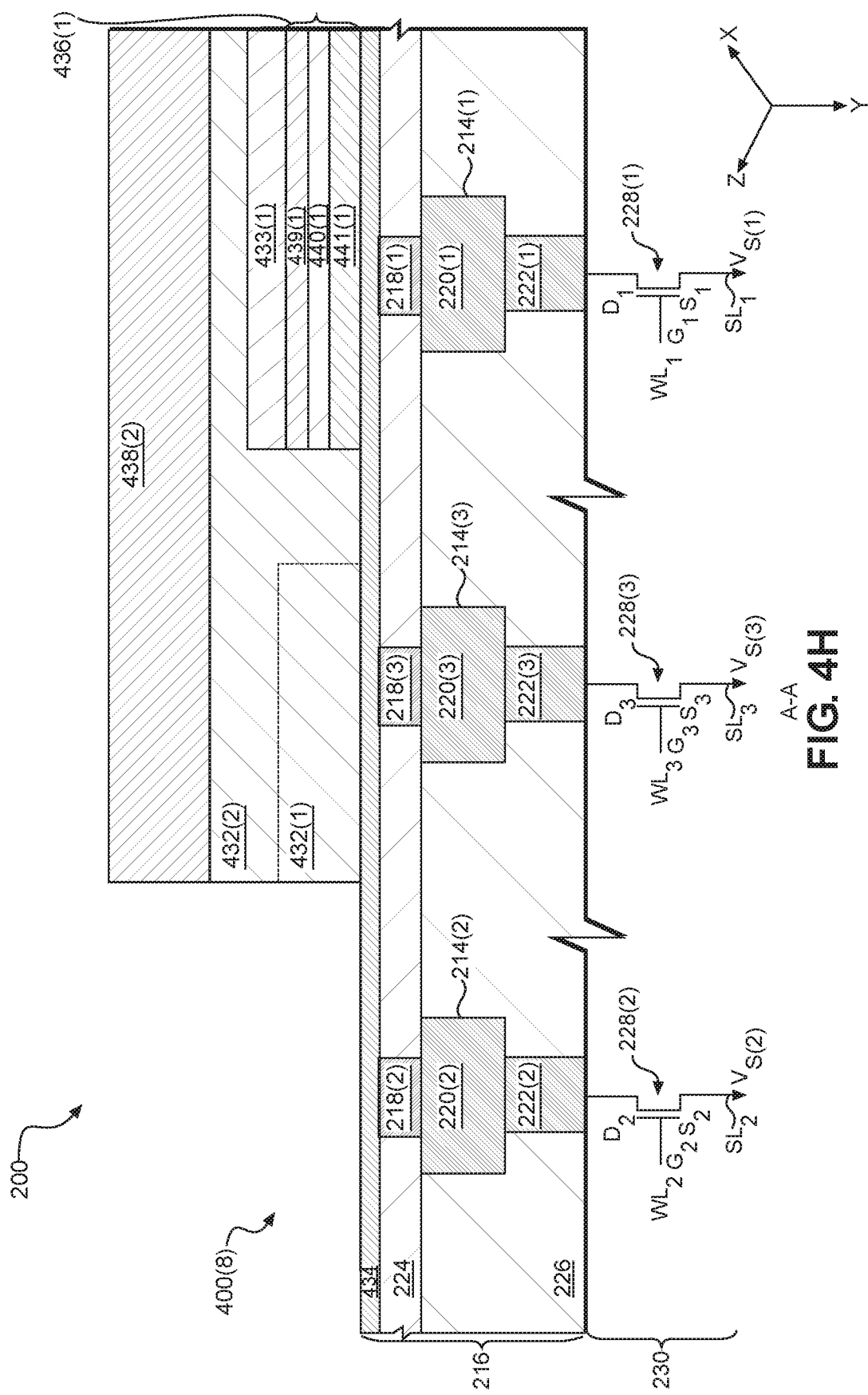

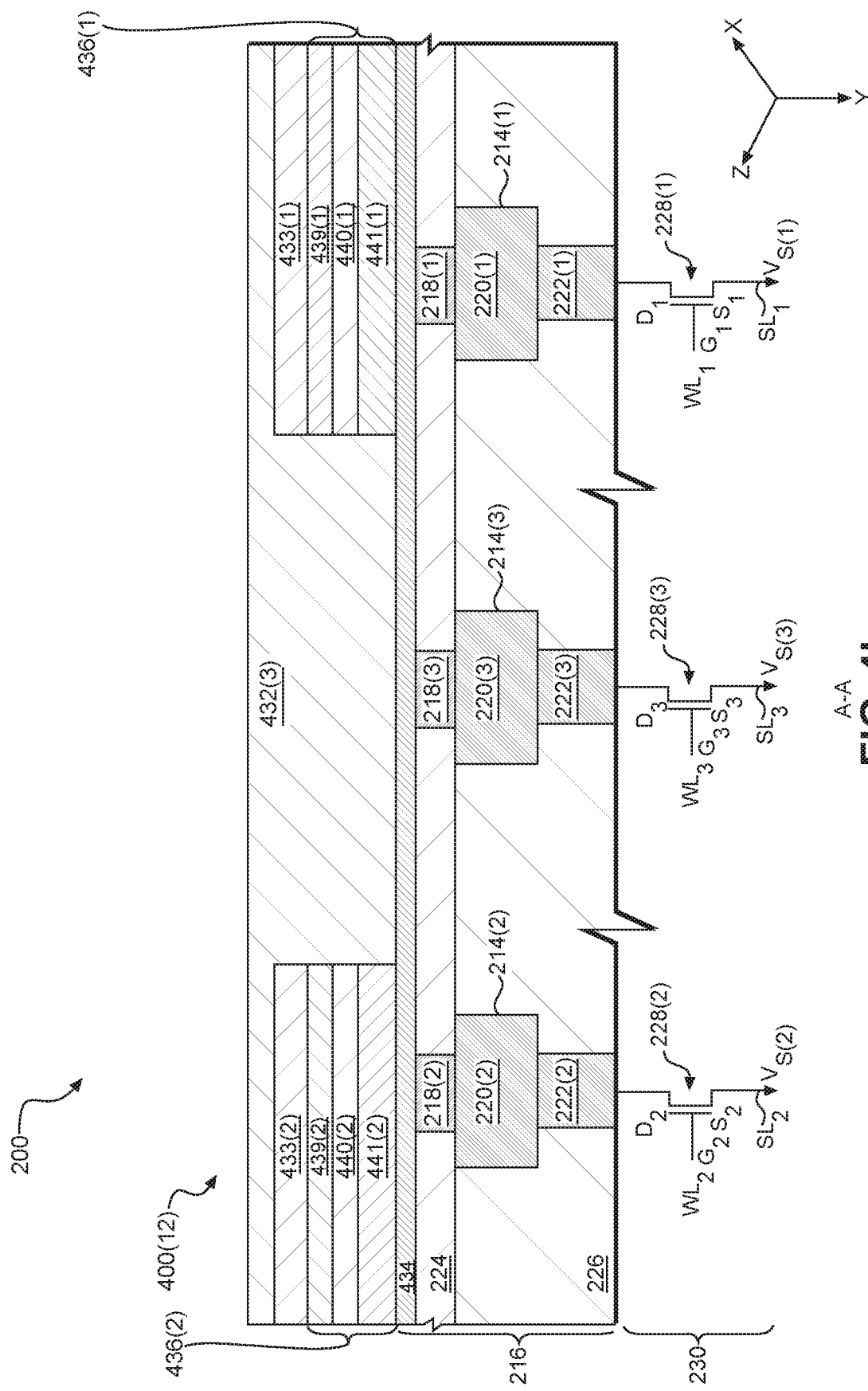

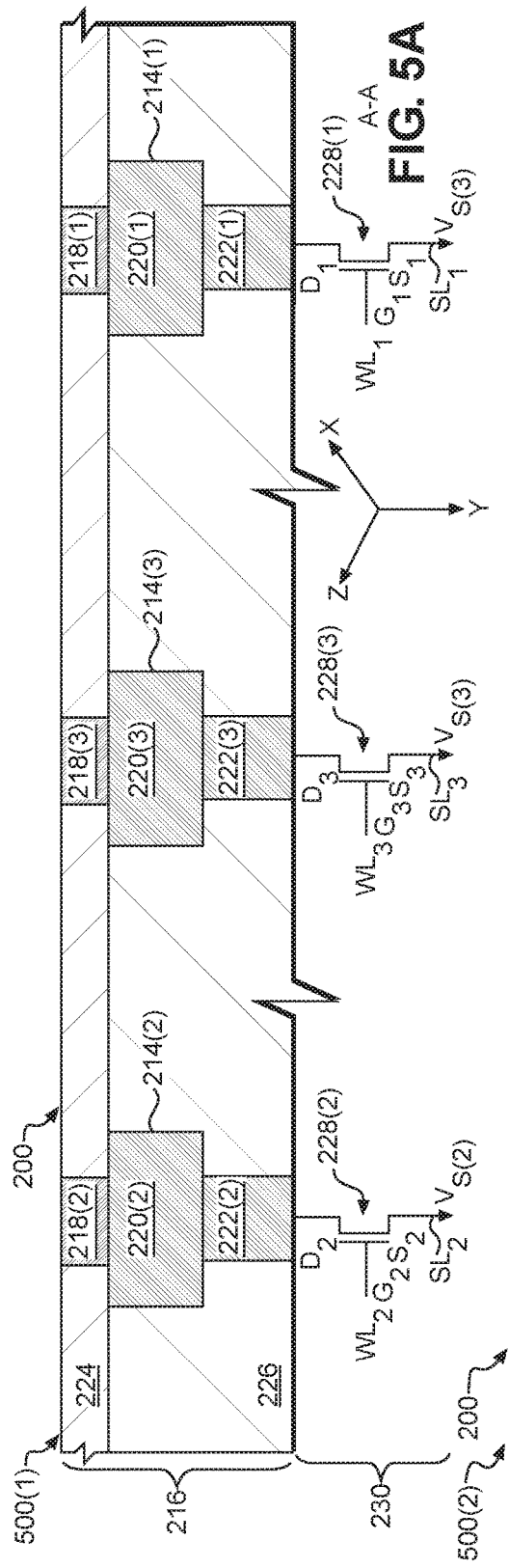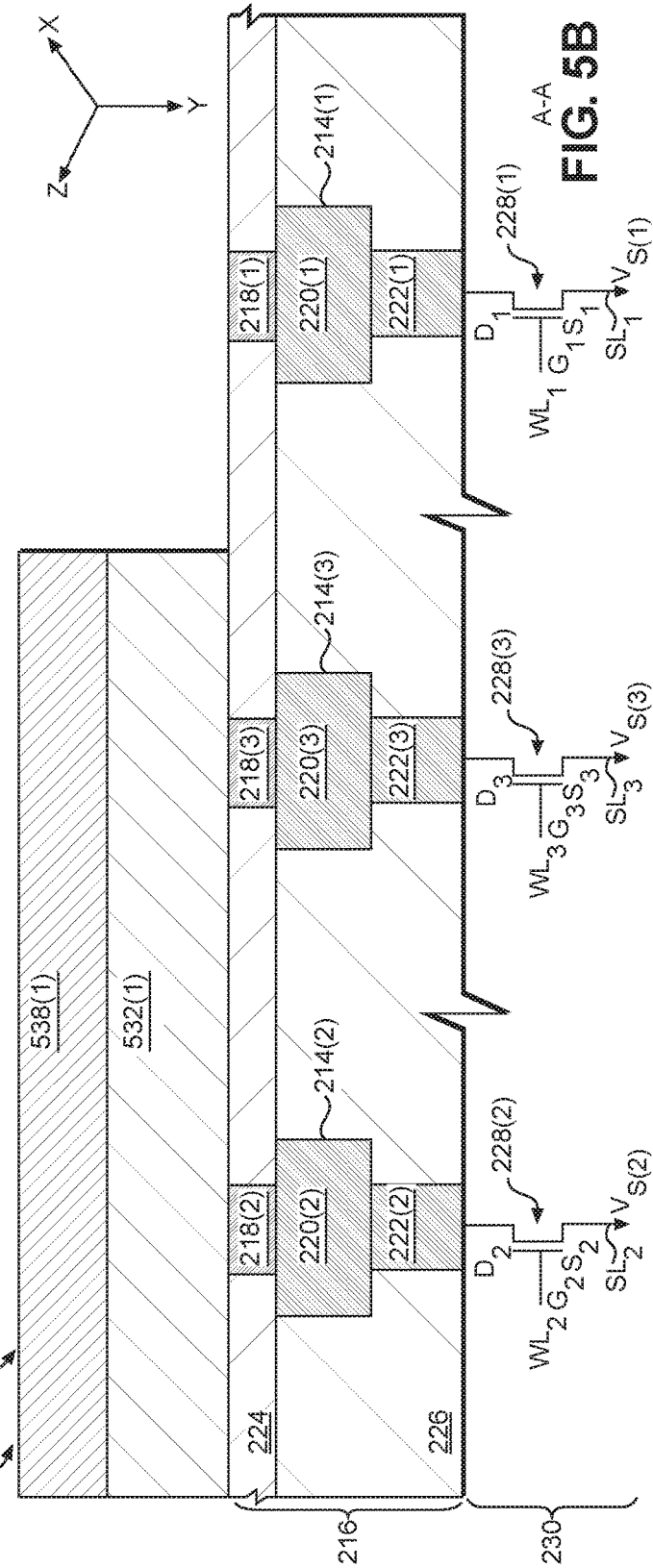

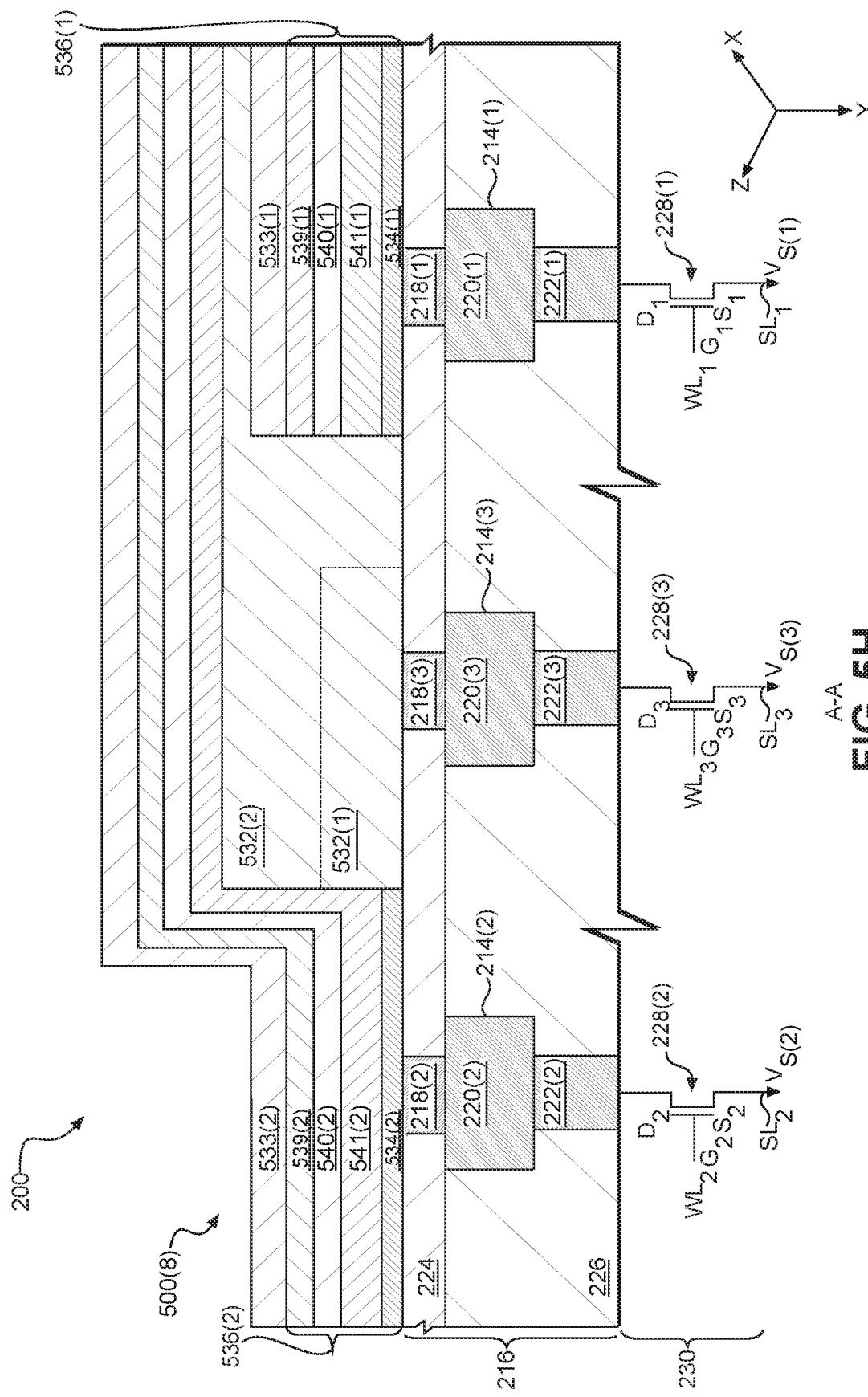

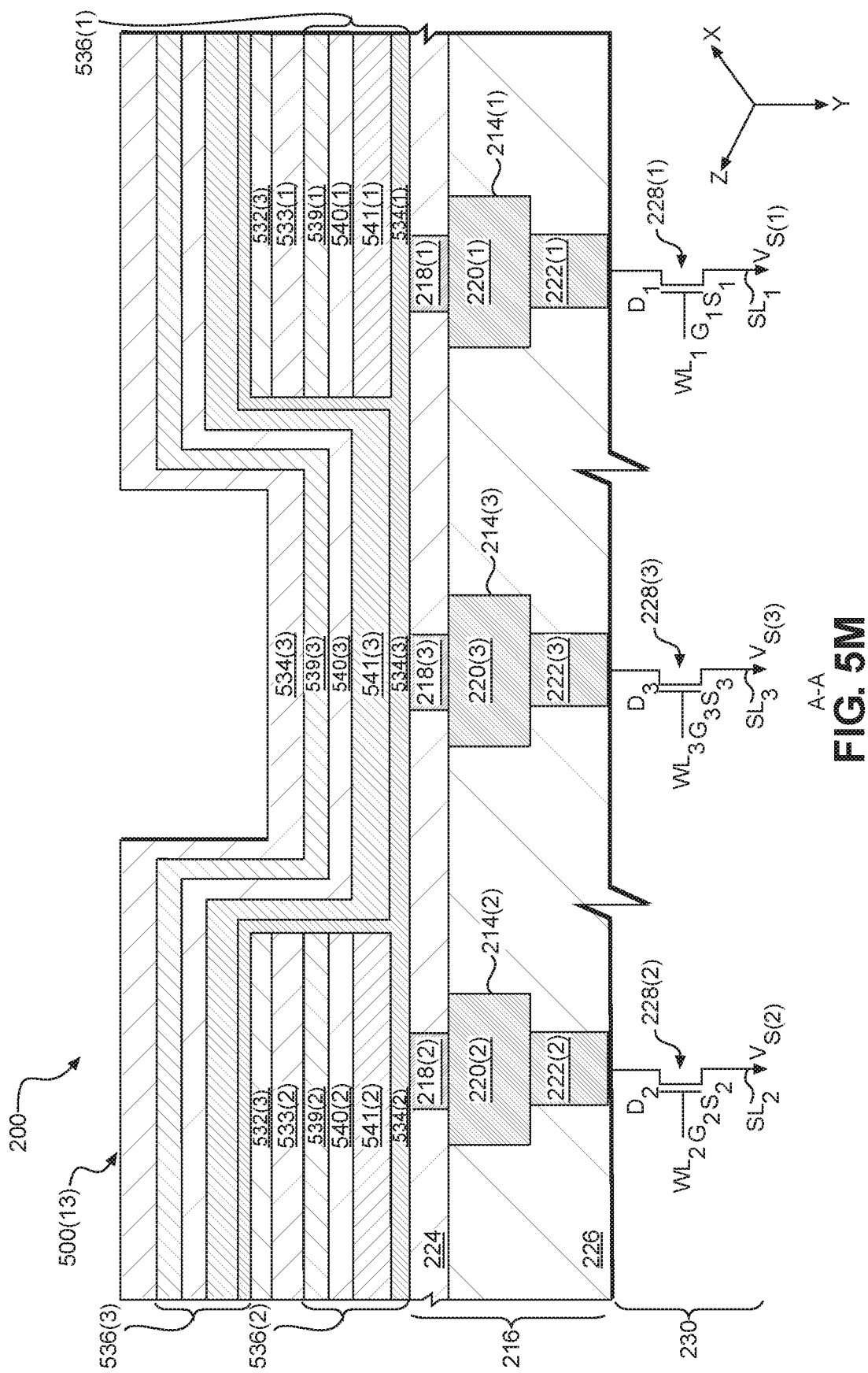

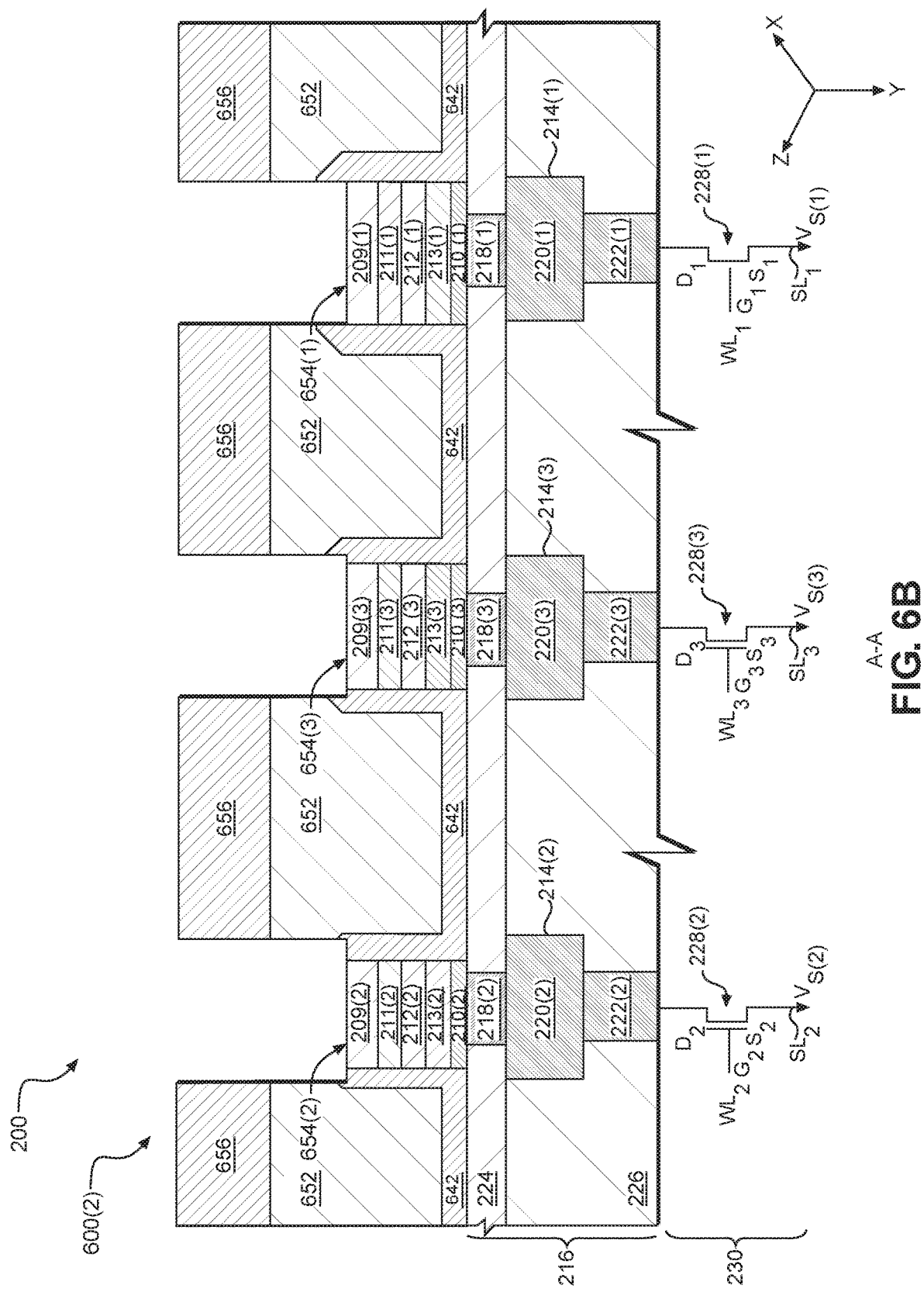

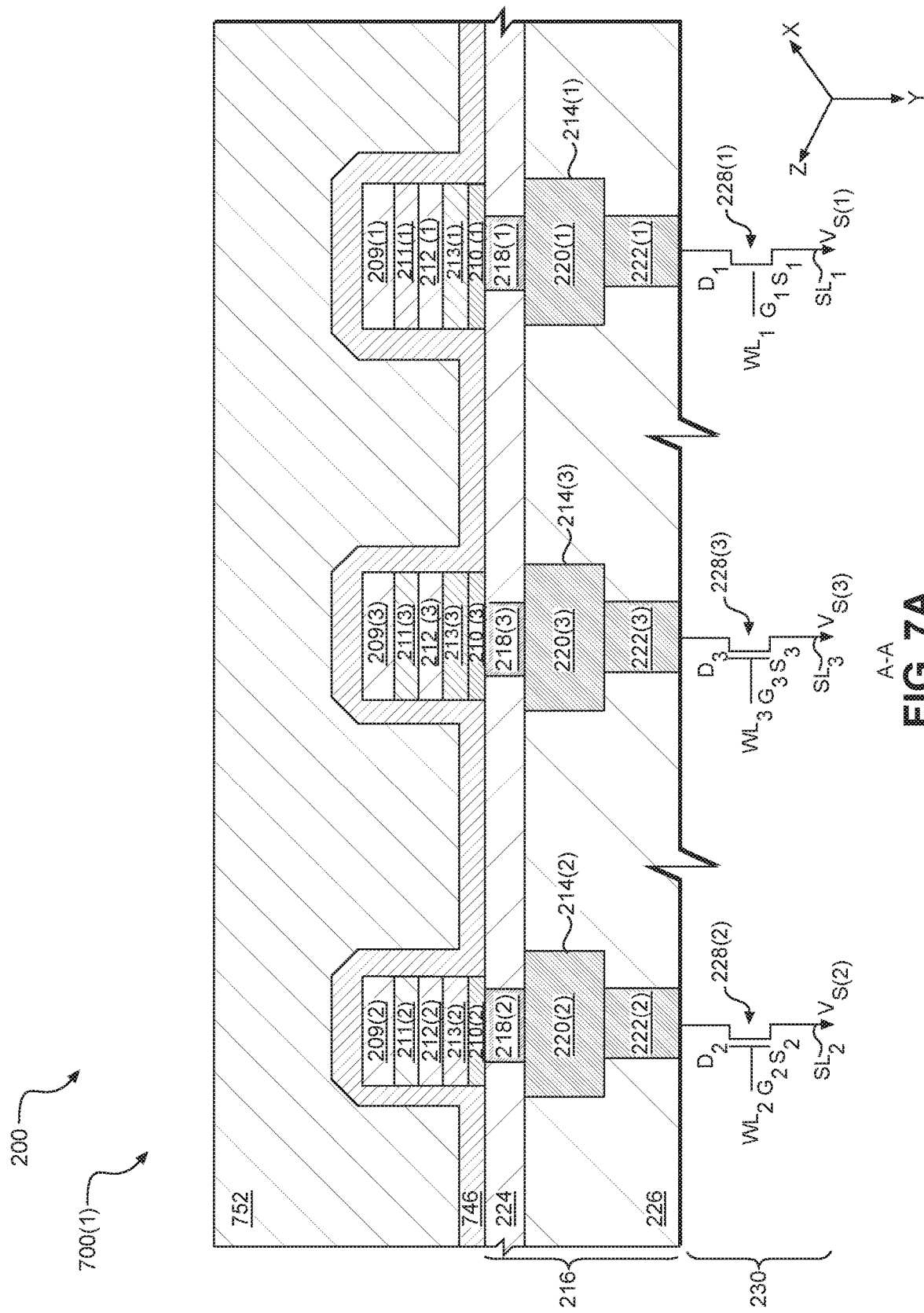

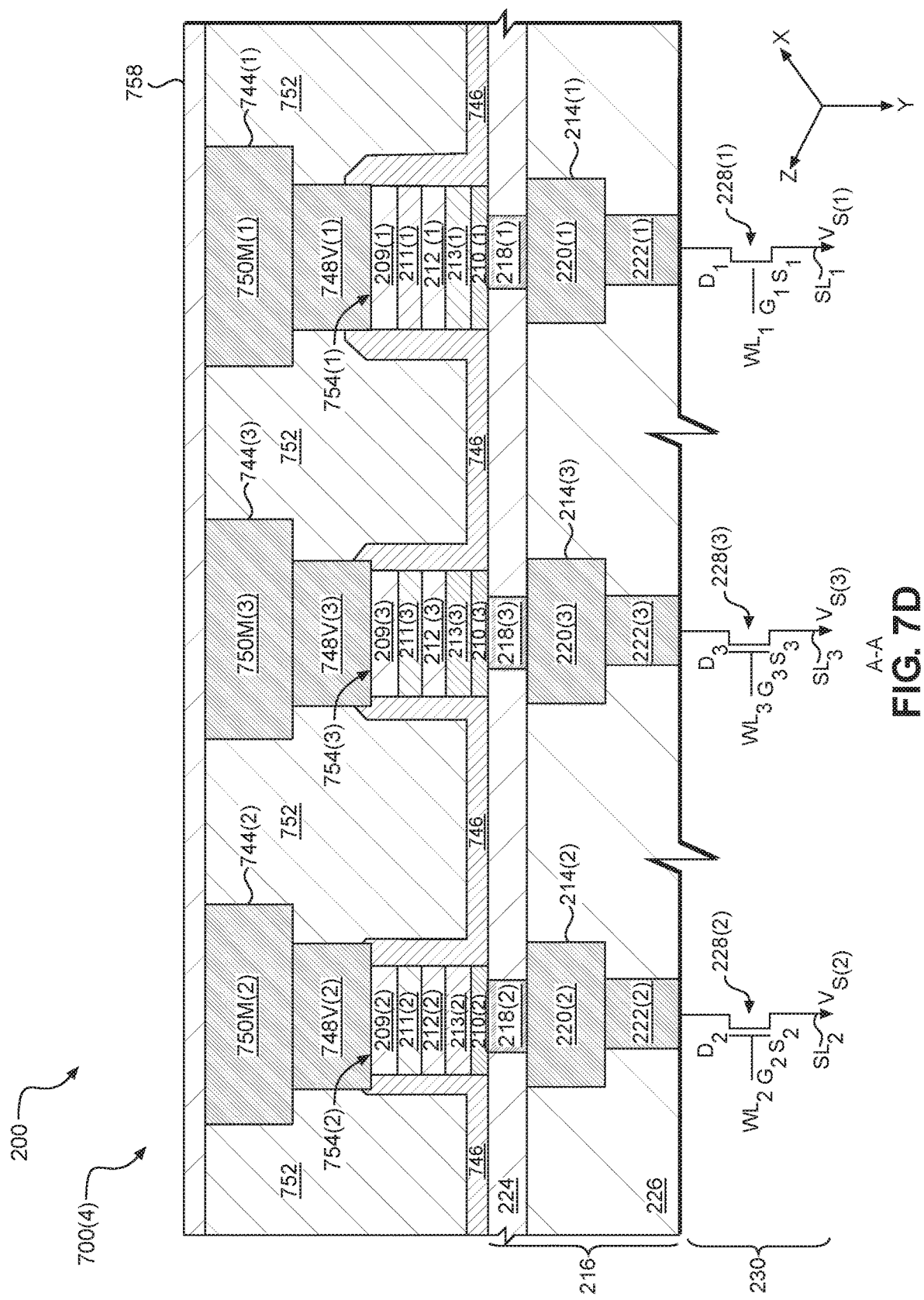

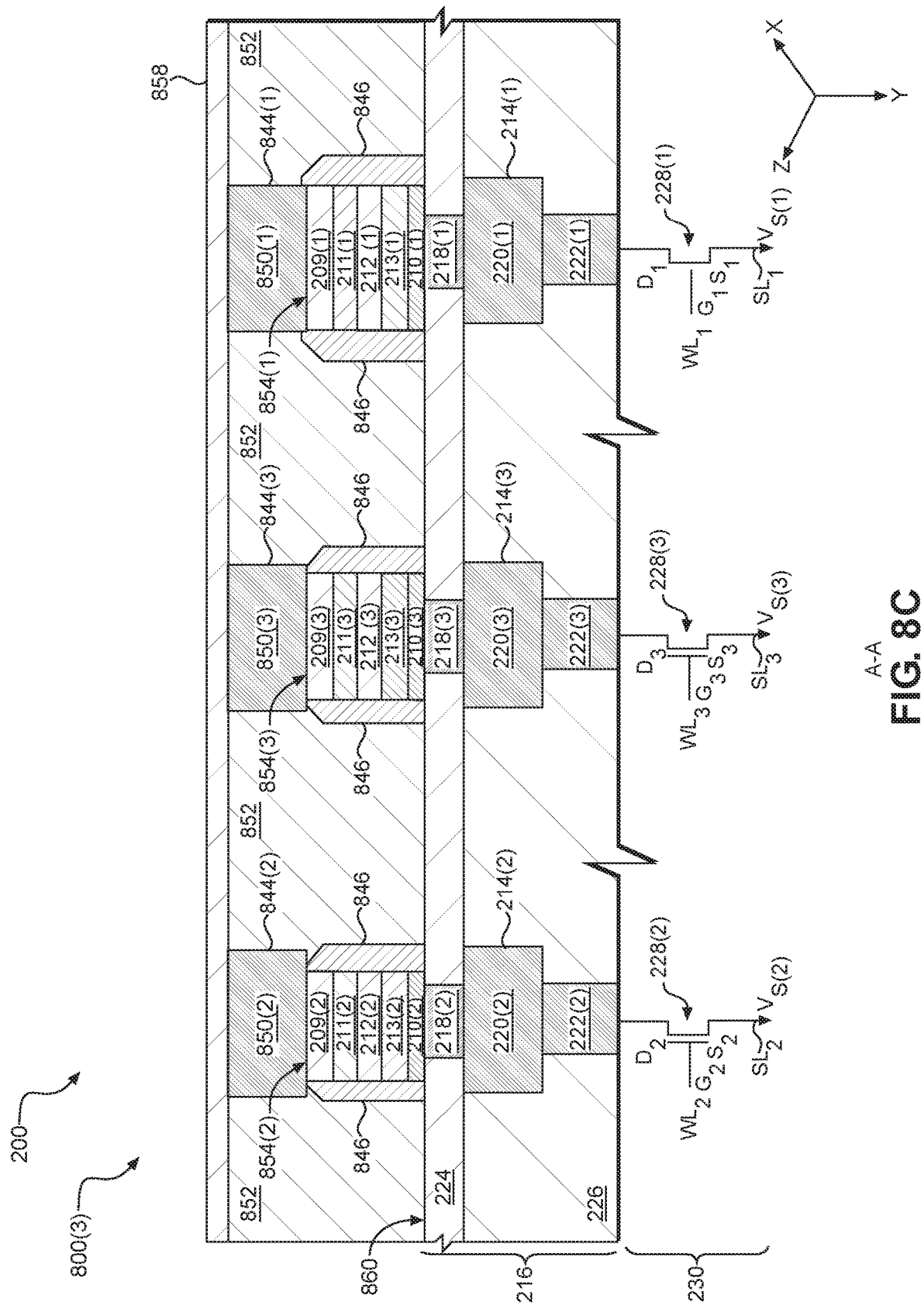

VARYING ENERGY BARRIERS OF MAGNETIC TUNNEL JUNCTIONS (MTJS) IN DIFFERENT MAGNETO-RESISTIVE RANDOM ACCESS MEMORY (MRAM) ARRAYS IN A SEMICONDUCTOR DIE TO FACILITATE USE OF MRAM FOR DIFFERENT MEMORY APPLICATIONS

PRIORITY APPLICATION

The present application is a divisional application of and claims priority to U.S. patent application Ser. No. 15/688,212, filed Aug. 28, 2017 and entitled "VARYING ENERGY BARRIERS OF MAGNETIC TUNNEL JUNCTIONS (MTJs) IN DIFFERENT MAGNETO-RESISTIVE RANDOM ACCESS MEMORY (MRAM) ARRAYS IN A SEMICONDUCTOR DIE TO FACILITATE USE OF MRAM FOR DIFFERENT MEMORY APPLICATIONS," which is incorporated herein by reference in its entirety.

BACKGROUND

I. Field of the Disclosure

The technology of the disclosure relates generally to magneto-resistive random access memory (MRAM), and more particularly to magnetic tunnel junctions (MTJs) employed in MRAM.

II. Background

Semiconductor storage devices are used in integrated circuits (ICs) in electronic devices to provide data storage. One example of a semiconductor storage device is magneto-resistive random access memory (MRAM). MRAM is non-volatile memory in which data is stored by programming a magnetic tunnel junction (MTJ) as part of an MRAM bit cell. One advantage of MRAM is that MTJs in MRAM bit cells can retain stored information even when power is turned off. This is because data is stored in the MTJ as a small magnetic element rather than as an electric charge or current.

In this regard, an MTJ comprises a free ferromagnetic layer ("free layer") disposed above or below a fixed or pinned ferromagnetic layer ("pinned layer"). The free and pinned layers are separated by a tunnel junction or barrier formed by a thin non-magnetic dielectric layer. The magnetic orientation of the free layer can be changed, but the magnetic orientation of the pinned layer remains fixed or "pinned." Data can be stored in the MTJ according to the magnetic orientation between the free and pinned layers. When the magnetic orientations of the free and pinned layers are anti-parallel (AP) to each other, a first memory state exists (e.g., a logical '1'). When the magnetic orientations of the free and pinned layers are parallel (P) to each other, a second memory state exists (e.g., a logical 'O'). The magnetic orientations of the free and pinned layers can be sensed to read data stored in the MTJ by sensing a resistance when current flows through the MTJ. Data can also be written and stored in the MTJ by applying a magnetic field to change the orientation of the free layer to either a P or AP magnetic orientation with respect to the pinned layer.

Recent developments in MTJ devices involve spin transfer torque (STT)-MRAM devices. In STT-MRAM devices, the spin polarization of carrier electrons, rather than a pulse of a magnetic field, is used to program the state stored in the MTJ (i.e., a '0' or a '1'). FIG. 1 illustrates an STT-MTJ device 100 (referred to as "MTJ 100"). The MTJ 100 is provided as part of an MRAM bit cell 102 to store non-volatile data. An access transistor 104 (e.g., an n-type metal-oxide semiconductor (MOS) (NMOS) transistor) is provided to control reading and writing to the MTJ 100. A drain D of the NMOS access transistor 104 is coupled to a bottom electrode 106 of the MTJ 100, which is coupled to a pinned layer 108, for example. A word line WL is coupled to a gate G of the access transistor 104. A source S of the access transistor 104 is coupled to a voltage source $V_S$ through a source line SL. The voltage source $V_S$ provides a voltage $V_{SL}$ on the source line SL. A bit line BL is coupled to a top electrode 110 of the MTJ 100, which is coupled to a free layer 112, for example. The pinned layer 108 and the free layer 112 are separated by a tunnel barrier 114. The pinned layer 108, the tunnel barrier 114, and the free layer 112 of the MTJ 100 form an MTJ stack 116.

With continuing reference to FIG. 1, when writing data to the MTJ 100, the gate G of the access transistor 104 is activated by activating the word line WL. A voltage differential between a voltage $V_{BL}$ on the bit line BL and the voltage $V_{SL}$ on the source line SL is applied. As a result, a write current I, is generated between the drain D and the source S of the access transistor 104. If the magnetic orientation of the MTJ 100 in FIG. 1 is to be changed from AP to P, a write current ($I_{AP-P}$) flowing from the free layer 112 to the pinned layer 108 is generated, which induces an STT at the free layer 112 to change the magnetic orientation of the free layer 112 to P with respect to the pinned layer 108. If the magnetic orientation is to be changed from P to AP, a current $I_{P-AP}$ flowing from the pinned layer 108 to the free layer 112 is produced, which induces an STT at the free layer 112 to change the magnetic orientation of the free layer 112 to AP with respect to the pinned layer 108.

The write current $I_w$ can change the magnetic orientation of the free layer 112 by transferring a sufficient amount of energy from the write current $I_w$ to the free layer 112 of the MTJ 100. This amount of energy is called an energy barrier $E_b$ of the MTJ 100. The energy barrier $E_b$ of the MTJ 100 is the amount of energy required to switch the magnetic orientation of the MTJ 100. The energy barrier $E_b$ is based in part on intrinsic characteristics of the MTJ stack 116. For example, varying material types, heights, and/or widths of the MTJ stack 116 can vary the energy barrier $E_b$ of the MTJ 100. The energy barrier $E_b$ of the MTJ 100 can also be varied by external influences, such as ambient temperature, for example.

Aspects of device performance, such as data retention rates and access times, can be controlled by varying the energy barriers of MTJs, such as the energy barrier $E_b$ of the MTJ 100 in FIG. 1. Providing an MTJ having a higher energy barrier allows the MTJ to have a higher data retention rate, because a higher energy barrier increases the amount of energy required to change the magnetic orientation of the MTJ, making the MTJ more resilient to external effects such as temperature variation, leakage current, and stray capacitance. However, providing an MTJ having a higher energy barrier can also result in slower access times, because the write current must be generated through the MTJ for a longer period of time to transfer an amount of energy sufficient to change the magnetic orientation of the MTJ. Thus, for example, if the MTJ 100 of the MRAM bit cell 102 in FIG. 1 is fabricated such that it has a higher energy barrier $E_b$, the MRAM bit cell 102 will have slower access times and a higher data retention rate compared to an MRAM bit cell that employs an MTJ having a lower energy barrier. Conversely, if the MTJ 100 of the MRAM bit cell 102 is fabricated such that it has a lower energy barrier $E_b$, the MRAM bit cell 102 will have faster access times and a lower data retention rate compared to an MRAM bit cell that employs an MTJ having a higher energy barrier.

In this manner, MTJs having a higher energy barrier may be better suited for memory applications requiring higher data retention rates and slower access times than for memory applications requiring faster access times and lower data retention rates. For example, an MTJ having a higher energy barrier may be better suited for a memory application such as eFlash memory, which requires a higher data retention rate at a tradeoff cost of slower access times, than for a memory application such as main memory, which requires faster access times at a tradeoff cost of lower data retention rates. In contrast, an MTJ having a lower energy barrier may be better suited for a memory application requiring faster access times at a tradeoff cost of a lower data retention rate. For example, level 2 (L2) and level 3 (L3) cache memory in a processor-based system may be specified to operate with faster access times, whereas main memory may be specified to have increased data retention as an acceptable tradeoff to faster access times. Thus, MRAM having a lower energy barrier might be better suited for L2/L3 cache memory than for main memory. However, since advanced IC designs place multiple types of memory proximate on the same IC, such as system-on-a-chip (SoC) technologies, the lower resolution limits of conventional fabrication processes can force different MRAM arrays to be fabricated with the same MTJ stack, resulting in different MRAM arrays having the same heights, widths, and other characteristics in proximity to one another. Consequently, the energy barriers of the MTJ stacks used in different types of memory are required to be the same and have essentially the same performance, although not optimal nor desired.

SUMMARY OF THE DISCLOSURE

Aspects disclosed in the detailed description include varying energy barriers of magnetic tunnel junctions (MTJs) in different magneto-resistive random access memory (MRAM) arrays in a semiconductor die to facilitate use of MRAM for different memory applications. Different memory applications may require different tradeoffs between access times and data retention performance as an example, where using MTJ stacks having the same energy barrier in these different memory applications may not allow the desired differences in performance to be realized. Thus, in this regard, in exemplary aspects disclosed herein, to facilitate use of MRAM for different types of memories having different performance requirements in a semiconductor die, the energy barriers of MTJs that form the MRAM bit cells in different MRAM arrays in the semiconductor die are varied. The energy barrier of an MTJ in an MRAM bit cell affects the write performance of the MRAM bit cell, because the amount of switching current required to switch the magnetic orientation of a free layer of the MTJ is a function of its energy barrier. Thus, by varying energy barriers of MTJs in MRAM bit cells in different MRAM arrays in a semiconductor die, different MRAM arrays may be used for different types of memory provided in the semiconductor die while still achieving distinct performance specifications, such as access times, data retention rates, bit cell endurances, array densities, and/or power consumption rates, as examples. The energy barrier of an MTJ in an MRAM bit cell can be varied by varying the materials, heights, widths, and/or other characteristics of MTJ stacks.

In other aspects disclosed herein, MTJs having different energy barriers are fabricated in the same layer(s) of the semiconductor die to avoid having to provide additional layers in the semiconductor die for different MRAMs. In one example, to fabricate MTJs having different energy barriers in the same layer(s) of the semiconductor die, a fabrication process is employed that includes forming a first blocking layer over a second bottom via, which is in an interconnect layer of a semiconductor die. Once the second bottom via is covered by the first blocking layer, a first MTJ stack film is deposited over a first bottom via in the interconnect layer of the semiconductor die. A portion of the first MTJ stack film is then removed to form a first MTJ stack from the first MTJ stack film. The first MTJ stack is then masked by a hard mask, and a second MTJ stack film is deposited over the second bottom via. A portion of the second MTJ stack film is then removed to form a second MTJ stack from the second MTJ stack film. Each MTJ stack can be formed at varying heights and/or widths, and from varying combinations of materials, as examples, such that the first MTJ stack can have an energy barrier different from the second MTJ stack. In this manner, the MTJs having different energy barriers can provide memory devices having varying performance specifications in the same layer(s) of a semiconductor die.

In this regard in one exemplary aspect, a semiconductor die comprising a first MTJ stack and a second MTJ stack is provided. The first MTJ stack comprises a first pinned layer having a first pinned layer magnetic moment, a first free layer having a first free layer magnetic moment, and a first tunnel barrier layer disposed between the first pinned layer and the first free layer. The first MTJ stack has a first energy barrier. The second MTJ stack comprises a second pinned layer having a second pinned layer magnetic moment, a second free layer having a second free layer magnetic moment, and a second tunnel barrier layer disposed between the second pinned layer and the second free layer. The second MTJ stack has a second energy barrier different from the first energy barrier.

In another exemplary aspect, a semiconductor die comprising a first means for storing data and a second means for storing data is provided. The first means for storing data comprises a first means for storing a fixed magnetic moment having a first fixed magnetic moment, a first means for storing a programmable magnetic moment having a first programmable magnetic moment, and a first means for transferring spin polarization of electrons disposed between the first means for storing a fixed magnetic moment and the first means for storing a programmable magnetic moment. The first means for storing data has a first energy barrier. The second means for storing data comprises a second means for storing a fixed magnetic moment having a second fixed magnetic moment, a second means for storing a programmable magnetic moment having a second programmable magnetic moment, and a second means for transferring spin polarization of electrons disposed between the second means for storing a fixed magnetic moment and the second means for storing a programmable magnetic moment. The second means for storing data has a second energy barrier different from the first energy barrier.

In another exemplary aspect, a method of varying energy barriers of MTJs in different MRAM array in a semiconductor die is provided. The method comprises forming a first blocking layer over a second via of a second MRAM array, wherein the second via is in an interconnect layer of the semiconductor die. A first MTJ stack film is deposited over a first via of a first MRAM array and at least a portion of the first blocking layer. The first via is in the interconnect layer of the semiconductor die. A first top electrode film is deposited over the first MTJ stack film. A first mask is deposited over a portion of the first top electrode film over the first MTJ stack film over the first via. A portion of the first top electrode film and a portion of the first MTJ stack film not under the first mask are removed to form a first top electrode layer over a first MTJ stack over the first via of the first MRAM array. At least a portion of the first blocking layer over the second via of the second MRAM array is removed. A second MTJ stack film is deposited over the second via of the second MRAM array. A second top electrode film is deposited over the second MTJ stack film. A second mask is then deposited over a portion of the second top electrode film over the second MTJ stack film over the second via. A portion of the second top electrode film and a portion of the second MTJ stack film not under the second mask are removed to form a second top electrode layer over a second MTJ stack over the second via of the second MRAM array.

In another exemplary aspect, a central processing unit (CPU) system comprising a system bus, at least one CPU core communicatively coupled to the system bus, a memory controller communicatively coupled to the system bus, and a memory system communicatively coupled to the system bus is provided. The memory system comprises a first MRAM bit cell of a first MRAM array and a second MRAM bit cell of a second MRAM array. The first MRAM bit cell of the first MRAM array comprises a first MTJ stack, a first MTJ, and a first access transistor. The first MTJ stack comprises a first pinned layer having a first pinned layer magnetic moment, a first free layer having a first free layer magnetic moment, and a first tunnel barrier layer disposed between the first pinned layer and the first free layer. The first MTJ stack has a first energy barrier. The first MTJ comprises a first top electrode layer and a first bottom electrode layer, wherein the first MTJ stack is disposed between the first top electrode layer and the first bottom electrode layer. The first access transistor comprises a first gate, a first source, and a first drain. The first access transistor is coupled to the first MTJ. The second MRAM bit cell of the second MRAM array comprises a second MTJ stack, a second MTJ, and a second access transistor. The second MTJ stack comprises a second pinned layer having a second pinned layer magnetic moment, a second free layer having a second free layer magnetic moment, and a second tunnel barrier layer disposed between the second pinned layer and the second free layer. The second MTJ stack has a second energy barrier different from the first energy barrier. The second MTJ comprises a second top electrode layer and a second bottom electrode layer, wherein the second MTJ stack is disposed between the second top electrode layer and the second bottom electrode layer. The second access transistor comprises a second gate, a second source, and a second drain.

BRIEF DESCRIPTION OF THE FIGURES

FIGS. 4A-4G are cross-sectional diagrams illustrating exemplary process steps of fabricating a first MTJ stack of a first MRAM array in a metal layer of a semiconductor die as shown in FIG. 2B according to the exemplary fabrication process in FIG. 3;

FIGS. 4H-4L are cross-sectional diagrams illustrating exemplary process steps of fabricating a second MTJ stack of a second MRAM array in the metal layer of the semiconductor die as shown in FIG. 2B according to the exemplary fabrication process in FIG. 3;

FIGS. 6A-6C are cross-sectional diagrams illustrating exemplary process steps of fabricating MRAM bit cells having a spacer film disposed over an interconnect layer and over MTJ stacks in different MRAM arrays having varying energy barriers as provided in FIGS. 2A and 2B;

FIGS. 7A-7D are cross-sectional diagrams illustrating exemplary process steps of fabricating MRAM bit cells having a spacer film over an interconnect layer and a top via over MTJ stacks in different MRAM arrays having varying energy barriers as provided in FIGS. 2A and 2B;

FIGS. 8A-8C are cross-sectional diagrams illustrating exemplary process steps of fabricating MRAM bit cells from MTJ stacks having varying energy barriers in different MRAM arrays as provided in FIGS. 2A and 2B, wherein a top surface of an interconnect layer is exposed from a spacer film;

DETAILED DESCRIPTION

Figure 1:
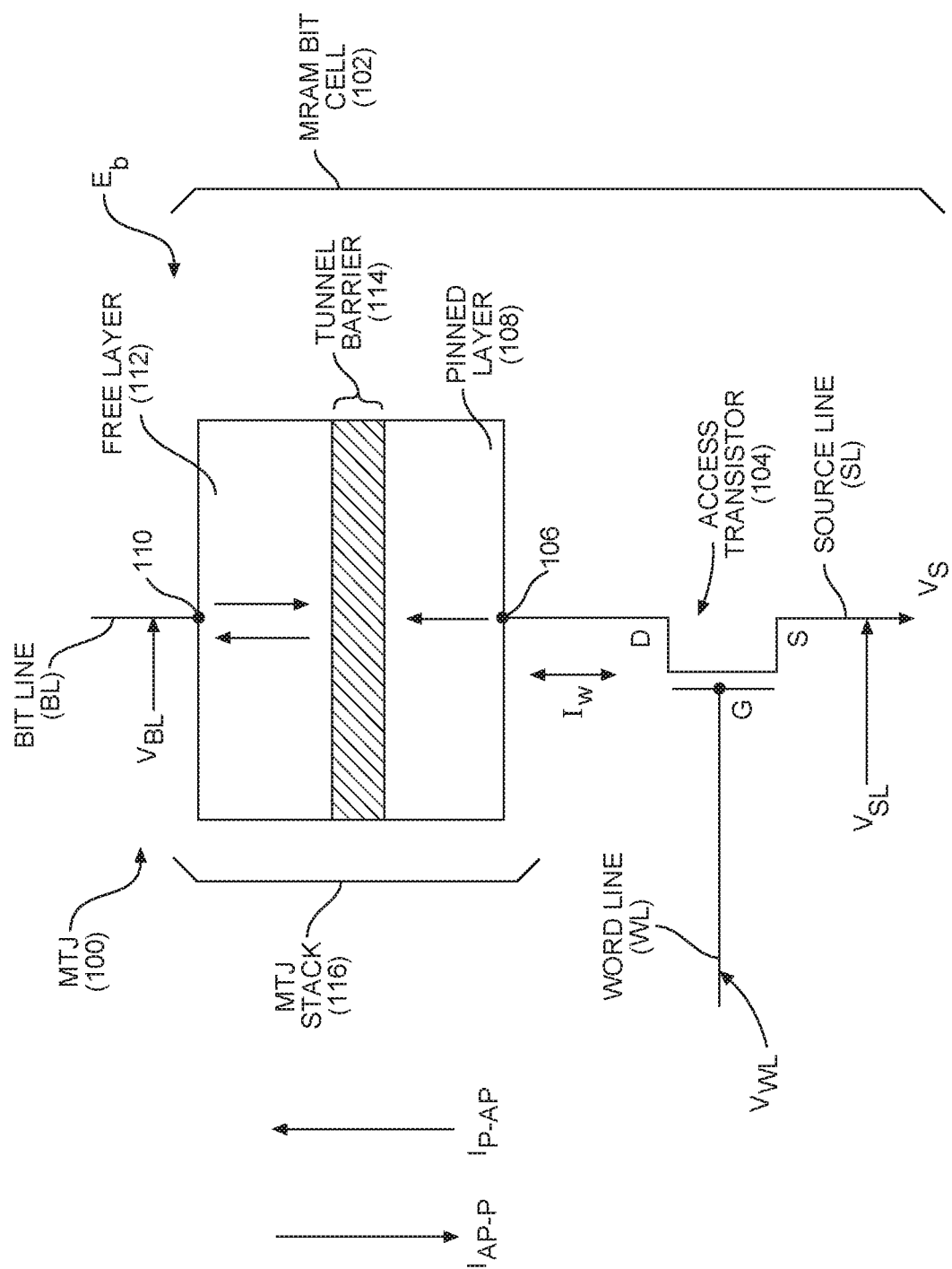
FIG. 1 is a schematic diagram of an exemplary magneto-resistive random access memory (MRAM) bit cell that can be provided in an MRAM array.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include varying energy barriers of magnetic tunnel junctions (MTJs) in different magneto-resistive random access memory (MRAM) arrays in a semiconductor die to facilitate use of MRAM for different memory applications. Different memory applications may require different tradeoffs between access times and data retention performance as an example, where using MTJ stacks having the same energy barrier in these different memory applications may not allow the desired differences in performance to be realized. Thus, in this regard, in exemplary aspects disclosed herein, to facilitate use of MRAM for different types of memories having different performance requirements in a semiconductor die, the energy barriers of MTJs that form the MRAM bit cells in different MRAM arrays in the semiconductor die are varied. The energy barrier of an MTJ in an MRAM bit cell affects the write performance of the MRAM bit cell, because the amount of switching current required to switch the magnetic orientation of a free layer of the MTJ is a function of its energy barrier. Thus, by varying energy barriers of MTJs in MRAM bit cells in different MRAM arrays in a semiconductor die, different MRAM arrays may be used for different types of memory provided in the semiconductor die while still achieving distinct performance specifications, such as access times, data retention rates, bit cell endurances, array densities, and/or power consumption rates, as examples. The energy barrier of an MTJ in an MRAM bit cell can be varied by varying the materials, heights, widths, and/or other characteristics of MTJ stacks.

In many processor-based systems, different memory applications can be provided. For example, cache memory can be provided to store data that is frequently accessed by a processor during operation. Main memory can be provided to store data that is accessed less often than data in cache memory, but more often than data in long-term memory. Long-term memory can be provided to store large amounts of data that are accessed less often than data in main memory. Since the data stored in each of these memory applications are accessed at varying frequencies, each memory application can have different access times requirements. For example, cache memory can be required to have faster access times than main memory because providing faster access times in cache memory can increase device speed to a greater extent than providing faster access times in main memory. Long-term memory access times can have even further reduced access times requirements for a similar reason. It would be desirable to use MRAM as the type of memory for all of these memory applications because MRAM has high data retention rates and consumes a low amount of power.

For example, eFlash memory, cache memory, and main memory using MRAM bit cells in MRAM arrays may be required on a single semiconductor die. In using MRAM for different memory applications, it is desirable to have high data retention rates and fast access times because high data retention rates increase device reliability and fast access times increase device speed. For example, for cache memory, reducing access times can be favored over increasing retention rates because the main goal of cache memory can be to enable high-speed processing. In long-term memory, such as eFlash memory for example, increasing retention rates can be favored over reducing access times because the main goal of eFlash can be to provide long-term reliable data storage. Main memory can favor performance specifications between those required for cache memory and those required for eFlash memory because main memory can be used as intermediate memory between long-term memory and cache memory.

However, in MRAM, increasing the retention rate can come at the expense of slowing down access times. Conversely, reducing the retention rate in MRAM can allow for faster access times. This is because retention rates and access times of an MTJ in an MRAM bit cell are based on an energy barrier of the MTJ. An energy barrier of an MTJ is an amount of energy required to change a magnetic orientation of a free layer of the MTJ. Factors that affect the energy barrier of an MTJ include widths and/or material types of the various layers of an MTJ. Increasing an energy barrier of an MTJ makes the MTJ more resilient to external effects such as temperature variation, leakage current, and stray capacitance, because such external effects must transfer a higher amount of energy to change the magnetic orientation of a free layer of the MTJ. However, increasing the energy barrier of the MTJ slows access times because a write current, for example, must transfer a higher amount of energy to the free layer of the MTJ, which requires a longer period of time at a fixed voltage. Therefore, although it is desirable to have high data retention rates and fast access times in MRAM, tradeoffs must be made between retention rates and access times.

Figure 2A:
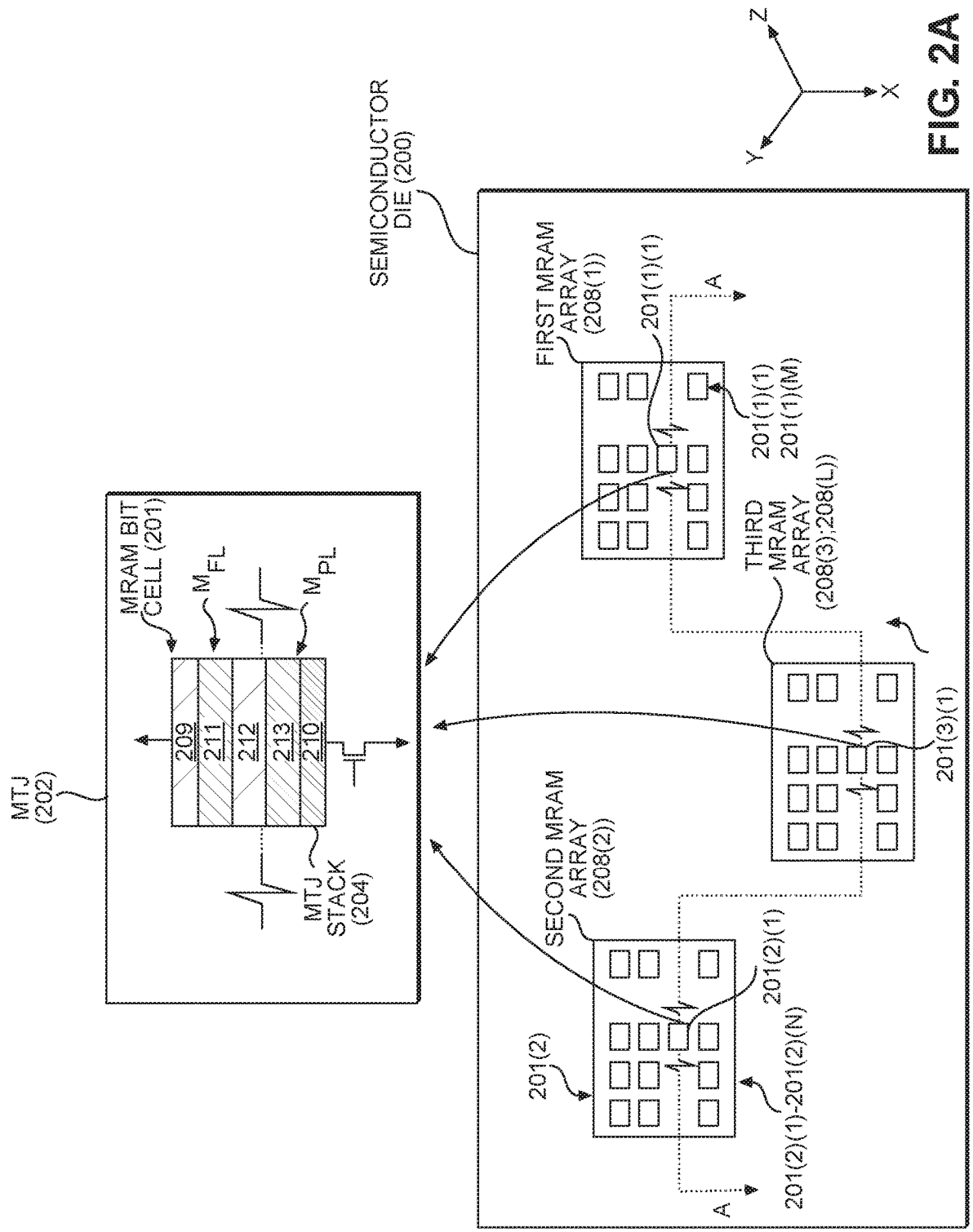
FIG. 2A is top-view diagram of an exemplary semiconductor die including multiple MRAM arrays, each including a plurality of MRAM bit cells having varying energy barriers among the MRAM arrays to facilitate use of MRAM for different memory applications.

In many applications, such as system-on-a-chip (SoC) devices, different types of memory requiring different performance specifications may be required in a memory system on a single semiconductor die. For example, it may be desired to use MRAM for eFlash memory, cache memory, and main memory on a single semiconductor die, because MRAM has high data retention rates and consumes a low amount of power. In this regard, FIG. 2A illustrates a top view of an exemplary semiconductor die 200 that includes a plurality of MRAM arrays 208(1)-208(L) along an A-A line for supporting memory applications. In this example, three (3) MRAM arrays 208(1)-208(3) are provided in the semiconductor die 200. In some aspects, the semiconductor die 200 in FIG. 2A can be a semiconductor die of an SoC. Each MRAM array 208(1)-208(3) in FIG. 2A can be used for a different type of memory if desired. In this example, the first MRAM array 208(1) can be used for eFlash memory, the second MRAM array 208(2) can be used for main memory (embedded dynamic random access memory (eDRAM)), and the third MRAM array 208(3) can be used for embedded static random access memory (eSRAM) cache memory. Each MRAM array 208(1)-208(3) in FIG. 2A includes a respective plurality of MRAM bit cells 201(1)-201(3) and each MRAM bit cell 201(1)(1)-201(1)(M), 201(2)(1)-201(2)(N), 201(3)(1)-201(3)(P) includes an MTJ 202 having an MTJ stack 204 between a top electrode layer 209 and a bottom electrode layer 210. Each MTJ stack 204 is formed in a metal layer 206 and includes a free layer 211, a pinned layer 213, and a tunnel barrier layer 212. A magnetic moment $M_{FL}$ of the free layer 211 can be changed, but a magnetic moment $M_{PL}$ of the pinned layer 213 remains fixed or "pinned." Each MTJ stack 204 is configured to store data according to the magnetic moment $M_{FL}$ of its free layer 211 as being either parallel (P) or anti-parallel (AP) to the magnetic moment $M_{PL}$ of its pinned layer 213 to represent different memory states (i.e., a logical '1' or '0').

The MRAM bit cells 201(1)(1)-201(3)(P) provided in the MRAM arrays 208(1)-208(3) may require different access times based on their memory application. For example, the third plurality of MRAM bit cells 201(3) in the third MRAM array 208(3) used for eSRAM cache memory, for example, may require faster access times than the first plurality of MRAM bit cells 201(1) in the first MRAM array 208(1) used for eFlash memory, because eSRAM cache memory is used in high-speed processing more often than eFlash memory. Thus, lower data retention rates might be an acceptable tradeoff to provide faster access times for the MRAM bit cells 201(3)(1)-201(3)(P) in the third MRAM array 208(3) used for cache memory. Conversely, the first plurality of MRAM bit cells 201(1)(1)-201(1)(M) in the first MRAM array 208(1) used for eFlash memory may require higher data retention rates than the third plurality of MRAM bit cells 201(3) in the third MRAM array 208(3) used for cache memory, because eFlash memory is used in long-term memory requiring increased reliability more often than cache memory. Main memory (eDRAM) may require higher data retention rates than cache memory, but may also require faster access times than eFlash memory. This is because main memory (eDRAM) is often used as intermediate memory between long-term memory and cache memory (eSRAM). In this manner, the second plurality of MRAM bit cells 201(2) in the second MRAM array 208(2) used for main memory (eDRAM) may require performance specifications between those required for the first plurality of MRAM bit cells 201(1) in the first MRAM array 208(1) used for eFlash memory and those required for the third plurality of MRAM bit cells 201(3) in the third MRAM array 208(3) used for cache memory (eSRAM). Thus, for applications requiring different types of memory using MRAM on a semiconductor die, it may be desirable to provide MRAM bit cells in MRAM arrays having varying performance specifications on a single semiconductor die.

Figure 2B:
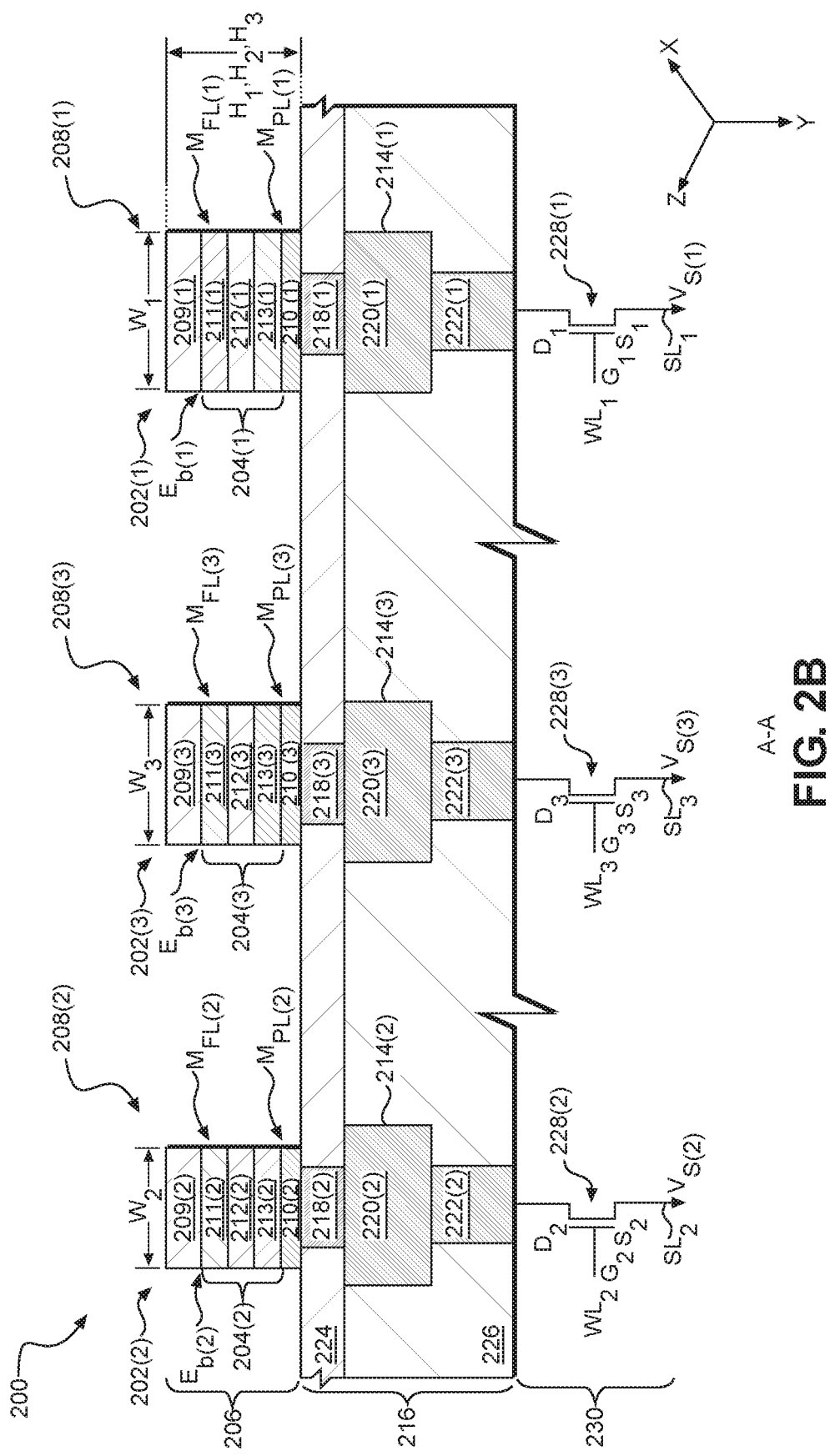
FIG. 2B is a cross-sectional, side-view diagram of the semiconductor die in FIG. 2A illustrating exemplary magnetic tunnel junction (MTJ) stacks in the plurality of MRAM bit cells of the MRAM arrays.

In examples discussed below, the MRAM bit cells 201(1)(1)-201(3)(P) in the MRAM arrays 208(1)-208(3) are fabricated to have varying performance specifications in the semiconductor die 200 by varying energy barriers of the MTJs 202(1)-202(3) in the MRAM bit cells 201(1)(1)-201(3)(P). For example, FIG. 2B illustrates a cross-sectional side view of FIG. 2A along the cross-section A-A and between break lines in each MRAM array 208(1)-208(3), 208(L). In this regard, FIG. 2B illustrates exemplary first, second, and third MTJs 202(1)-202(3) in respective first, second, and third MRAM bit cells 201(1)(1), 201(2)(1), 201(3)(1) in respective first, second, and third pluralities of MRAM bit cells 201(1)-201(3), respectively. FIG. 2B illustrates one MRAM bit cell 201(1)(1)-201(3)(1) for each of the first, second, and third pluralities of MRAM bit cells 201(1)-201(3). Each MRAM bit cell 201(1)(1)-201(3)(1) illustrated in FIG. 2B represents each and every MRAM bit cell 201(1)(1)-201(3)(P) in the respective plurality of MRAM bit cells 201(1)-201(3) that can be disposed left and right of the MRAM bit cell 201(1)(1)-201(3)(1) in the X-axis direction and in front and behind in the Z-axis direction. As discussed below, including MRAM bit cells having vary performance specifications on the same semiconductor die allows MRAM to be used for different memory applications. In this manner, MRAM bit cells in MRAM arrays can provide varying performance specifications for different memory applications while also gaining the benefits of higher data retention and lower power consumption associated with MRAM.

In this regard, each MTJ 202(1)-202(3) in FIG. 2B includes an MTJ stack 204(1)-204(3) having an energy barrier $E_{b(1)}$-$E_{b(3)}$ according to its material composition and geometry. As shown in FIG. 2B, each MTJ stack 204(1)-204(3) is between a top electrode layer 209(1)-209(3) and a bottom electrode layer 210(1)-210(3), and includes a tunnel barrier layer 212(1)-212(3) between a free layer 211(1)-211(3) and a pinned layer 213(1)-213(3). As discussed above, the energy barrier $E_{b(1)}$-$E_{b(3)}$ of each MTJ 202(1)-202(3) is an amount of energy required to substantially invert a direction of a magnetic moment $M_{FL(1)}$-$M_{FL(3)}$ of its free layer 211(1)-211(3) relative to a magnetic moment $M_{PL(1)}$-$M_{PL(3)}$ of its pinned layer 213(1)-213(3). For example, the material compositions and/or the widths $W_1$-$W_3$ of the MTJ stacks 204(1)-204(3) in FIG. 2B can be different to vary the energy barriers $E_{b(1)}$-$E_{b(3)}$ of each MTJ 202(1)-202(3). For example, the first MTJ 202(1) and the second MTJ 202(2) have material compositions and widths $W_1$, $W_2$ such that the first energy barrier $E_{b(1)}$ is higher than the second energy barrier $E_{b(2)}$. Similarly, the third MTJ 202(3) has a material composition and width $W_3$ such that the second energy barrier $E_{b(2)}$ is higher than the third energy barrier $E_{b(3)}$. In this manner, the first, second, and third MTJs 202(1)-202(3) are able to provide MRAM arrays 208(1)-208(3) having varying performance specifications for different memory types in the semiconductor die 200, if desired.

In this example, and as will be discussed in more detail below, the MRAM arrays 208(1)-208(3) having MRAM bit cells 201(1)(1)-201(3)(P) with varying energy barriers $E_{b(1)}$-$E_{b(3)}$ to vary performance specifications are also fabricated in a same layer of the semiconductor die 200 to avoid fabricating the MRAM arrays 208(1)-208(3) in different layers to avoid increasing the height of the semiconductor die 200 in the Y-axis direction. In this regard, each MTJ 202(1)-202(3) in FIG. 2B is formed over a respective bottom interconnect 214(1)-214(3) formed in an interconnect layer 216 of the semiconductor die 200 in the Y-axis direction. In this example, each bottom interconnect 214(1)-214(3) includes a first bottom via 218(1)-218(3) (i.e., a first via, a second via, and a third via), a bottom metal line 220(1)-220(3), and a second bottom via 222(1)-222(3). Each first bottom via 218(1)-218(3) is formed in a diffusion barrier layer 224 of the interconnect layer 216. Each bottom metal line 220(1)-220(3) is formed above a respective second bottom via 222(1)-222(3) in an inter-metal layer 226 of the interconnect layer 216. Each bottom interconnect 214(1)-214(3) is coupled to an access transistor 228(1)-228(3) formed in a semiconductor layer 230 of the semiconductor die 200 to control current to the MTJ 202(1)-202(3) during read/write operations. Each access transistor 228(1)-228(3) includes a respective gate $G_1$-$G_3$, source $S_1$-$S_3$, and drain $D_1$-$D_3$. In this example, each bottom interconnect 214(1)-214(3) is coupled to a respective drain $D_1$-$D_3$ of each access transistor 228(1)-228(3). A word line $WL_1$-$WL_3$ of each access transistor 228(1)-228(3) is coupled to a respective gate $G_1$-$G_3$ of each access transistor 228(1)-228(3). The source $S_1$-$S_3$ of each access transistor 228(1)-228(3) is coupled to a voltage source $V_{S(1)}$-$V_{S(3)}$ through a respective source line $SL_1$-$SL_3$ of each access transistor 228(1)-228(3).

When reading or writing data to each MTJ 202(1)-202(3), the gate $G_1$-$G_3$ of the respective access transistor 228(1)-228(3) is activated by activating the respective associated word line $WL_1$-$WL_3$. In a write operation, for example, a write current is generated between the drain $D_1$-$D_3$ and the source $S_1$-$S_3$ of each access transistor 228(1)-228(3) and across each MTJ 202(1)-202(3). If the magnetic moment $M_{FL(1)}$-$M_{FL(3)}$ of each free layer 211(1)-211(3) of each MTJ 202(1)-202(3) is to be changed from AP to P, a write current flowing from each free layer 211(1)-211(3) to each respective pinned layer 213(1)-213(3) is generated. If the magnetic moment $M_{FL(1)}$-$M_{FL(3)}$ of each free layer 211(1)-211(3) of each MTJ 202(1)-202(3) is to be changed from P to AP relative to the respective pinned layer 213(1)-213(3), a write current flowing from each pinned layer 213(1)-213(3) to each respective free layer 211(1)-211(3) is generated. Thus, in this manner, each access transistor 228(1)-228(3) controls the read/write current across each respective MTJ 202(1)-202(3).

A read operation is different from a write operation in that the amount of current necessary to perform a write operation is higher than the amount of current necessary to perform a read operation. As noted above, a higher current transfers a higher amount of energy to a free layer of the MTJ. If one MTJ has a higher energy barrier than another MTJ, then the MTJ with the higher energy barrier can require a higher write current to perform a write operation on the MTJ. For example, performing a write operation on the first MTJ 202(1) in FIG. 2B having the first energy barrier $E_{b(1)}$ requires a higher write current than performing a write operation on the third MTJ 202(3) having the third energy barrier $E_{b(3)}$ lower than the first energy barrier $E_{b(1)}$. In this manner, the MTJs 202(1)-202(3) having higher energy barriers $E_{b(1)}$-$E_{b(3)}$ Can require higher write currents to perform write operations on the respective MTJs 202(1)-202(3).

Factors that affect the energy barriers $E_{b(1)}$-$E_{b(3)}$ of the MTJs 202(1)-202(3) include the material(s) used to form the MTJ stacks 204(1)-204(3) as well as heights $H_1$-$H_3$ and widths $W_1$-$W_3$ of the layers in the MTJ stacks 204(1)-204(3). The materials used to form the MTJ stacks 204(1)-204(3) influence the respective energy barriers $E_{b(1)}$-$E_{b(3)}$ because the energy barriers $E_{b(1)}$-$E_{b(3)}$ of the respective MTJ stacks 204(1)-204(3) are associated with resistances of the respective MTJ stacks 204(1)-204(3). By fabricating the MTJ stacks 204(1)-204(3) from strong free layer magnetic moment materials, the MTJ stacks 204(1)-204(3) can have higher energy barriers $E_{b(1)}$-$E_{b(3)}$. For example, forming the first free layer 211(1) of the first MTJ 202(1) from a first material can result in the first MTJ 202(1) having the first energy barrier $E_{b(1)}$. Similarly, forming the second free layer 211(2) of the second MTJ 202(2) from a second material can result in the second MTJ 202(2) having the second energy barrier $E_{b(2)}$ different from the first energy barrier $E_{b(1)}$. If the first energy barrier $E_{b(1)}$ is greater than the second energy barrier $E_{b(2)}$, then the first MTJ 202(1) may have a higher data retention rate and a slower switching speed than the second MTJ 202(2). In this manner, the materials used to form the layers of the MTJ stacks 204(1)-204(3) can influence the energy barriers $E_{b(1)}$-$E_{b(3)}$ of the MTJs 202(1)-202(3), and thus the performance specifications of the MTJs 202(1)-202(3).

The heights $H_1$-$H_3$ and widths $W_1$-$W_3$ of the layers in the MTJ stacks 204(1)-204(3) can also influence the energy barriers $E_{b(1)}$-$E_{b(3)}$ of the MTJ stacks 204(1)-204(3). For example, forming the first free layer 211(1) of the first MTJ 202(1) to a first width $W_1$ can result in the first MTJ 202(1) having the first energy barrier $E_{b(1)}$. Similarly, forming the second free layer 211(2) of the second MTJ 202(2) to a second width $W_2$ can result in the second MTJ 202(2) having the second energy barrier $E_{b(2)}$ different from the first energy barrier $E_{b(1)}$. Similar to the discussion above, if the first energy barrier $E_{b(1)}$ is greater than the second energy barrier $E_{b(2)}$, then the first MTJ 202(1) may have a higher data retention rate and a slower switching speed than the second MTJ 202(2). In this manner, the widths $W_1$-$W_3$ of the layers of the MTJ stacks 204(1)-204(3) can influence the energy barriers $E_{b(1)}$-$E_{b(3)}$ of the respective MTJs 202(1)-202(3), and thus the performance specifications of the MTJs 202(1)-202(3).

As discussed above, to vary the energy barriers $E_{b(1)}$-$E_{b(3)}$ among the MRAM bit cells 201(1)(1)-201(3)(P), the MTJ stacks 204(1)-204(3) can be formed from different material compositions that can affect the energy barriers $E_{b(1)}$-$E_{b(3)}$ of the MTJs 202(1)-202(3). For example, the bottom electrode layer 210(1)-210(3) of each MTJ 202(1)-202(3) can include materials such as tantalum (Ta), tantalum (Ta) nitride (N) (TaN), tungsten (W), copper (Cu)-based materials, Ruthenium (Ru), platinum (Pt), Hafnium (Hf) iridide (Ir) (Hflr), Terbium (Tb)-Cobalt (Co)-Iron (Fe) (TbCoFe), and/or TbWFe, as non-limiting examples. The bottom electrode layer 210(1)-210(3) of each MTJ 202(1)-202(3) can include a thickness in the range of approximately 5-20 nanometers (nm), as non-limiting examples. The top electrode layer 209(1)-209(3) of each MTJ 202(1)-202(3) can include materials such as Ta, TaN, titanium (Ti), titanium nitride (TiN), Ru, W, Pt, Hflr, TbCoFe, and/or TbWFe, as non-limiting examples. The top electrode layer 209(1)-209(3) of each MTJ 202(1)-202(3) can include a thickness in the range of approximately 15-80 nm, as a non-limiting example.

Similarly, the free layers 211(1)-211(3) of the MTJ stacks 204(1)-204(3) can be formed from different material compositions that can affect the energy barriers $E_{b(1)}$-$E_{b(3)}$ of the MTJs 202(1)-202(3). An energy barrier of an MTJ can be determined by calculating the effective anisotropy energy constant ($K_{eff}$) of the MTJ, which is equal to the anisotropy field ($H_k$) times one-half the saturation magnetization ($M_s$). Since the anisotropy field ($H_k$) and the saturation magnetization ($M_s$) can both be measured, the effective anisotropy energy constant ($K_{eff}$) can be calculated using the equation, $K_{eff}=H_k*M_s/2$. Once the effective anisotropy energy constant ($K_{eff}$) is calculated, the energy barrier $E_b$ can be calculated using the equation, $E_b=(K_{eff}*V)/(K_B*T)$, where V is the volume of the free layer, T is temperature, and $K_B$ is the Bohr magneton. Aspects disclosed herein can include, for a CoFeB-based free layer, an anisotropy field ($H_k$) between approximately 2000-5000 Oersteds (Oe), and a saturation magnetization ($M_s$) between approximately 300-1300 emu/cc. In at least one example, for the first free layer 211(1) of the first MTJ 202(1), materials can include Co, Fe, B, and CoFeB-based materials. In this manner, having the first MTJ 202(1) used for eFlash memory, for example, can include having a high $K_{eff}$ such that $H_k$ is greater than 3500 Oe and $M_s$ is greater than 800 emu/cc. The second free layer 211(2) of the second MTJ 202(2) can include materials such as Co, Fe, B, and CoFeB-based materials. In this regard, having the second MTJ 202(2) used for main memory (eDRAM), for example, can include having a $K_{eff}$ such that $H_k$ is approximately equal to 3000 Oe and $M_s$ is approximately between 600-800 emu/cc. The third free layer 211(3) of the third MTJ 202(3) can include materials such as Co, Fe, B, and CoFeB-based materials. In this regard, having the third MTJ 202(3) used for eSRAM cache memory, for example, can include having a $K_{eff}$ such that $H_k$ is approximately less than 2500 Oe and $M_s$ is approximately less than 600 emu/cc.

Similarly, to vary the energy barriers $E_{b(1)}$-$E_{b(3)}$ between the MRAM bit cells 201(1)(1)-201(3)(P), the pinned layers 213(1)-213(3) of the MTJ stacks 204(1)-204(3) can be formed from different material compositions that can affect the energy barriers $E_{b(1)}$-$E_{b(3)}$ of the MTJs 202(1)-202(3). For example, the first pinned layer 213(1) of the first MTJ 202(1) can include materials such as Co, Pt, Co/Pt-based materials, B, and/or CoFeB-based materials. The second pinned layer 213(2) of the second MTJ 202(2) can include materials such as Co, Nickel (Ni), Co/Ni-based materials, Pt, Co/Pt-based materials, B, and/or CoFeB-based materials. The third pinned layer 213(3) of the third MTJ 202(3) can include materials such as Co, Ni, CoNi-based materials, Fe, B, and/or CoFeB-based materials.

Similarly, to vary the energy barriers $E_{b(1)}$-$E_{b(3)}$ among the MRAM bit cells 201(1)(1)-201(3)(P), the tunnel barrier layers 212(1)-212(3) of the MTJ stacks 204(1)-204(3) can be formed from different material compositions that can affect the energy barriers $E_{b(1)}$-$E_{b(3)}$ of the MTJs 202(1)-202(3). For example, the first tunnel barrier layer 212(1) can include resistance area products (RAs) such as approximately 8-10 ohm-micrometers squared ($\Omega\mu m^2$) and tunnel magnetoresistances (TMRs) approximately 150%. The second tunnel barrier layer 212(2) can include RAs such as approximately 5-8 $\Omega\mu m^2$ and TMRs approximately 200%. The third tunnel barrier layer 212(3) can include RAs such as less than 5 $\Omega\mu m^2$ and TMRs approximately 200%.

Critical dimensions of the first MTJ 202(1) can include critical dimensions greater than seventy (70) nm. Critical dimensions of the second MTJ 202(2) can include critical dimensions between approximately thirty-five (35) and seventy (70) nm. Critical dimensions of the third MTJ 202(3) can include critical dimensions less than thirty-five (35) nm. Retention rates of the first MTJ 202(1) can include ten (10) years at one hundred twenty-five (125) degrees Celsius (C). Retention rates of the second MTJ 202(2) can include ten (10) years at eighty-five (85) degrees Celsius (C). Retention rates of the third MTJ 202(3) can include a few days or months at eighty-five (85) degrees Celsius (C). Energy barriers $E_{b(1)}$-$E_{b(3)}$ can be in the range of approximately 80-100 electronvolts (eV) for eFlash, approximately 50-60 eV for eSRAM, and approximately 60-70 eV for eDRAM, as non-limiting examples. MTJ stacks 204(1)-204(3) can have heights between approximately 15-80 nm, as non-limiting examples. Pinned layers 213(1)-213(3) for eFlash can include Co/Pt-based materials for a multilayer (ML) and CoFeB-based materials for a synthetic antiferromagnetic (SAF) layer. Pinned layers 213(1)-213(3) for eDRAM can include Co/Pt-based materials for a ML and CoFeB-based materials for an SAF layer. Pinned layers 213(1)-213(3) for eSRAM for cache memory can include Co/Ni-based materials for a ML and CoFeB-based materials for an SAF layer, as non-limiting examples. Each access transistor 228(1)-228(3) can be a planar n-type metal-oxide semiconductor (MOS) (NMOS) or p-type MOS (PMOS) type transistor, an NMOS or PMOS Fin field-effect transistor (FinFET), or a silicon-on-insulator (SOI) NMOS or PMOS type transistor, as non-limiting examples. Each first bottom via 218(1)-218(3) can include materials such as Ta, TaN, W, and Cu-based materials, such that each first bottom via 218(1)-218(3) can have heights between approximately 5-20 nm, and widths larger or smaller than the width of each MTJ 202(1)-202(3), as non-limiting examples. Each second bottom via 222(1)-222(3) can include materials such as Cu, W, Ta, and/or Ta/TaN, and have heights between approximately 50-100 nm, as non-limiting examples. Each bottom metal line 220(1)-220(3) can include materials such as Cu, W, and/or Ta/TaN, and have heights between approximately 50-100 nm and widths between approximately 30-100 nm, as non-limiting examples. The diffusion barrier layer 224 can include materials such as silicon nitride (SiN), SiCON, and/or silicon oxynitride (SiON), and have heights such as approximately 10-30 nm, as non-limiting examples. The inter-metal layer 226 can include materials such as silicon dioxide (SiO2), SiON, and/or SiN, and have heights between approximately 50-100 nm, as non-limiting examples.

Figure 3:
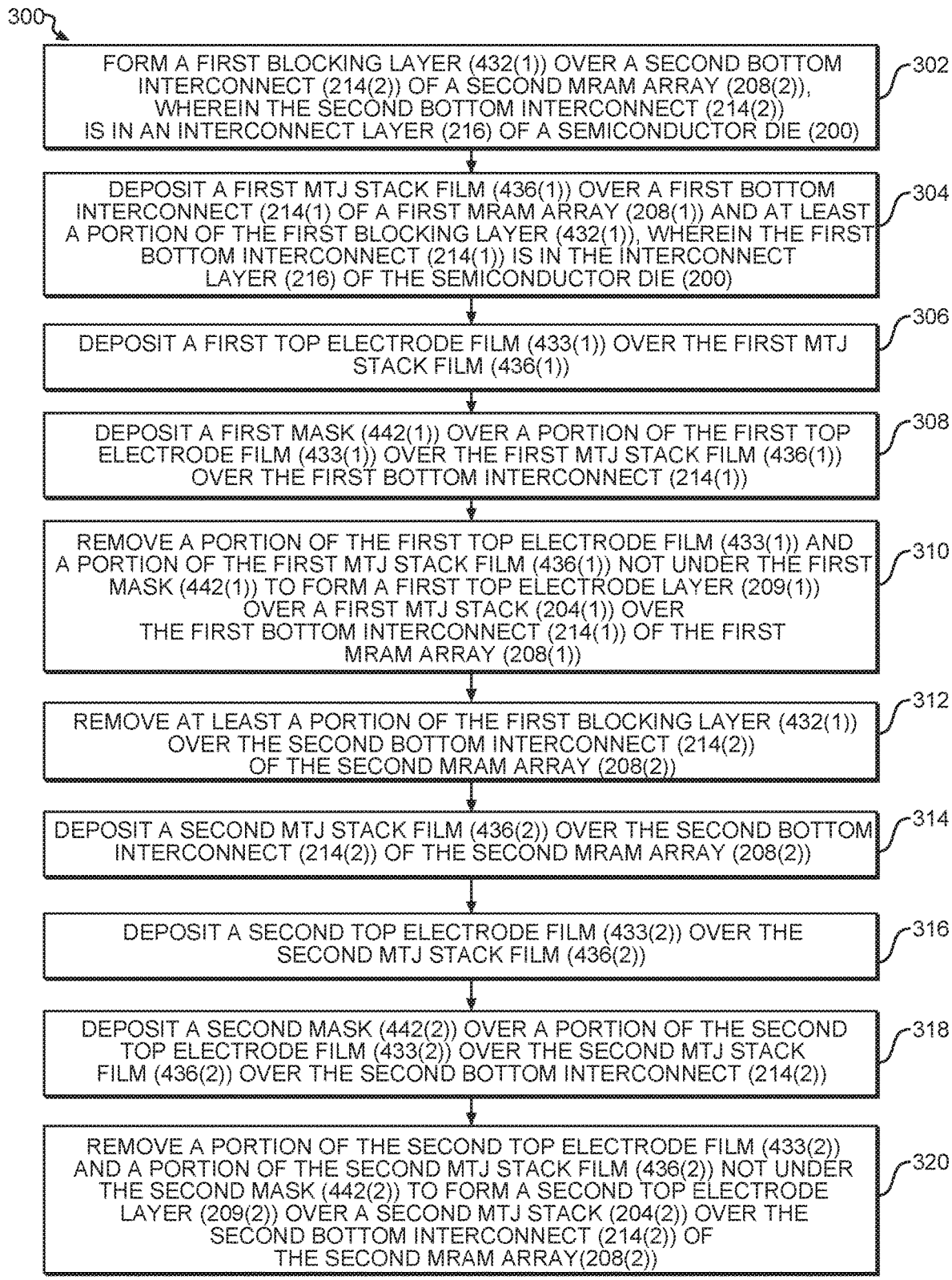
FIG. 3 is a flowchart illustrating an exemplary process of fabricating the MTJ stacks in the semiconductor die in FIG. 2B.
Figure 4C:
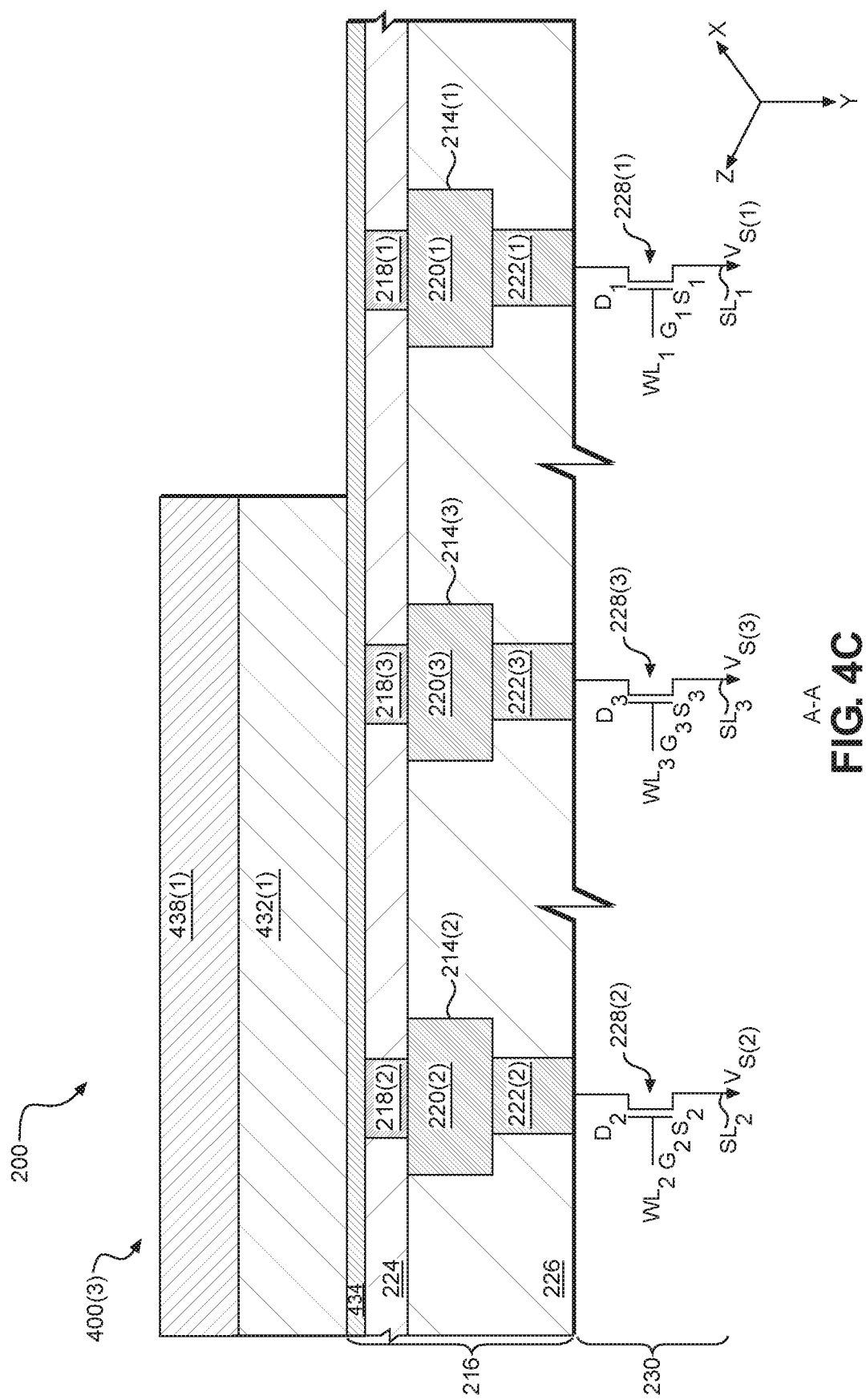
Figure 4D:
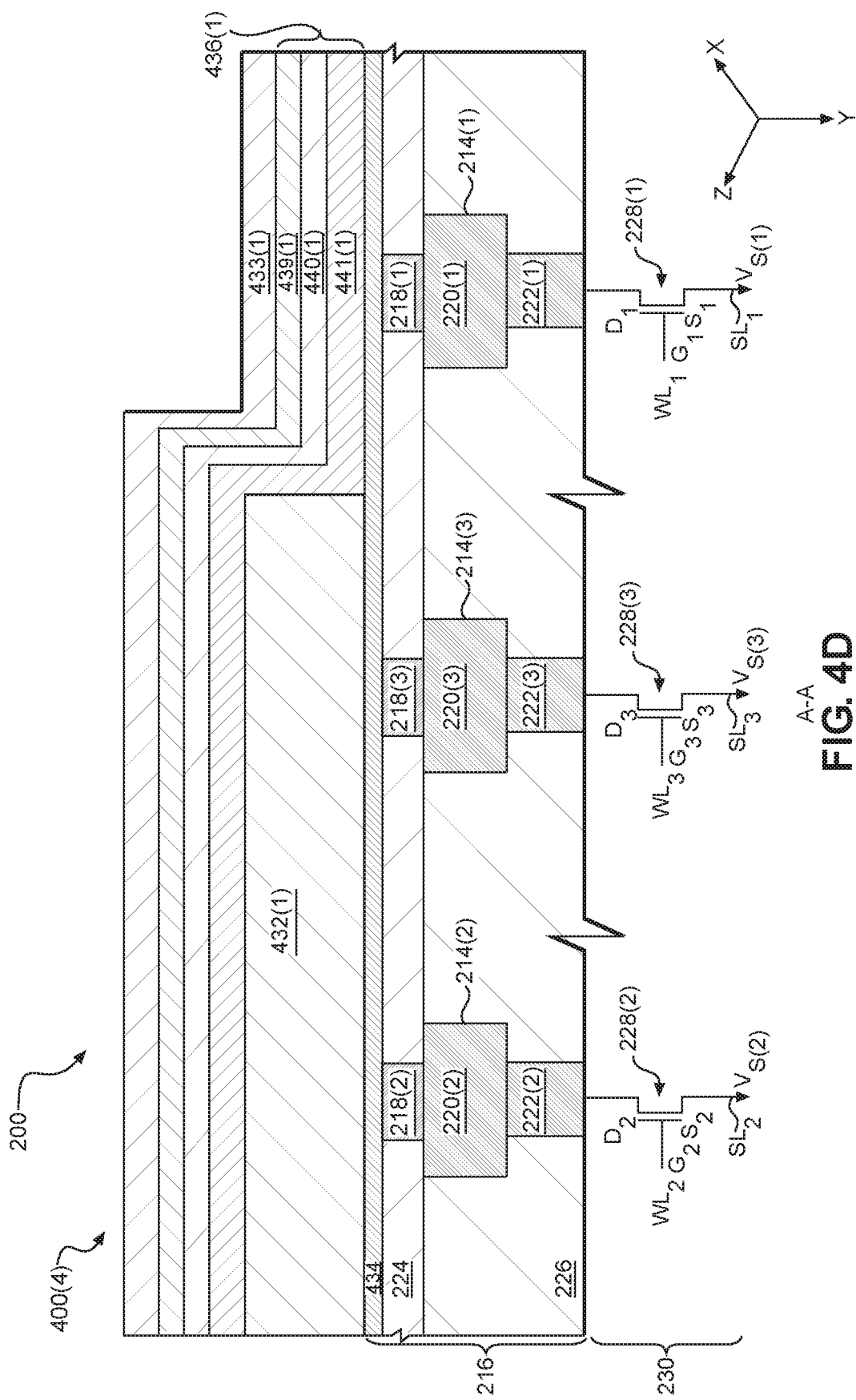
Figure 4E:
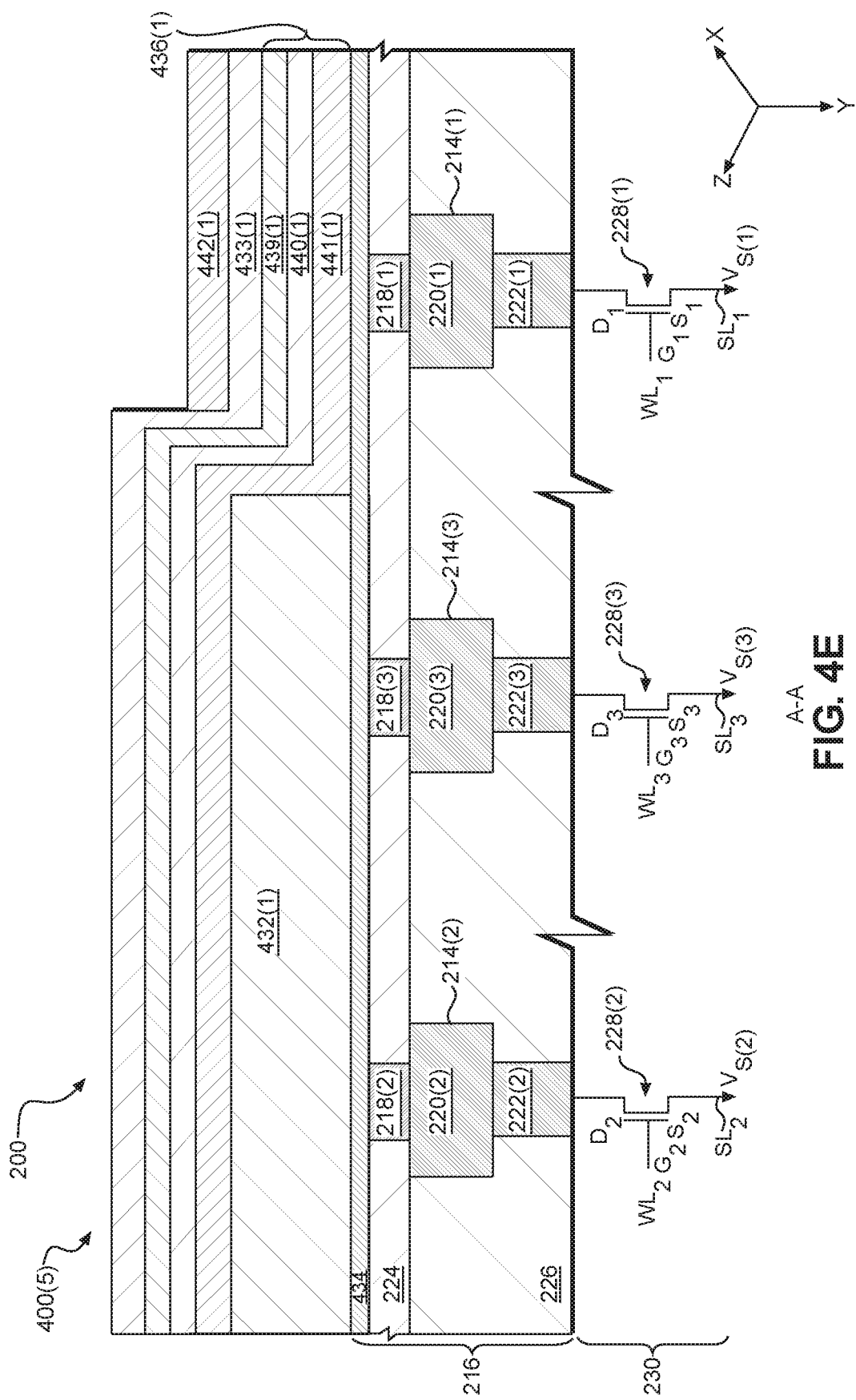
Figure 4F:
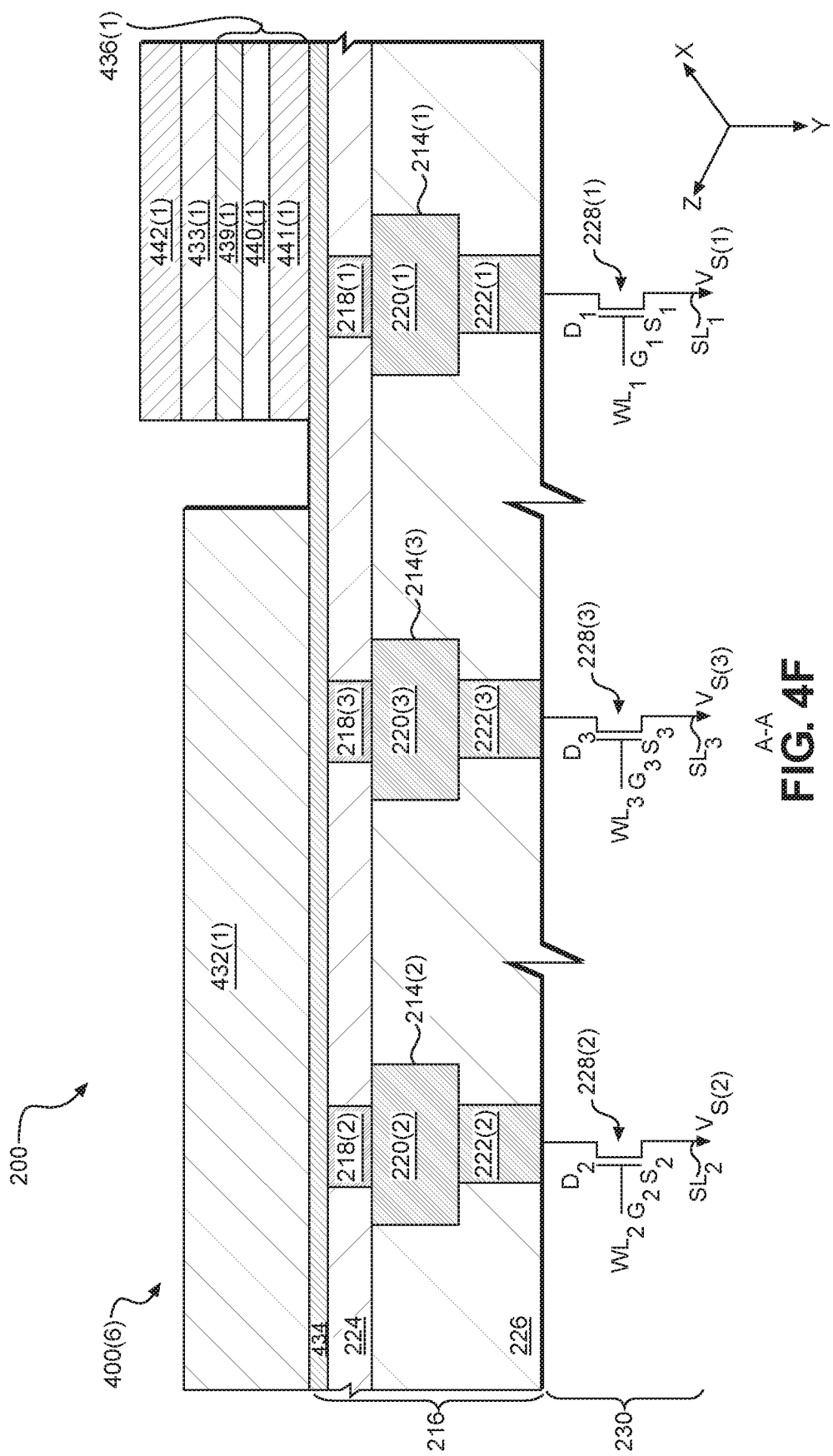
Figure 4I:
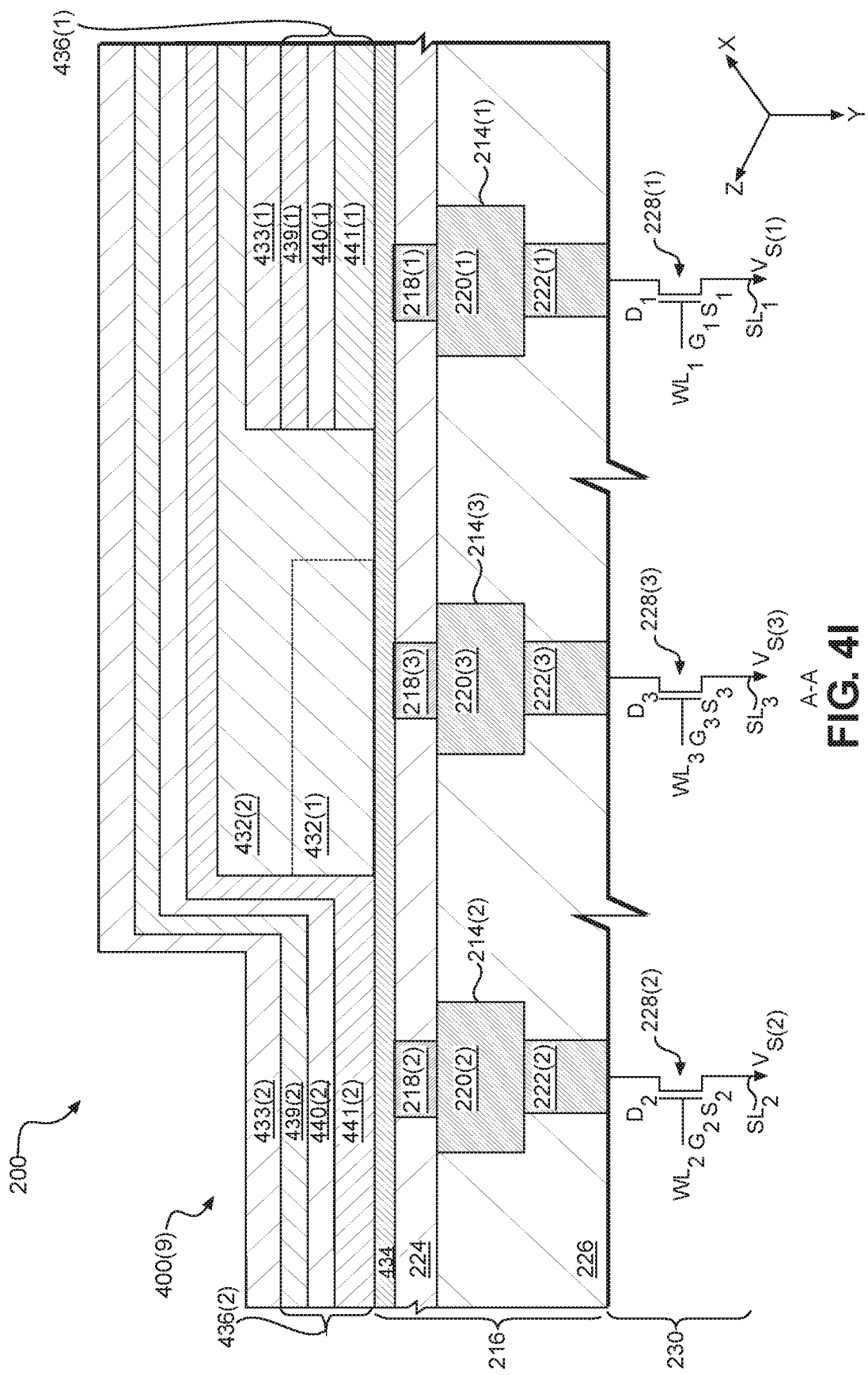
Figure 4J:
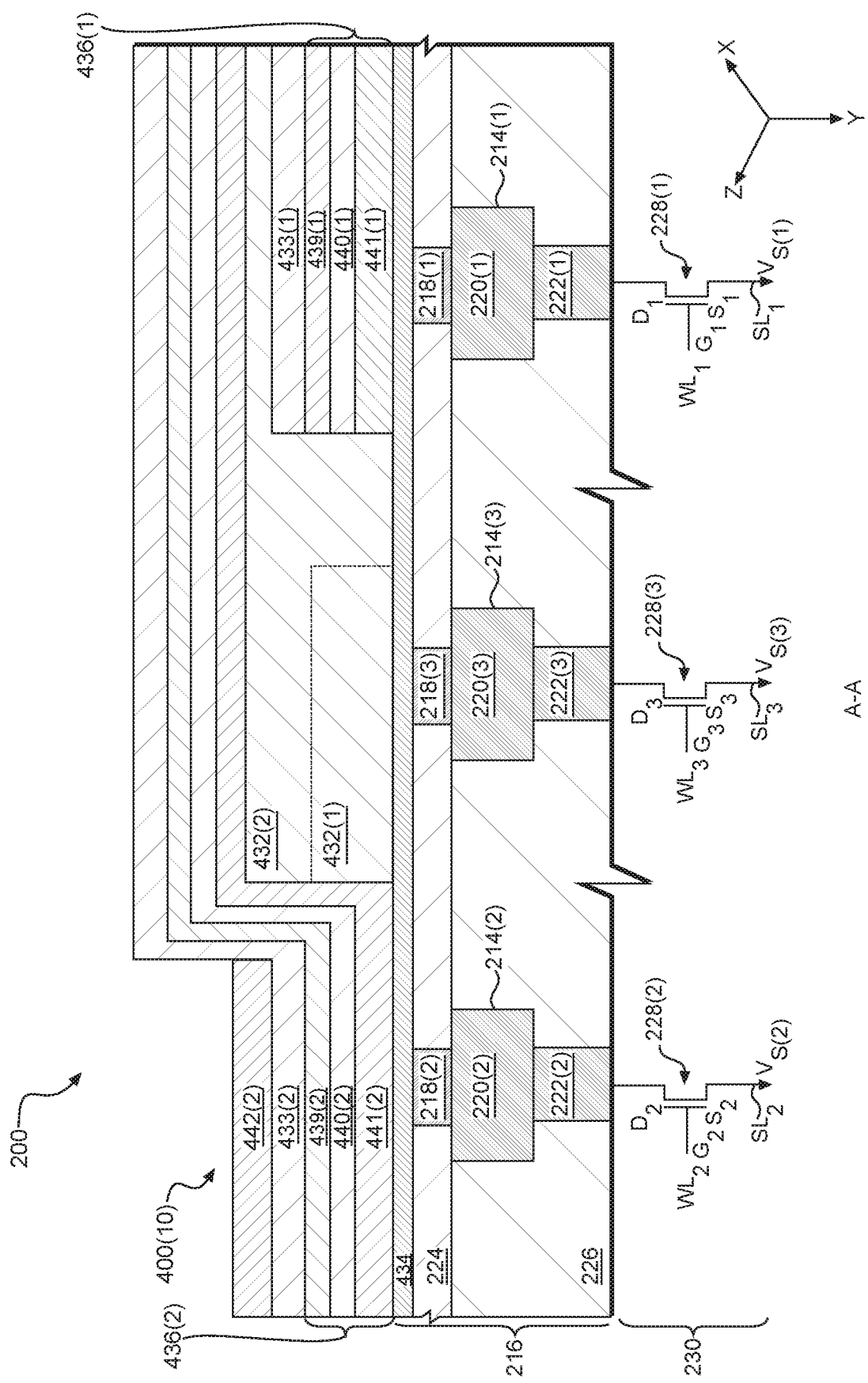
Figure 4K:
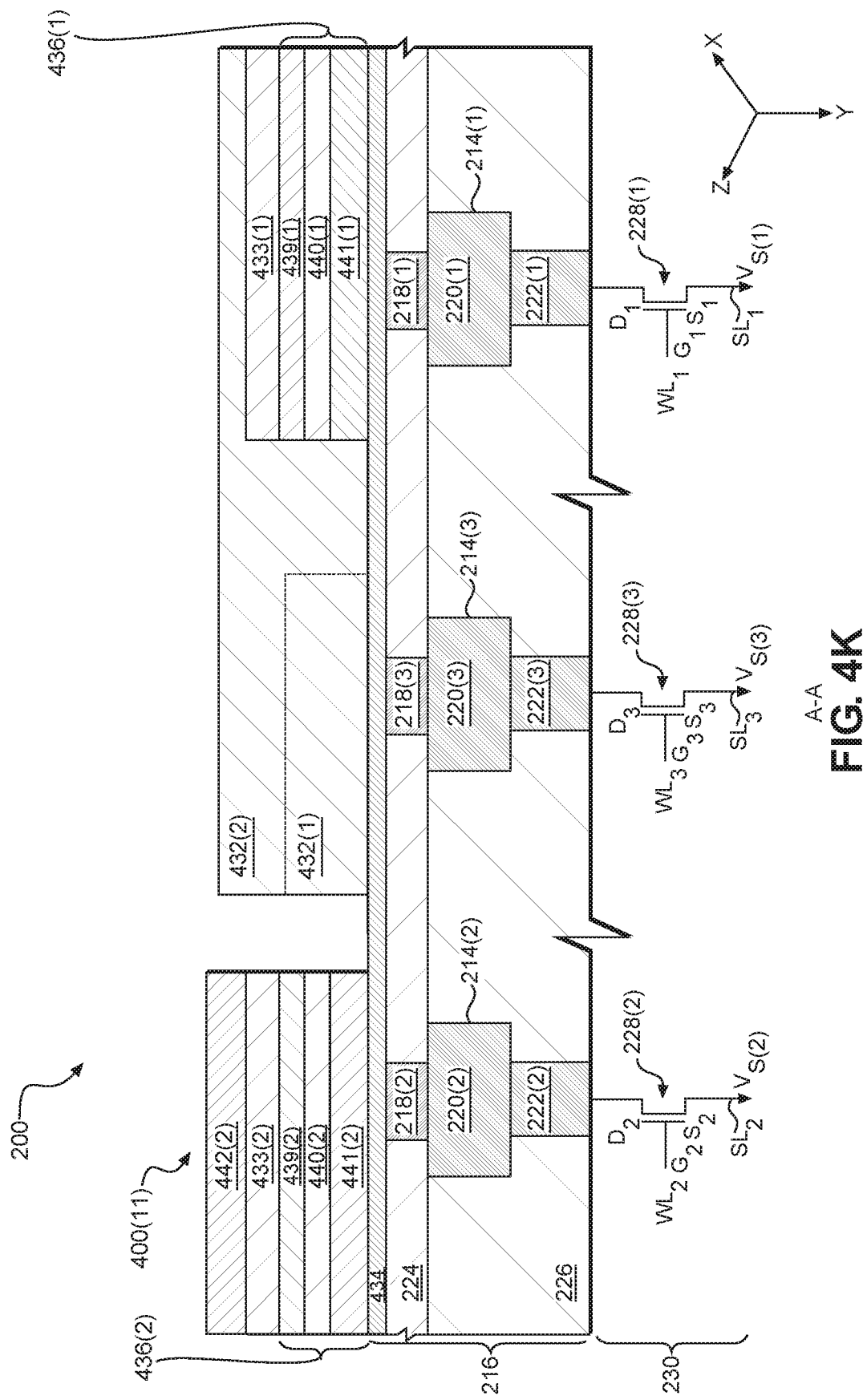

In FIG. 2B, the MTJs 202(1)-202(3) having different energy barriers $E_{b(1)}$-$E_{b(3)}$ are fabricated in the same layer of the semiconductor die 200 to avoid having to provide additional layers in the semiconductor die 200 for the different MTJs 202(1)-202(3). Fabricating the MTJs 202(1)-202(3) having different energy barriers $E_{b(1)}$-$E_{b(3)}$ in the same layer of a semiconductor die 200 can reduce the overall height of the semiconductor die 200, thereby reducing the overall size of the semiconductor die 200. In this regard, FIG. 3 illustrates an exemplary fabrication process 300 employed to fabricate the three (3) MTJ stacks 204(1)-204(3) in the semiconductor die 200 in FIG. 2B. FIGS. 4A-4S illustrate various fabrication stages of the exemplary fabrication process 300 employed to fabricate the three (3) MTJ stacks 204(1)-204(3) in the semiconductor die 200 in FIG. 2B. The exemplary fabrication process 300 in FIG. 3 will be discussed in conjunction with the exemplary process steps in FIGS. 4A-4S.

In this regard, a first step of the fabrication process 300 in FIG. 3 includes forming a first blocking layer 432(1) over the second bottom interconnect 214(2) of the second MRAM array 208(2), wherein the second bottom interconnect 214(2) is in the interconnect layer 216 of the semiconductor die 200 (block 302 in FIG. 3). In this regard, FIGS. 4A-4C illustrate cross-sectional views of first, second, and third fabrication stages 400(1)-400(3) of forming the first blocking layer 432(1) over the second bottom interconnect 214(2) of the second MRAM array 208(2) according to the fabrication step in block 302 in FIG. 3. As shown in FIGS. 4A-4C, the first blocking layer 432(1) is formed over the second bottom interconnect 214(2) in the Y-axis direction to protect the second bottom interconnect 214(2) while depositing a first MTJ film stack 436(1) in a later step. In FIGS. 4A and 4B, a bottom electrode film 434 is formed in the interconnect layer 216 above the diffusion barrier layer 224 and each first bottom via 218(1)-218(3). FIG. 4C illustrates forming the first blocking layer 432(1) over the second bottom interconnect 214(2) of the second MRAM array 208(2) and the third bottom interconnect 214(3) of the third MRAM array 208(3). In this example, a first photoresist mask 438(1) is used to form the first blocking layer 432(1). In this manner, the first blocking layer 432(1) is formed over the second bottom interconnect 214(2) of the second MRAM array 208(2) and the third bottom interconnect 214(3) of the third MRAM array 208(3).

The semiconductor die 200 can be provided by processes such as chemical vapor deposition (CVD), physical vapor deposition (PVD), photolithography, reactive ion etching (RIE), etch, chemical mechanical planarization (CMP), and/or wet/dry cleaning processes, as non-limiting examples. The semiconductor layer 230 can comprise materials such as Si, SiO, a high-k oxide material, a metal gate material, B, phosphorous (P), arsenic (As), Ti, Co, Ni, and/or silicon germanium (SiGe), as non-limiting examples. The voltage source $V_{S(1)}$-$V_{S(3)}$ of each access transistor 228(1)-228(3) can be a single voltage source or some combination of different voltage sources, and can provide voltages in the range of approximately 0.5-1.8 volts (V), as non-limiting examples. The bottom electrode film 434 can comprise materials including Ta, TaN, W, Cu, Ru, Ti, and/or TiN, and can have heights between approximately 10-20 nm, as non-limiting examples. The bottom electrode film 434 can be deposited using a process such as PVD, as a non-limiting example. The first blocking layer 432(1) can comprise materials such as SiO2, SiN, and/or SiCON, and can be formed using a process such as CVD, as a non-limiting example. The first photoresist mask 438(1) can be deposited using processes such as spin coating, as a non-limiting example.

Once the first blocking layer 432(1) is formed over the second bottom interconnect 214(2) in the Y-axis direction, the first MTJ stack film 436(1) can be deposited so as to later form the first MTJ stack 204(1) from the first MTJ stack film 436(1). The fabrication process 300 in FIG. 3 includes depositing a first MTJ stack film 436(1) over the first bottom interconnect 214(1) of the first MRAM array 208(1) and at least a portion of the first blocking layer 432(1), wherein the first bottom interconnect 214(1) is in the interconnect layer 216 of the semiconductor die 200 (block 304 in FIG. 3). In this regard, FIG. 4D illustrates a cross-sectional view of a fourth fabrication stage 400(4) of depositing the first MTJ stack film 436(1) over the first bottom interconnect 214(1) of the first MRAM array 208(1) and at least a portion of the first blocking layer 432(1) according to the fabrication step in block 304 in FIG. 3. Further, the fabrication process 300 in FIG. 3 includes depositing a first top electrode film 433(1) over the first MTJ stack film 436(1) (block 306 in FIG. 3), as illustrated in the fourth fabrication stage 400(4) in FIG. 4D. As shown in FIG. 4D, depositing the first MTJ stack film 436(1) includes depositing a first free film 439(1), a first tunnel barrier film 440(1), and a first pinned film 441(1). In this example, the first MTJ stack film 436(1) is deposited conformally over the bottom electrode film 434 in the first MRAM array 208(1) and over the first blocking layer 432(1) in the second MRAM array 208(2) and the third MRAM array 208(3). The first MTJ stack film 436(1) can be formed by a process such as PVD, and can comprise materials such as Ta/TaN, Co, Pt, platinum manganese (PtMn), CoFe, CoFeB, magnesium oxide (MgO), Ru, and/or HfIr, Ta, as non-limiting examples. For the varying memory applications in the examples above, the pinned layers 213(1)-213(3) of the MTJs 202(1)-202(3) should be of the same material. For eFlash memory applications, the free layer 211(1)-211(3) can be Fe-rich (i.e., the material is more than 500% Fe) and/or include a CoFeB/Fe-rich alloy. For example, Co10Fe70B20 can be used as a material for the free layer 211(1)-211(3) of each MTJ 202(1)-202(3). For eDRAM memory applications, composite Fe-rich alloys and/or CoFeB can be used as materials for the free layer. In this example, the free layer 211(1)-211(3) implemented in an eDRAM memory application can be thinner than the free layer 211(1)-211(3) implemented in an eFlash memory application. For eSRAM memory applications, the free layer 211(1)-211(3) can be thinner than the free layer 211(1)-211(3) used in the exemplary eDRAM memory applications, as discussed above. The free layer 211(1)-211(3) in eDRAM memory applications can be made of CoFeB, for example, and doped with Ta, for example. Each of these memory applications discussed above can be fabricated using a process such as PVD. Additionally, the first top electrode film 433(1) can be formed by a process such as PVD, and can comprise materials such as Ta, TaN, Ru, Ti, TiN, and/or W, as non-limiting examples.

Once the first MTJ film stack 436(1) is deposited, a first mask, which is first hard mask 442(1) in this example, can be deposited over a portion of the first MTJ film stack 436(1) in the Y-axis direction in a later step to protect that portion while another portion is removed. The fabrication process 300 in FIG. 3 also includes depositing the first hard mask 442(1) over a portion of the first top electrode film 433(1) over the first MTJ stack film 436(1) over the first bottom interconnect 214(1) (block 308 in FIG. 3). In this regard, FIG. 4E illustrates a cross-sectional view of a fifth fabrication stage 400(5) of depositing the first hard mask 442(1) over a portion of the first top electrode film 433(1) according to the fabrication step in block 308 in FIG. 3. As shown in FIG. 4E, the first hard mask 442(1) is deposited over the portion of the first top electrode film 433(1) over the first MTJ stack film 436(1) over the first bottom interconnect 214(1). In this manner, the first hard mask 442(1) covers the portion of the first top electrode film 433(1) above the first bottom interconnect 214(1), protecting a portion of the first top electrode film 433(1) and a portion of the first MTJ stack film 436(1) thereunder from etching, as will be discussed in further detail below. The first hard mask 442(1) can be deposited using a process such as CVD, as a non-limiting example, and can comprise materials such as SiO2, silicon nitride (SiNx), and/or SiCN, as non-limiting examples.

The fabrication process 300 in FIG. 3 also includes removing a portion of the first top electrode film 433(1) and a portion of the first MTJ stack film 436(1) not under the first hard mask 442(1) to form the first top electrode layer 209(1) over the first MTJ stack 204(1) over the first bottom interconnect 214(1) of the first MRAM array 208(1) (block 310 in FIG. 3). In this regard, FIG. 4F illustrates a cross-sectional view of a sixth fabrication stage 400(6) of removing a portion of the first top electrode film 433(1) and a portion of the first MTJ stack film 436(1) not under the first hard mask 442(1) according to the fabrication step in block 310 in FIG. 3. Forming the first top electrode layer 209(1) over the first MTJ stack 204(1) over the first bottom interconnect 214(1) of the first MRAM array 208(1) in the Y-axis direction is illustrated in a later step. In this regard, a portion of the first top electrode film 433(1) and a portion of the first MTJ stack film 436(1) not covered by the first hard mask 442(1) are removed. The first blocking layer 432(1) is not removed as it is used in this example to cover and protect the second bottom interconnect 214(2) and the third bottom interconnect 214(3). In this example, removing may include processes such as etching, plasma chemical etching, ion miller physical etching, and/or cleaning processes, as non-limiting examples. Etchants may include tetrafluoromethane (CF4), C12SF6, octafluorocyclobutane (C4F8), and/or fluoroform (CHF3), as non-limiting examples.

The fabrication process 300 in FIG. 3 also includes removing at least a portion of the first blocking layer 432(1) over the second bottom interconnect 214(2) of the second MRAM array 208(2) (block 312 in FIG. 3). In this regard, FIGS. 4G-4H illustrate cross-sectional views of seventh and eighth fabrication stages 400(7), 400(8) of removing at least a portion of the first blocking layer 432(1) over the second bottom interconnect 214(2) of the second MRAM array 208(2) in the Y-axis direction according to the fabrication step in block 312 in FIG. 3. In this regard, FIG. 4G illustrates removing the first hard mask 442(1) and forming a second blocking layer 432(2) over the second bottom interconnect 214(2), the third bottom interconnect 214(3), and the first top electrode film 433(1). In this example, the second blocking layer 432(2) is formed over the first blocking layer 432(1) and the first top electrode film 433(1) to protect a portion of the first top electrode film 433(1) and a portion of the first MTJ stack film 436(1) thereunder from etching, as will be discussed in further detail below. FIG. 4H illustrates removing a portion of the first blocking layer 432(1) and a portion of the second blocking layer 432(2) to expose the second bottom interconnect 214(2) of the second MRAM array 208(2). In this example, a second photoresist mask 438(2) is used to expose the portion of the first blocking layer 432(1) to be removed. In this manner, a second MTJ stack film 436(2) may be deposited above the exposed second bottom interconnect 214(2) in a later step. In alternative methods, instead of forming the second blocking layer 432(2) over the first blocking layer 432(1), the first blocking layer 432(1) can be removed and the second blocking layer 432(2) can be deposited thereafter. However, this alternative method may not be desirable because removing the first blocking layer 432(1) may damage the bottom electrode film 434 through mechanisms such as oxidative damage. The second photoresist mask 438(2) can comprise materials such as photopolymeric, photodecomposing, and photocross-slinking photoresist materials, and can be deposited using processes such as spin coating, as non-limiting examples.

The fabrication process 300 in FIG. 3 includes depositing the second MTJ stack film 436(2) over the second bottom interconnect 214(2) of the second MRAM array 208(2) (block 314 in FIG. 3). In this regard, FIG. 4I illustrates a cross-sectional view of a ninth fabrication stage 400(9) of depositing a second MTJ stack film 436(2) in the Y-axis direction over the second bottom interconnect 214(2) of the second MRAM array 208(2) and at least a portion of the second blocking layer 432(2) according to the fabrication step in block 314 in FIG. 3. Further, the fabrication process 300 in FIG. 3 also includes depositing a second top electrode film 433(2) over the second MTJ stack film 436(2) (block 316 in FIG. 3). In this regard, the fabrication process 300 in FIG. 3 includes depositing the second top electrode film 433(2) over the second MTJ stack film 436(2) as illustrated in the ninth fabrication stage 400(9) in FIG. 4I. As shown in FIG. 4I, depositing the second MTJ stack film 436(2) includes depositing a second free film 439(2), a second tunnel barrier film 440(2), and a second pinned film 441(2). In this example, the second MTJ stack film 436(2) is deposited conformally over the bottom electrode film 434 in the second MRAM array 208(2) and over the second blocking layer 432(2) in the first MRAM array 208(1) and the third MRAM array 208(3). The second MTJ stack film 436(2) can be formed by a process such as PVD, as a non-limiting example. Additionally, the second top electrode film 433(2) can be formed by a process such as PVD, as a non-limiting example.

The fabrication process 300 in FIG. 3 also includes depositing a second mask, which is second hard mask 442(2) in this example, over a portion of the second top electrode film 433(2) over the second MTJ stack film 436(2) over the second bottom interconnect 214(2) (block 318 in FIG. 3). In this regard, FIG. 4J illustrates a cross-sectional view of a tenth fabrication stage 400(10) of depositing the second hard mask 442(2) in the Y-axis direction over a portion of the second top electrode film 433(2) according to the fabrication step in block 318 in FIG. 3. As shown in FIG. 4J, the second hard mask 442(2) is deposited over the portion of the second top electrode film 433(2) over the second MTJ stack film 436(2) over the second bottom interconnect 214(2). In this manner, the second hard mask 442(2) covers the portion of the second top electrode film 433(2) above the second bottom interconnect 214(2), protecting the portion of the second top electrode film 433(2) and a portion of the second MTJ stack film 436(2) thereunder from etching, as will be discussed in further detail below. The second hard mask 442(2) can be deposited using processes such as CVD or PVD and can comprise materials such as SiO2, SiNx, and/or SiCN, as non-limiting examples.

The fabrication process 300 in FIG. 3 also includes removing a portion of the second top electrode film 433(2) and a portion of the second MTJ stack film 436(2) not under the second hard mask 442(2) to form the second top electrode layer 209(2) over the second MTJ stack 204(2) over the second bottom interconnect 214(2) of the second MRAM array 208(2) (block 320 in FIG. 3). In this regard, FIG. 4K illustrates a cross-sectional view of an eleventh fabrication stage 400(11) of removing a portion of the second top electrode film 433(2) and a portion of the second MTJ stack film 436(2) not under the second hard mask 442(2) according to the fabrication step in block 320 in FIG. 3. Forming the second top electrode layer 209(2) over the second MTJ stack 204(2) over the second bottom interconnect 214(2) of the second MRAM array 208(2) is shown in a later step. In this regard, a portion of the second top electrode film 433(2) and a portion of the second MTJ stack film 436(2) not covered by the second hard mask 442(2) are removed. The second blocking layer 432(2) is not removed as it is used in this example to cover and protect the first top electrode film 433(1), the first MTJ stack film 436(1), and the third bottom interconnect 214(3). In this example, removal may include processes such as etching, ion miller physical etching, plasma chemical etching, and/or cleaning processes, as non-limiting examples. Etchants may include CF4, C12SF6, C4F8, and/or CHF3, as non-limiting examples.

Figure 4M:
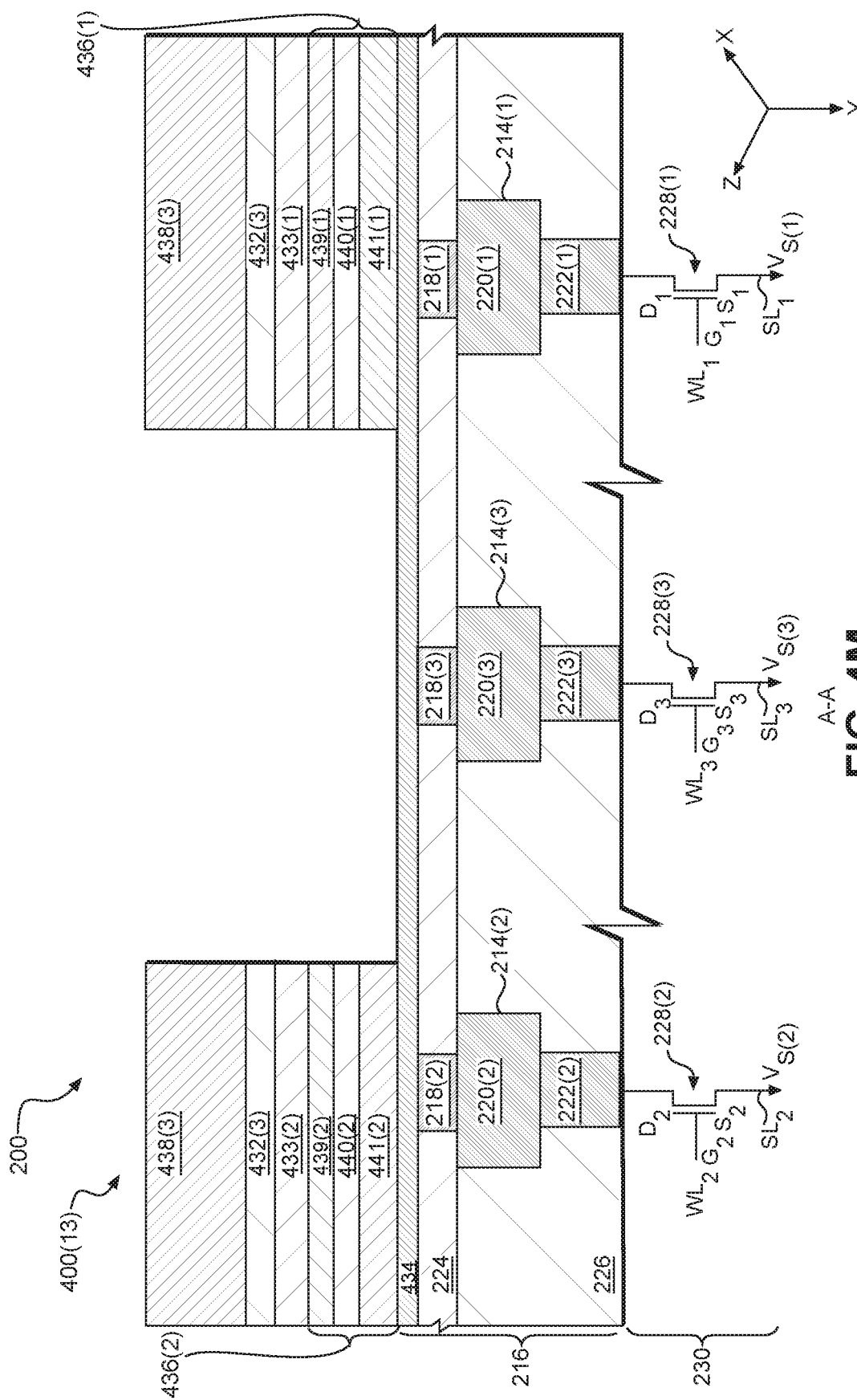
FIGS. 4M-4Q are cross-sectional diagrams illustrating exemplary process steps of fabricating a third MTJ stack of a third MRAM array in the metal layer of the semiconductor die as shown in FIG. 2B.

FIGS. 4L-4M illustrate cross-sectional views of twelfth and thirteenth fabrication stages 400(12), 400(13) of depositing a third blocking layer 432(3) and removing at least a portion of the third blocking layer 432(3) over the third bottom interconnect 214(3) of the third MRAM array 208 (3). In this regard, FIG. 4L illustrates removing the second hard mask 442(2) and forming the third blocking layer 432(3) over the third bottom interconnect 214(3), the second top electrode film 433(2), and the first top electrode film 433(1) in the Y-axis direction. In this example, the third blocking layer 432(3) is formed over the first top electrode film 433(1) and the second top electrode film 433(2) to protect portions of the first and second MTJ stack films 436(1), 436(2) below each of the first and second top electrode films 433(1), 433(2) from etching, as will be discussed in greater detail below. The third blocking layer 432(3) is also formed over the second blocking layer 432(2) to form the third blocking layer 432(3) without potentially damaging the bottom electrode film 434, as similarly discussed above. FIG. 4M illustrates removing a portion of the third blocking layer 432(3) to expose the third bottom interconnect 214(3) of the third MRAM array 208(3). In this example, a third photoresist mask 438(3) is used to expose the portion of the third blocking layer 432(3) to be removed. In this manner, the third blocking layer 432(3) can cover the first top electrode film 433(1) and the second top electrode film 433(2) so that a third MTJ stack film 436(3), introduced in a later step, can be deposited above the exposed third bottom interconnect 214(3) without being deposited directly above the first and second top electrode films 433(1), 433(2). The third photoresist can be deposited using a process such as spin coating, as a non-limiting example.

Figure 4N:
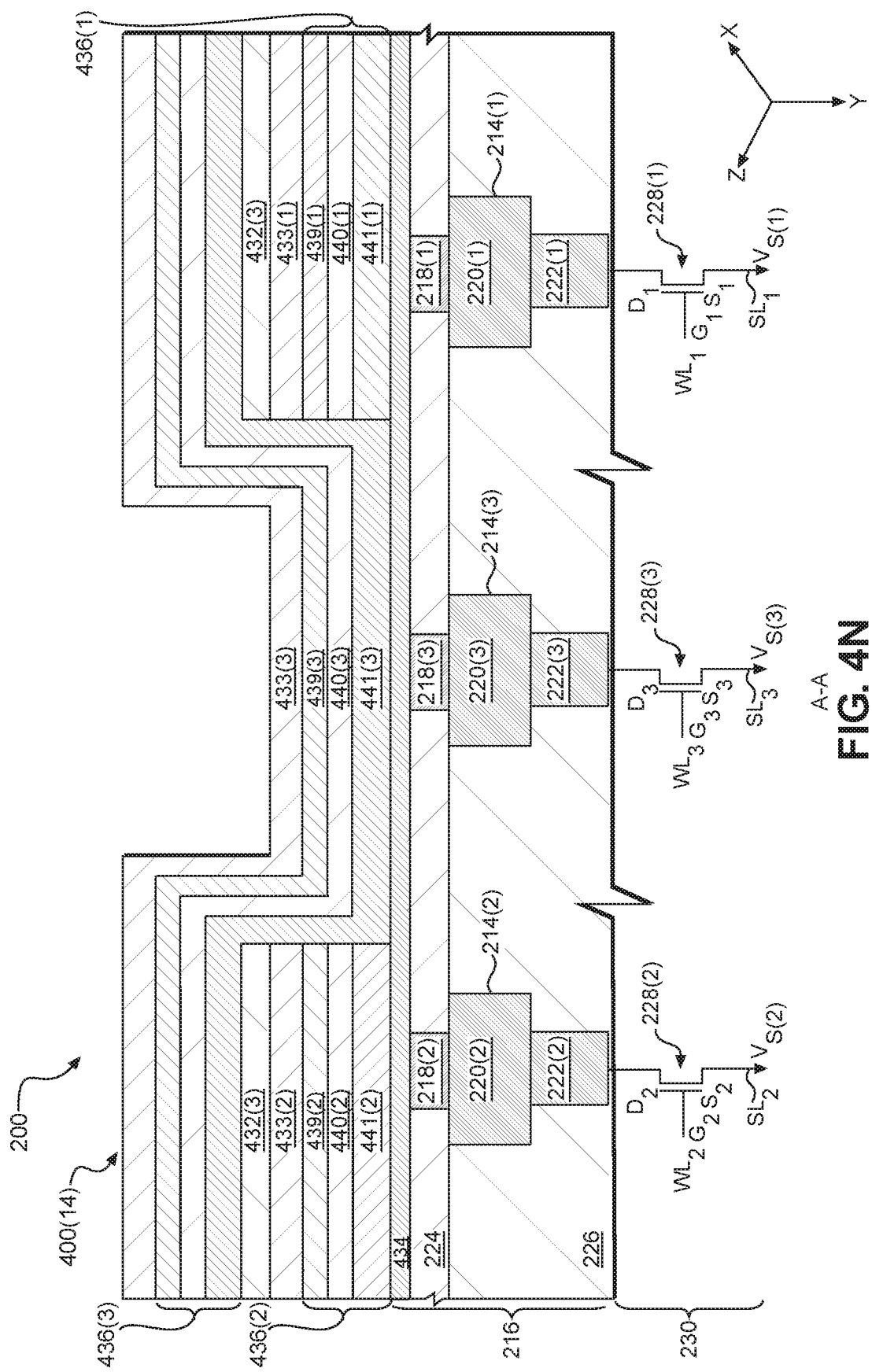

FIG. 4N illustrates a cross-sectional view of a fourteenth fabrication stage 400(14) of depositing the third MTJ stack film 436(3) in the Y-axis direction over the third bottom interconnect 214(3) of the third MRAM array 208(3). Further, FIG. 4N illustrates depositing a third top electrode film 433(3) over the third MTJ stack film 436(3) in the Y-axis direction. As shown in FIG. 4N, depositing the third MTJ stack film 436(3) includes depositing a third free film 439(3), a third tunnel barrier film 440(3), and a third pinned film 441(3). In this example, the third MTJ stack film 436(3) is deposited conformally over the bottom electrode film 434 in the third MRAM array 208(3) and over the third blocking layer 432(3) in the first MRAM array 208(1) and the second MRAM array 208(2). Similarly, the third top electrode film 433(3) is deposited conformally over the third MTJ stack film 436(3). The third MTJ stack film 436(3) can be formed by a process such as PVD and can comprise materials such as Ta/TaN, Co, Pt, PtMn, CoFe, CoFeB, MgO, Ru, HfIr, Ta, TbCoFe, and/or TbWFe, as non-limiting examples. Additionally, the third top electrode film 433(3) can be formed by a process such as PVD and can comprise materials such as Ta, TaN, Ru, Ti, TiN, and/or W, as non-limiting examples.

Figure 4O:
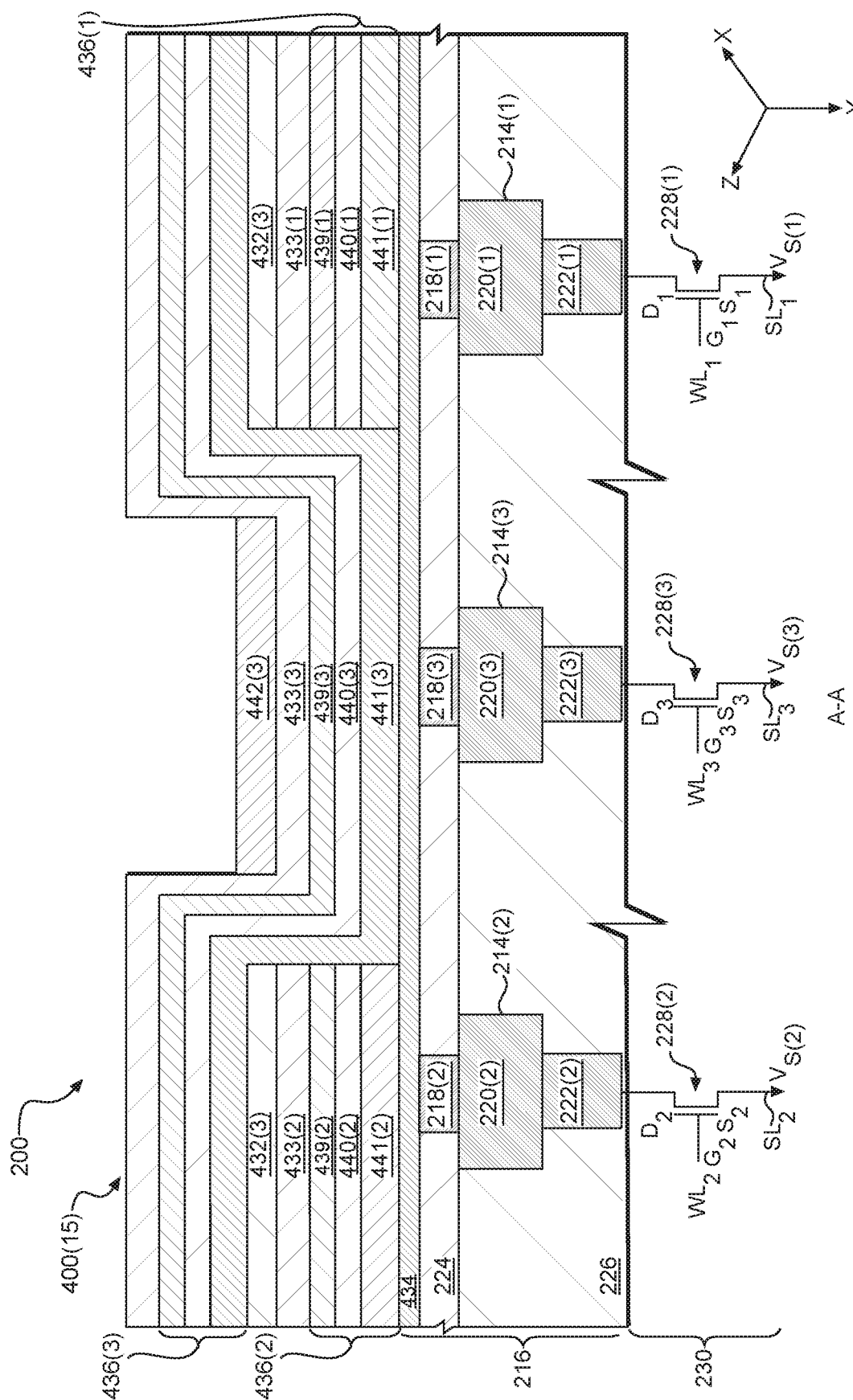

FIG. 4O illustrates a cross-sectional view of a fifteenth fabrication stage 400(15) of depositing a third mask, which is third hard mask 442(3) over a portion of the third top electrode film 433(3) in the Y-axis direction. As shown in FIG. 4O, the third hard mask 442(3) is deposited over the portion of the third top electrode film 433(3) over the third MTJ stack film 436(3) over the third bottom interconnect 214(3). In this manner, the third hard mask 442(3) covers the portion of the third top electrode film 433(3) above the third bottom interconnect 214(3), protecting the portion of the third top electrode film 433(3) and a portion of the third MTJ stack film 436(3) thereunder from etching, as will be discussed in further detail below. The third hard mask 442(3) can be deposited using processes such as CVD or PVD and can comprise materials such as SiO2, SiNx, and/or SiCN, as non-limiting examples.

Figure 4P:
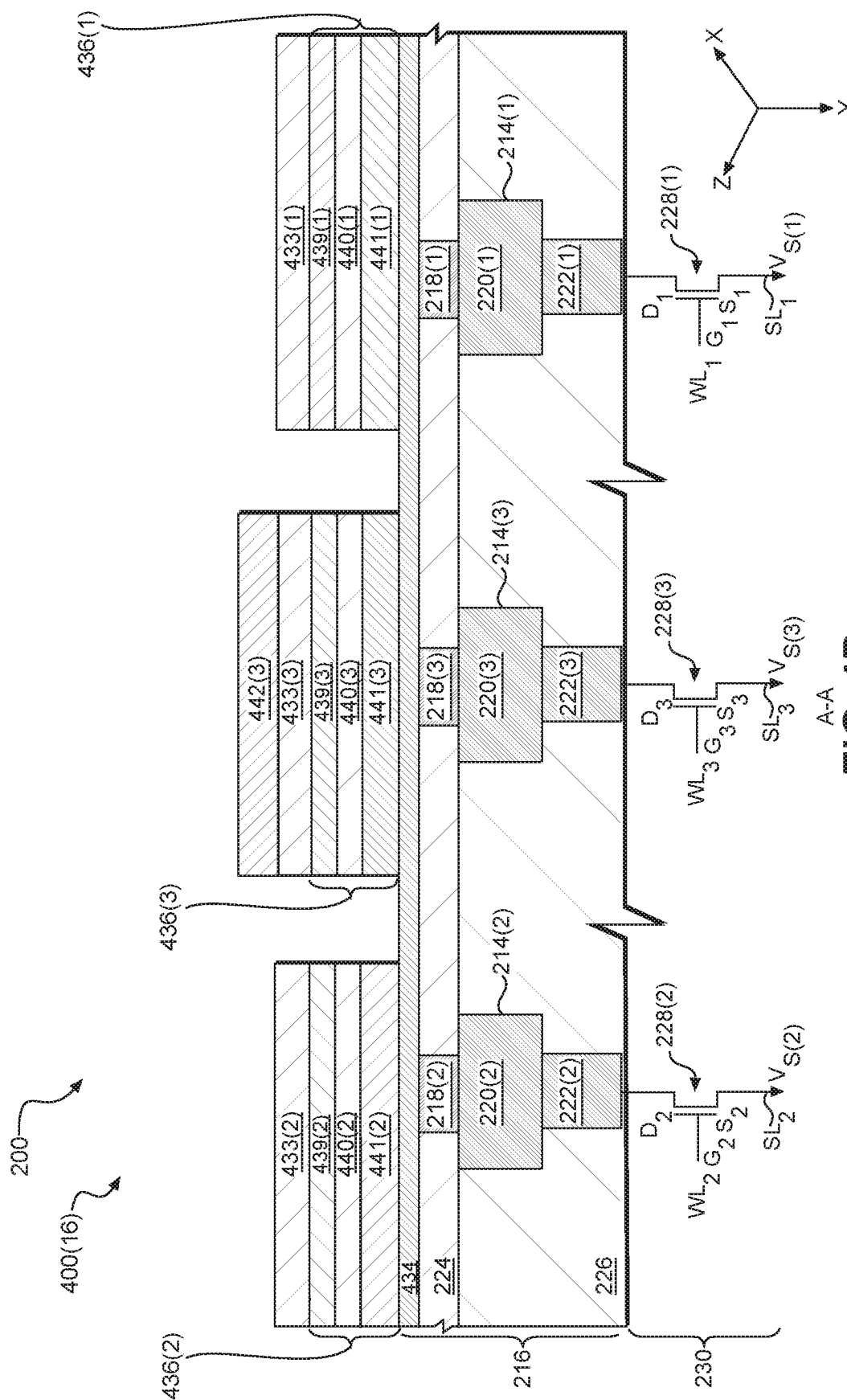

FIG. 4P illustrates a cross-sectional view of a sixteenth fabrication stage 400(16) of removing a portion of the third top electrode film 433(3) and a portion of the third MTJ stack film 436(3) not under the third hard mask 442(3). In this regard, a portion of the third top electrode film 433(3) and a portion of the third MTJ stack film 436(3) not covered by the third hard mask 442(3) are removed. The third blocking layer 432(3) covers and protects the first top electrode film 433(1) and the second top electrode film 433(2) from being removed. In this manner, the integrity of the first and second top electrode films 433(1), 433(2), as well as the first and second MTJ stack films 436(1), 436(2) thereunder, can be maintained so that each MTJ stack film 436(1), 436(2) and each top electrode film 433(1), 433(2) can later be formed into the first MTJ 202(1) and the second MTJ 202(2). In this example, removal may include processes such as etching, ion miller physical etching, plasma chemical etching, and/or cleaning processes, as non-limiting examples. Etchants may include CF4, C12SF6, C4F8, and/or CHF3, as non-limiting examples.

Figure 4Q:
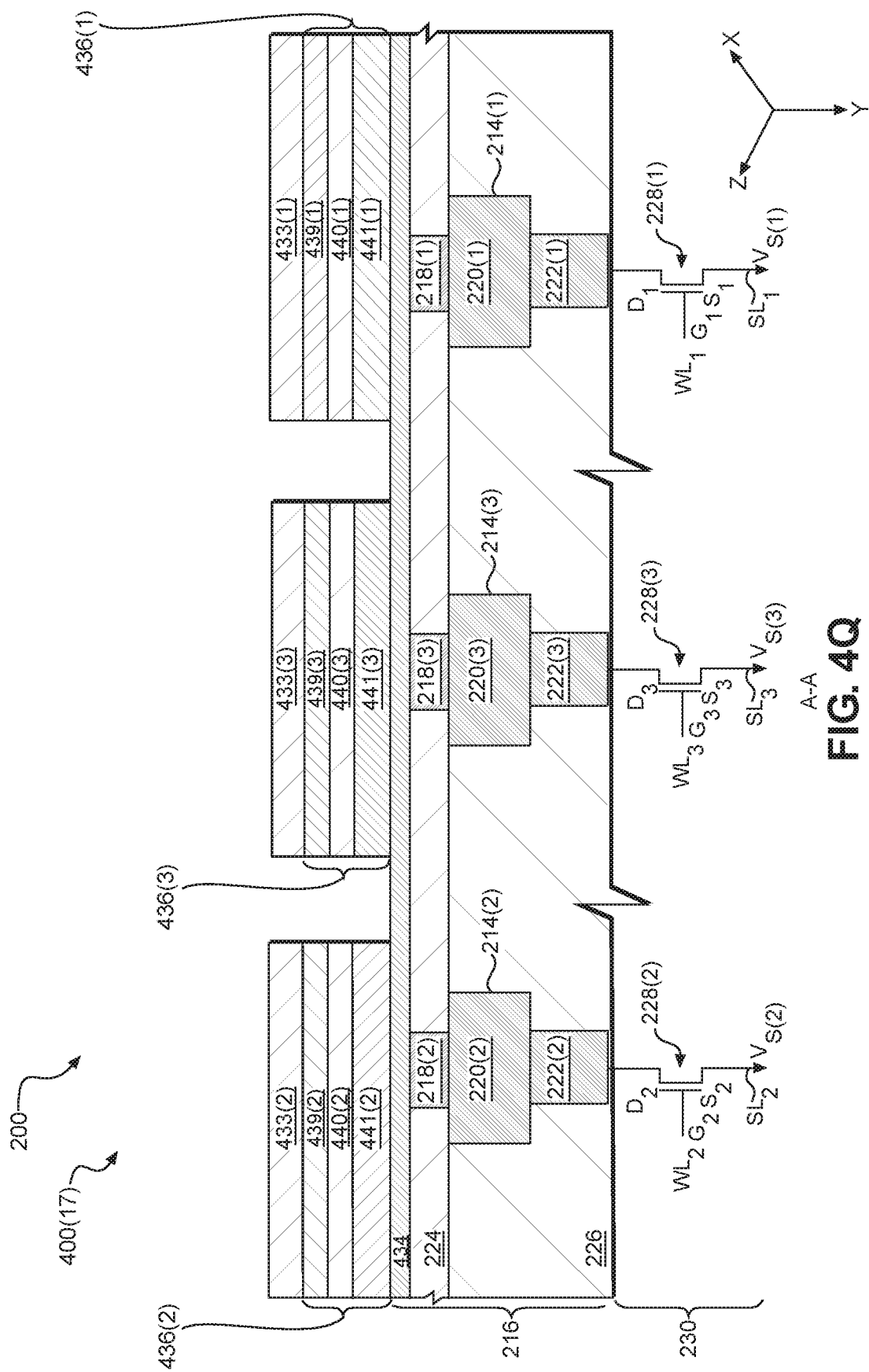

FIG. 4Q illustrates a cross-sectional view of a seventeenth fabrication stage 400(17) of removing the third hard mask 442(3) and the third blocking layer 432(3). In this regard, the third hard mask 442(3) may be removed through processes including wet etching, plasma chemical etching, and/or cleaning processes, as non-limiting examples. The third blocking layer 432(3) may be removed through processes including wet etching, plasma chemical etching, and/or cleaning processes, as non-limiting examples. If the third hard mask 442(3) is made of the same material as the third blocking layer 432(3), the third hard mask 442(3) can be removed in a manner similar to and/or simultaneously with the removal of the third blocking layer 432(3). Where possible, this removal process can also be applied to removing any of the first, second, and third hard masks 442(1)-442(3) and the first, second, and third blocking layers 432(1)-432(3). In this example, removal may include processes such as etching, ion miller physical etching, plasma chemical etching, and/or cleaning processes, as non-limiting examples. Etchants may include CF4, C12SF6, C4F8, and/or CHF3, as non-limiting examples.

Figure 4R:
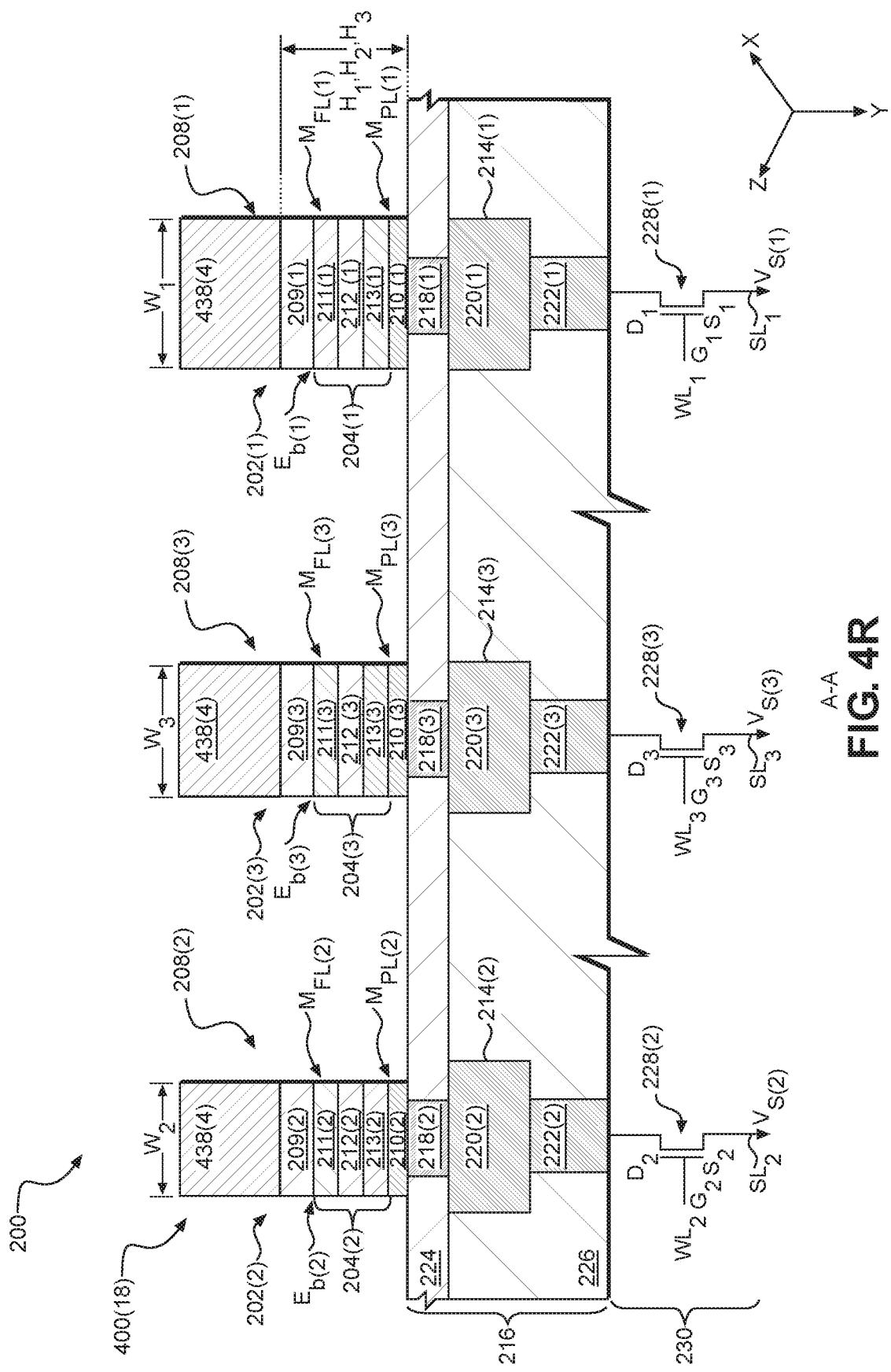
FIGS. 4R-4S are cross-sectional diagrams illustrating exemplary process steps of fabricating each MTJ stack in the semiconductor die shown in FIG. 2B such that each MTJ stack has varying widths and material types to provide an energy barrier of each MTJ stack different from an energy barrier of another MTJ stack.
Figure 4S:
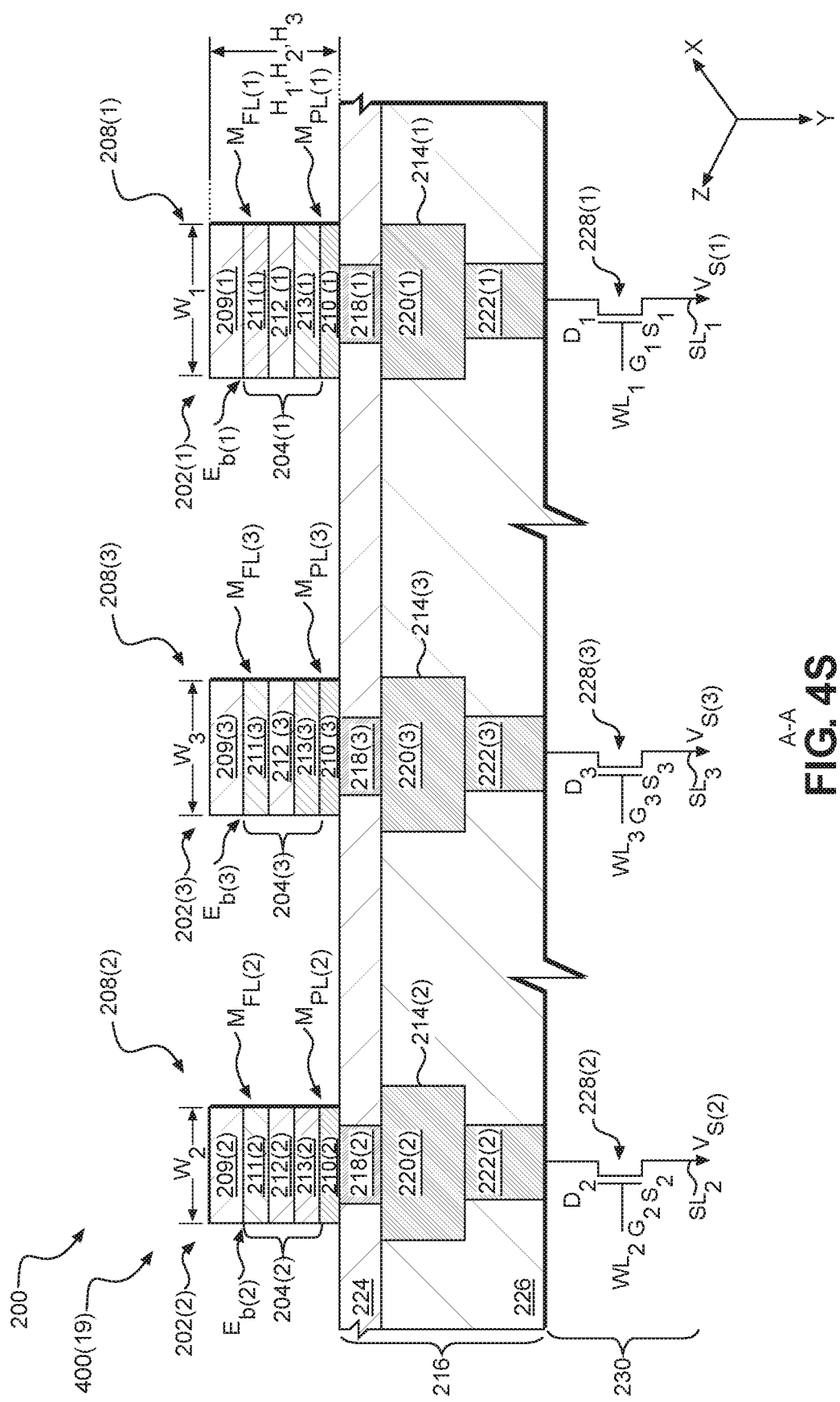

FIGS. 4R-4S illustrate cross-sectional views of additional fabrication stages 400(18), 400(19) of forming each MTJ stack 204(1)-204(3) such that each MTJ stack 204(1)-204(3) has an energy barrier $E_{b(1)}$-$E_{b(3)}$ different from the energy barrier $E_{b(1)}$-$E_{b(3)}$ of another MTJ stack 204(1)-204(3). In this regard, forming each MTJ stack 204(1)-204(3) includes depositing a fourth photoresist mask 438(4) in the Y-axis direction to selectively expose portions of each top electrode film 433(1)-433(3). By selectively exposing a portion of each top electrode film 433(1)-433(3), portions of each top electrode film 433(1)-433(3) and each MTJ stack film 436(1)-436(3) of each MRAM array 208(1)-208(3) can be selectively removed. Similarly, portions of the bottom electrode film 434 can be selectively removed to form bottom electrode layers 210(1)-210(3). In this manner, the widths $W_1$-$W_3$ of each MTJ stack film 436(1)-436(3) can be controlled to form each MTJ stack 204(1)-204(3) with an energy barrier $E_{b(1)}$-$E_{b(3)}$ different from the energy barrier $E_{b(1)}$-$E_{b(3)}$ of another MTJ stack 204(1)-204(3). FIG. 4S illustrates removing the fourth photoresist mask 438(4) to form first, second, and third MTJs 202(1)-202(3) having first, second, and third MTJ stacks 204(1)-204(3) including varying materials and/or widths to vary energy barriers $E_{b(1)}$-$E_{b(3)}$ of the MTJ stacks 204(1)-204(3), as provided in FIG. 2B. By forming the first, second, and third MTJs 202(1)-202(3) in this manner, the MTJs 202(1)-202(3) and access transistors 228(1)-228(3) provided in FIG. 2B can be implemented in various MRAM bit cell devices in different MRAM arrays 208(1)-208(3) to provide different types of memory in the same semiconductor die 200 while still achieving distinct performance specifications.

Figure 5C:
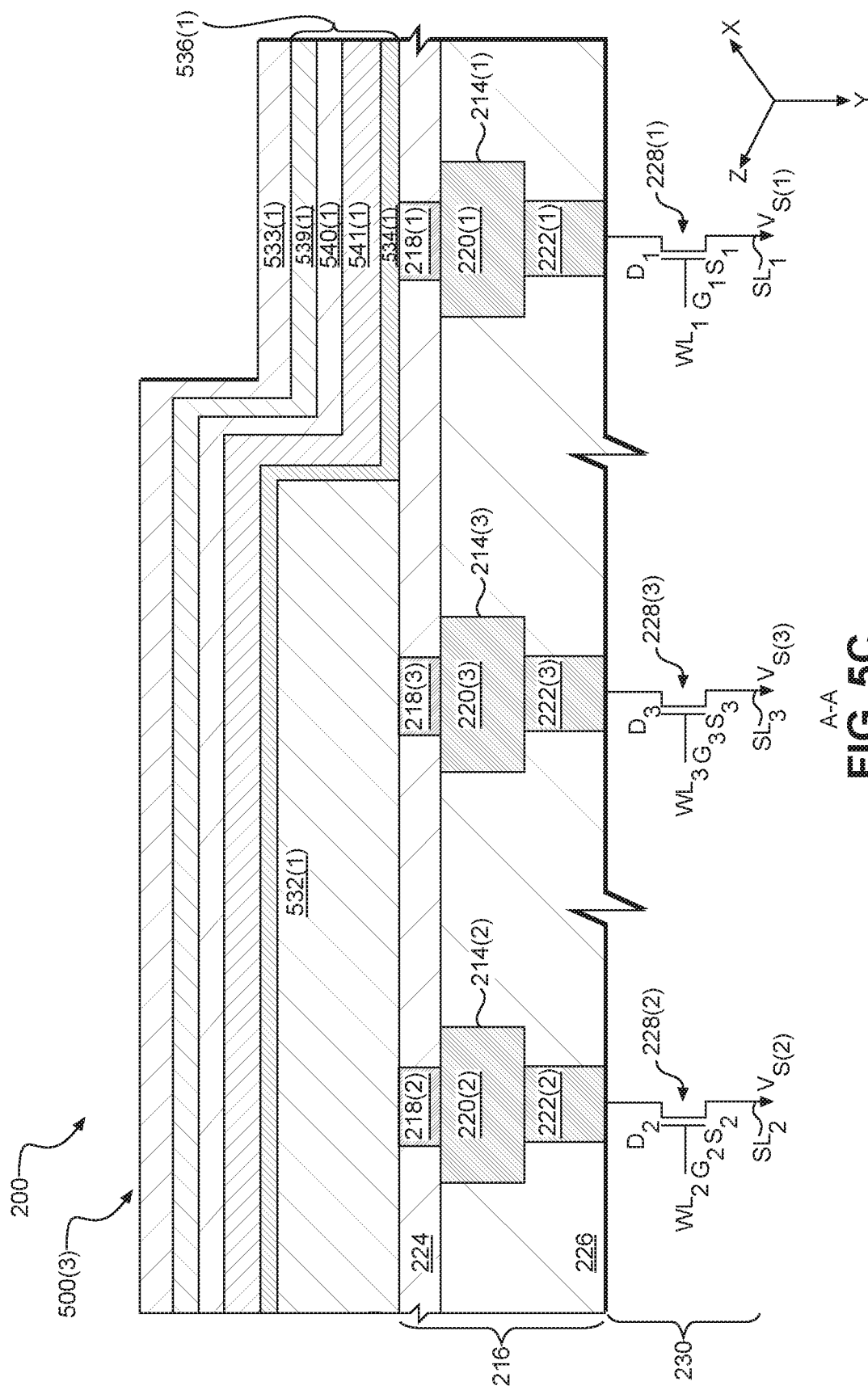
FIGS. 5A-5R are cross-sectional diagrams illustrating alternative exemplary process steps of fabricating the multiple MTJ stacks for use in MRAM bit cells in a plurality of MRAM bit cells in different MRAM arrays in a semiconductor die having varying energy barriers as shown in FIG. 2B.
Figure 5D:
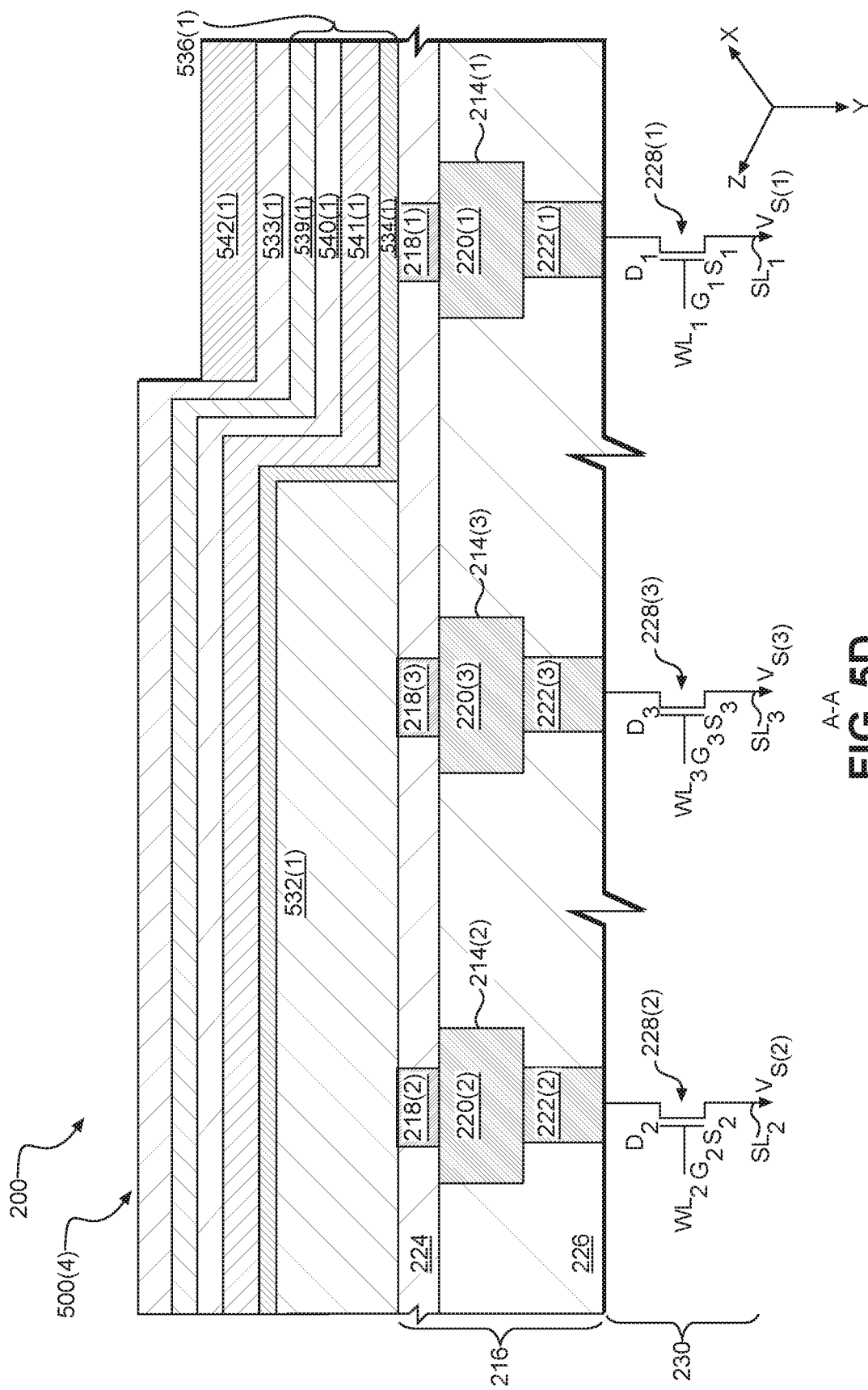
Figure 5E:
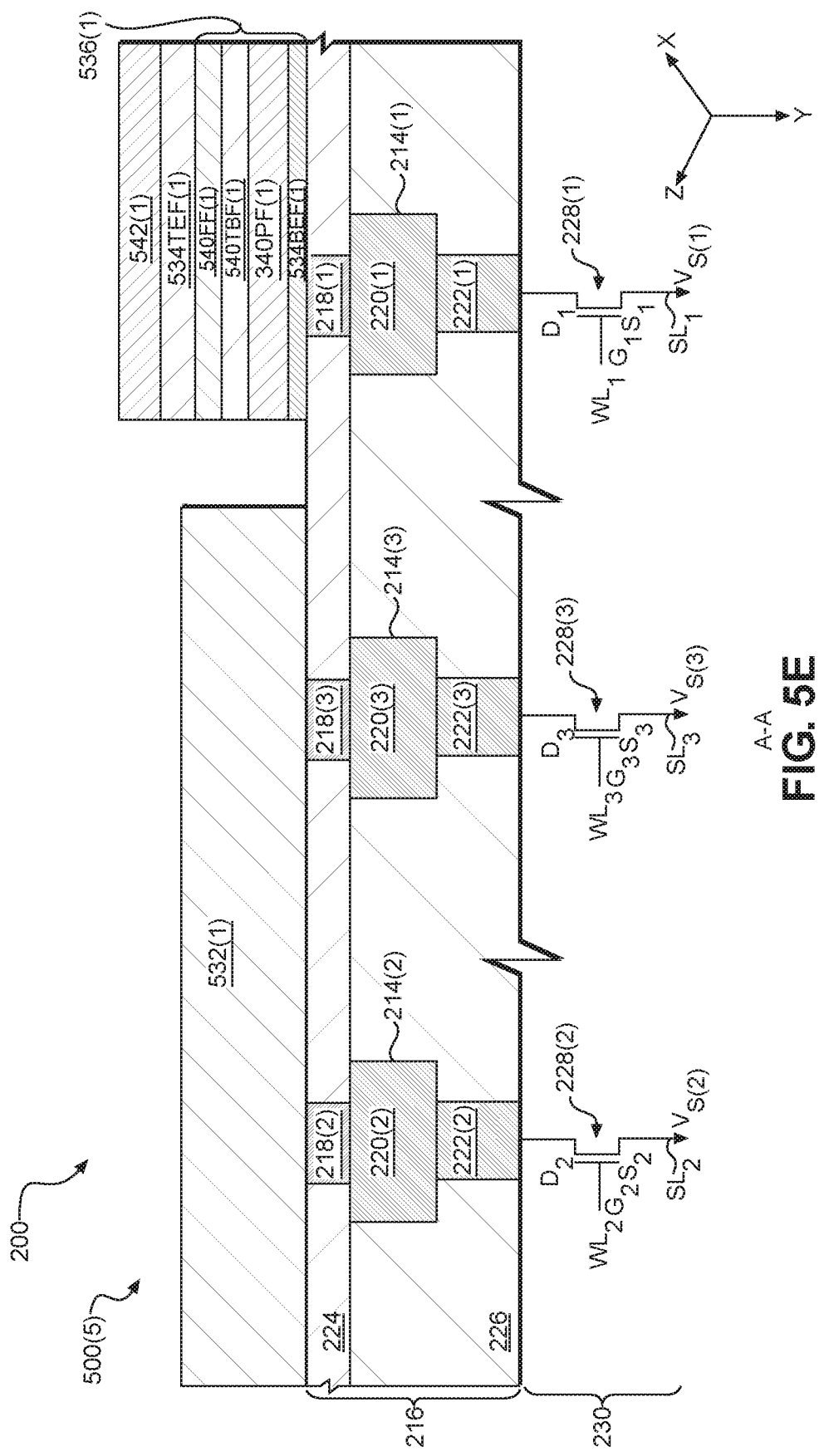
Figure 5F:
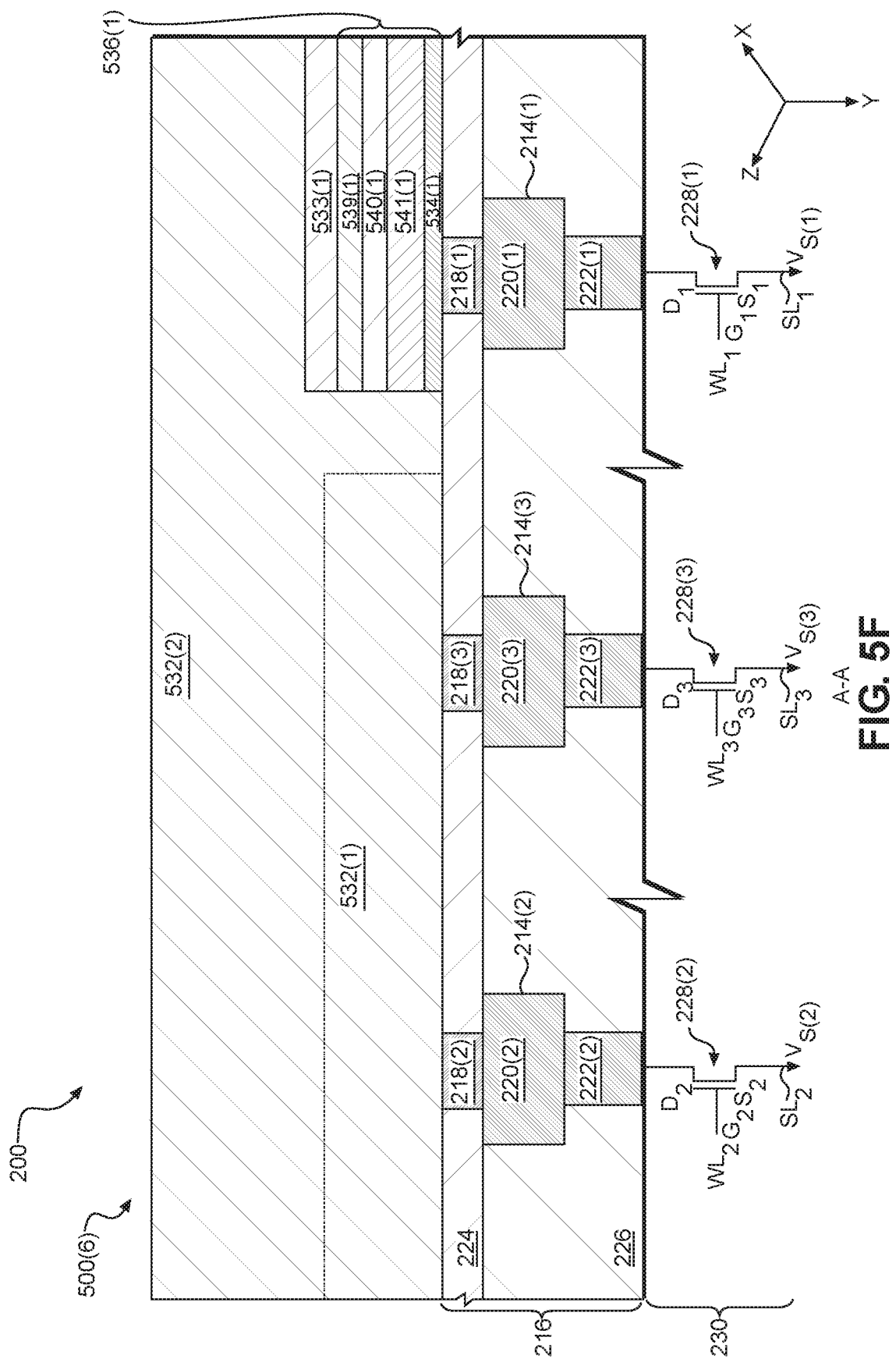
Figure 5G:
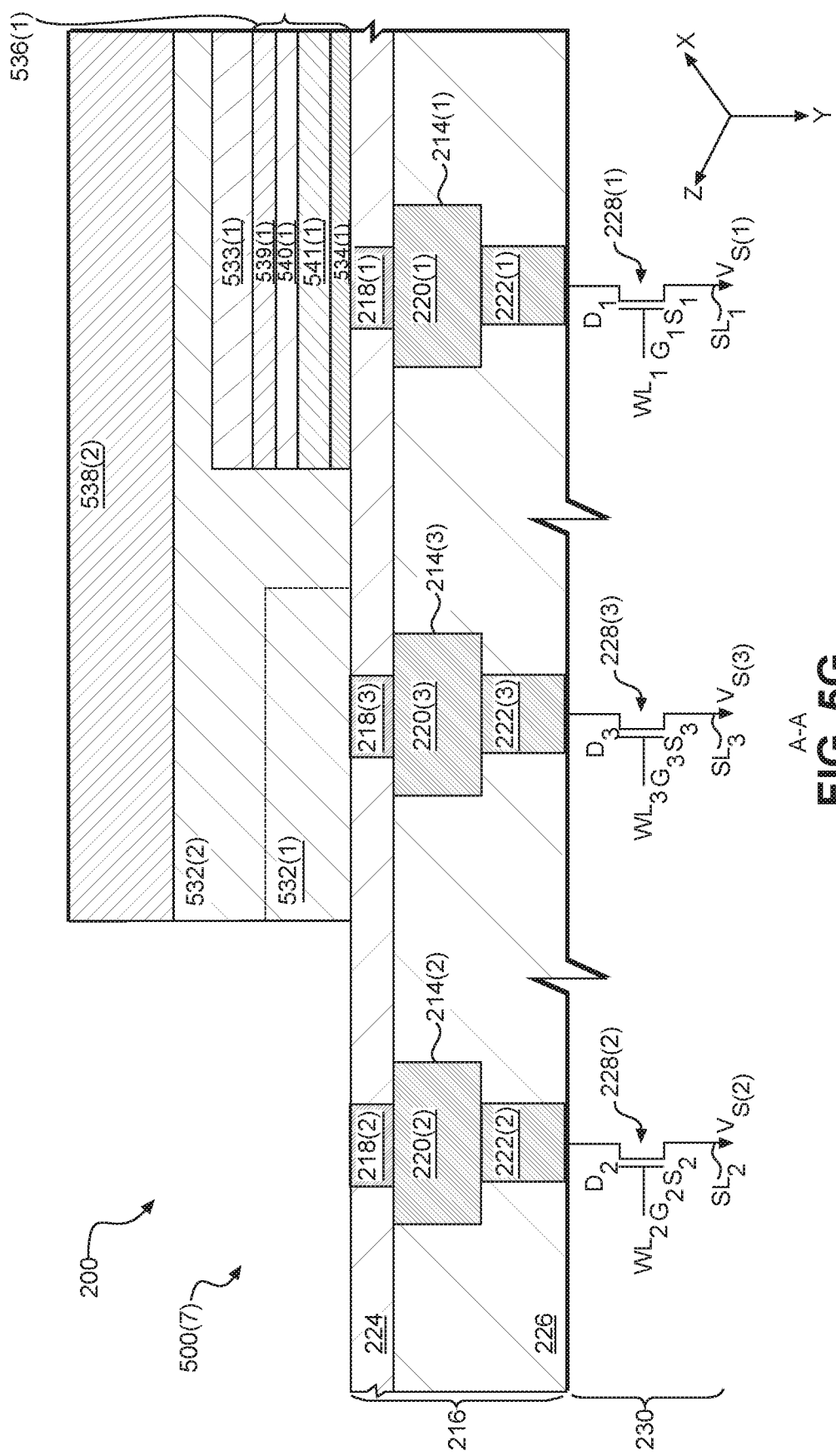
Figure 5I:
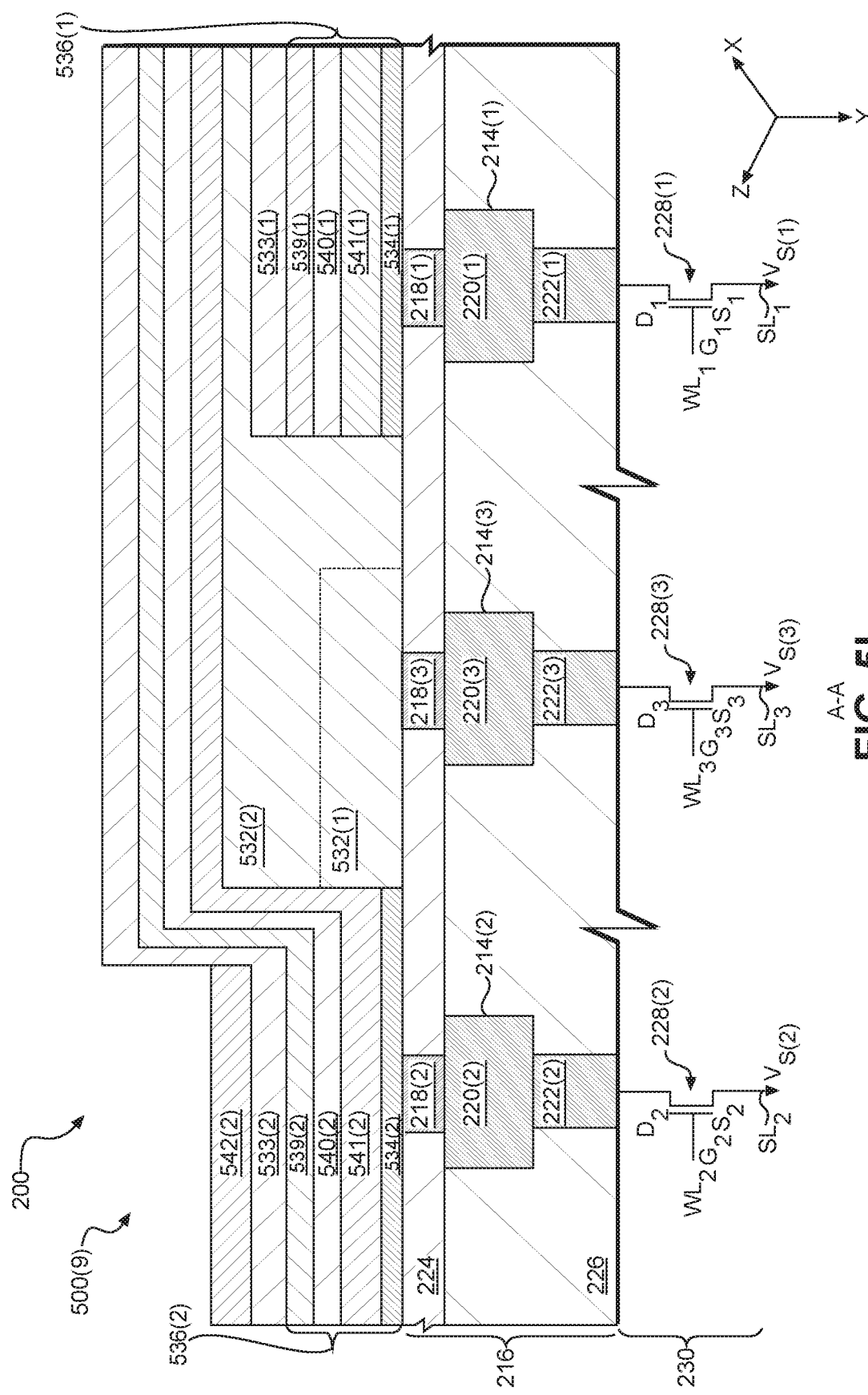
Figure 5J:
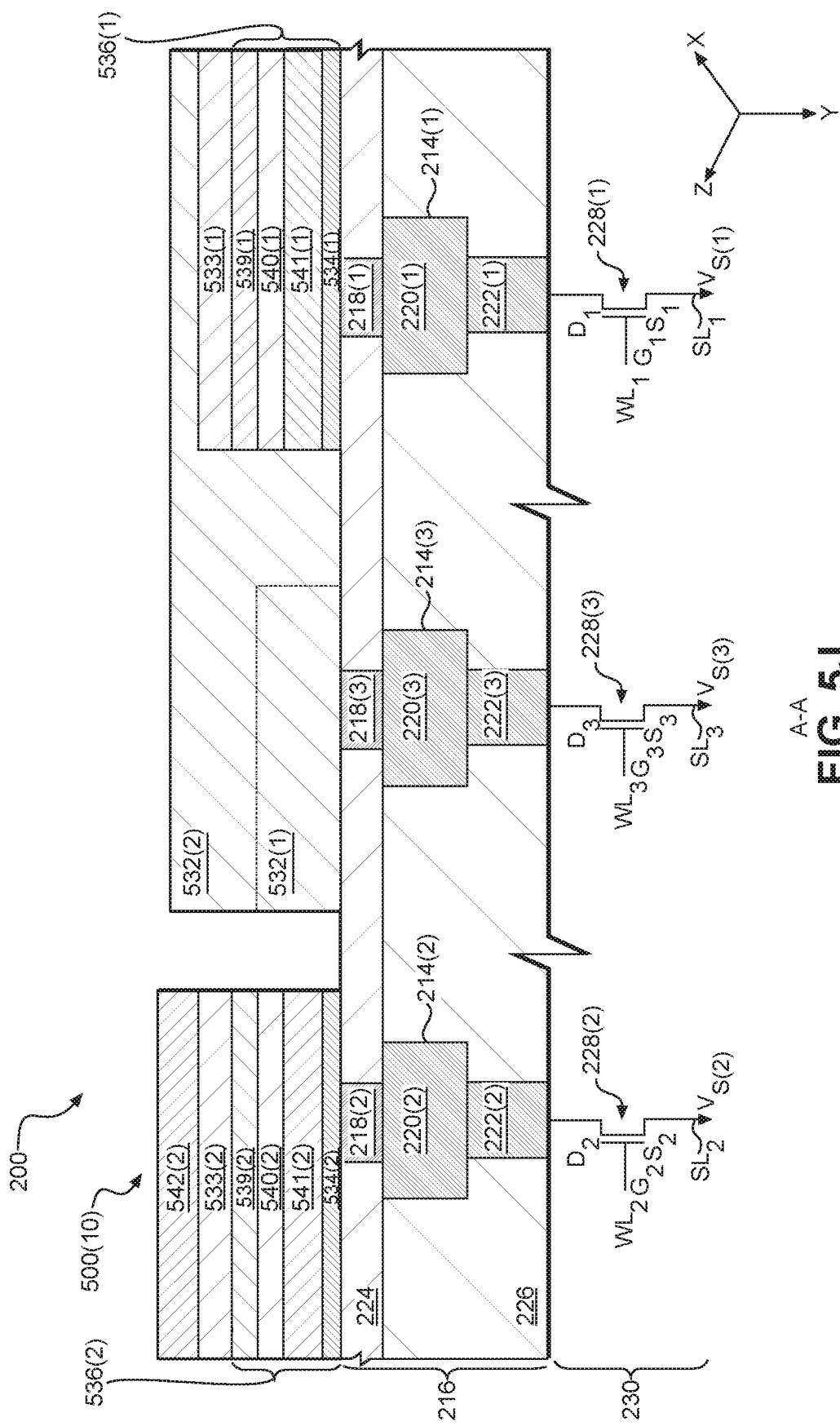
Figure 5K:
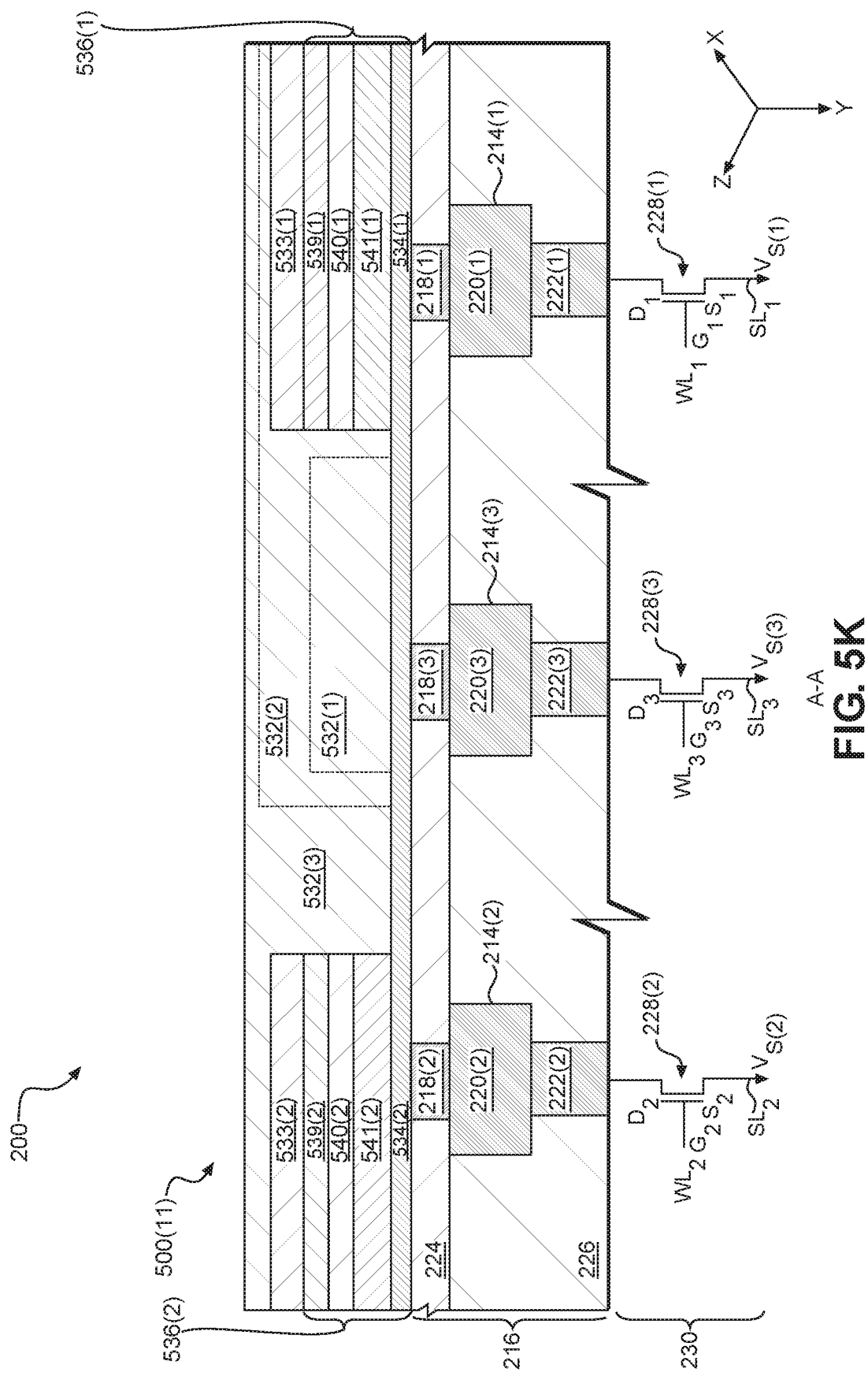
Figure 5L:
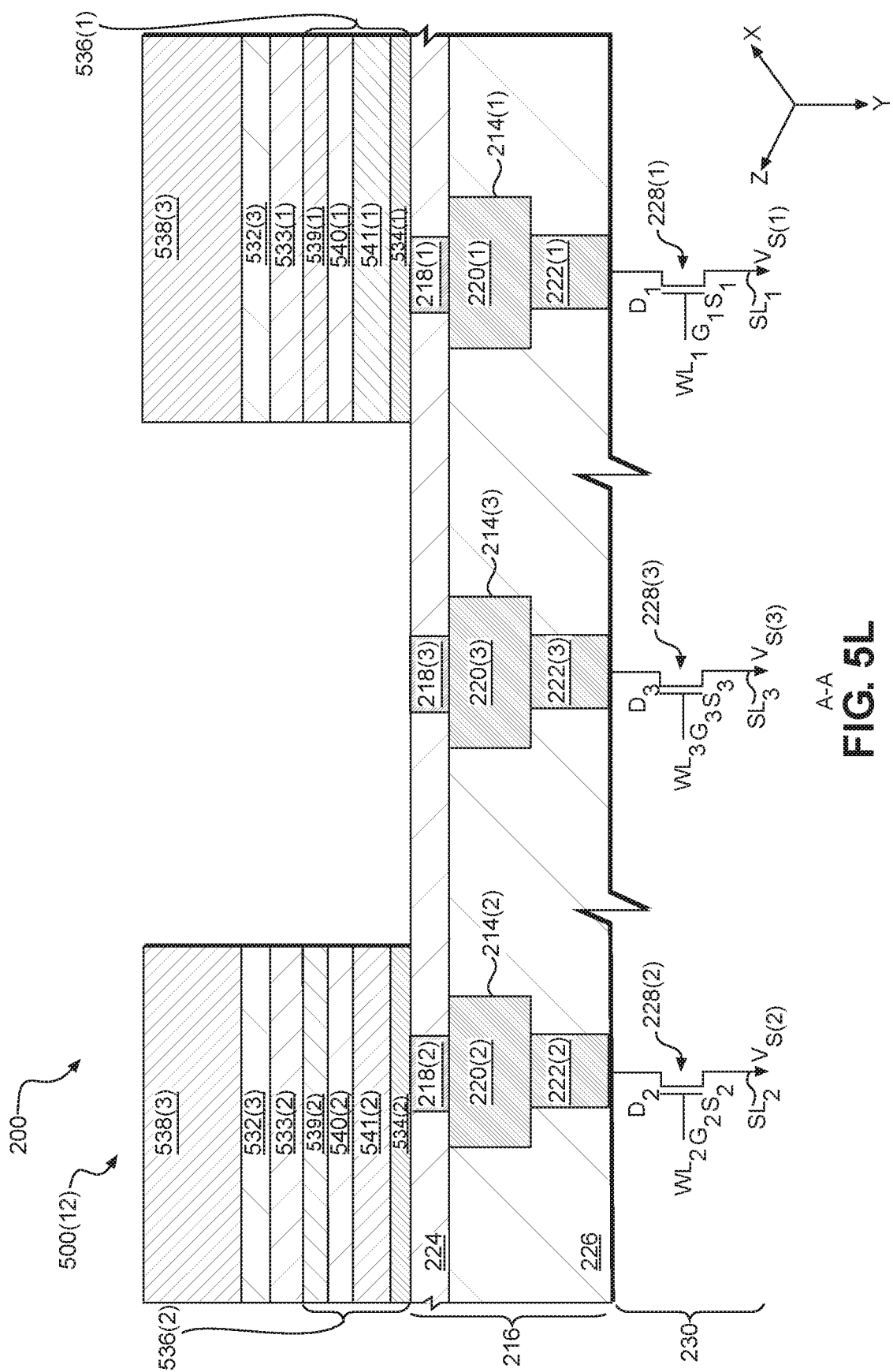
Figure 5N:
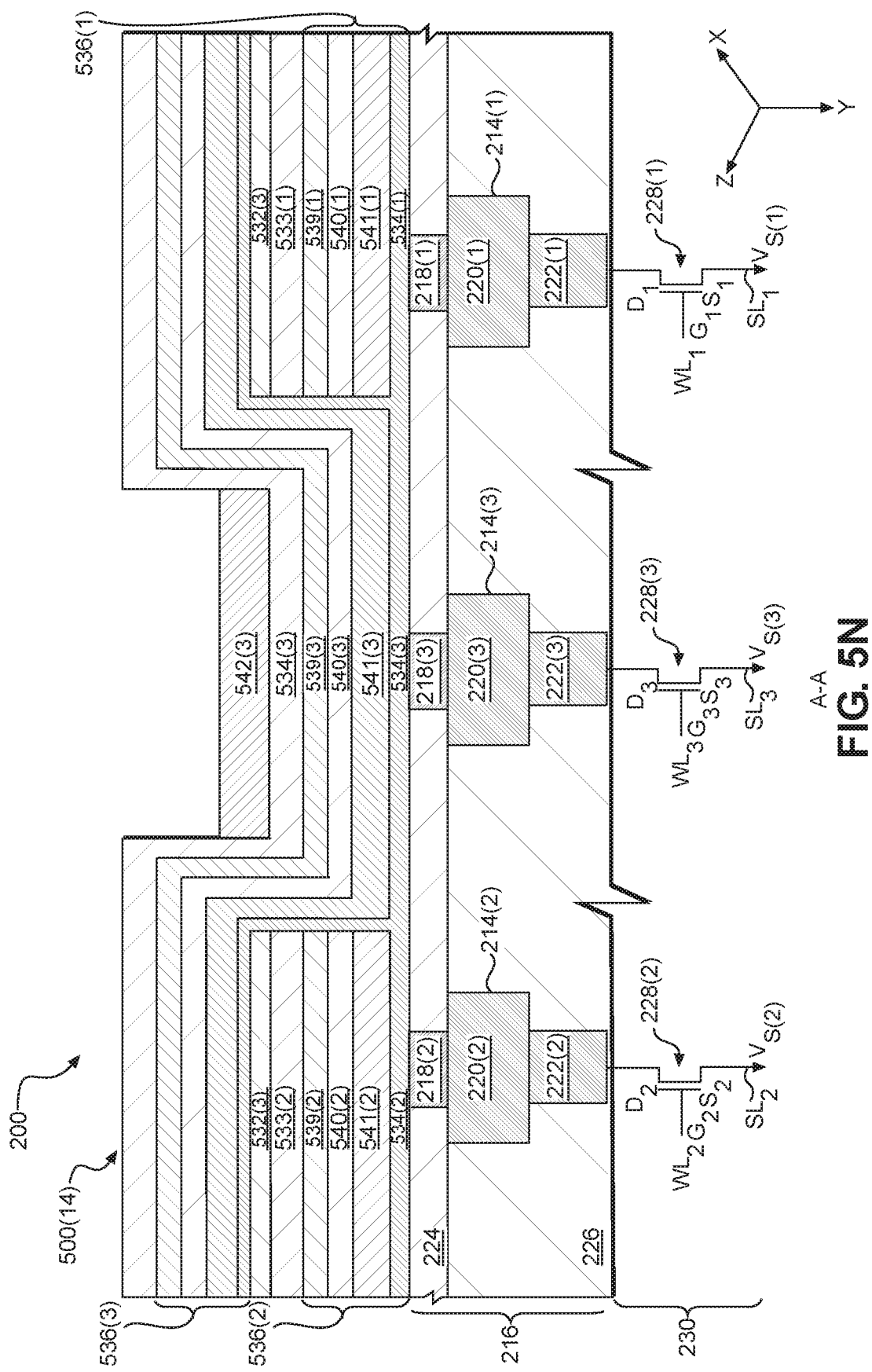
Figure 50:
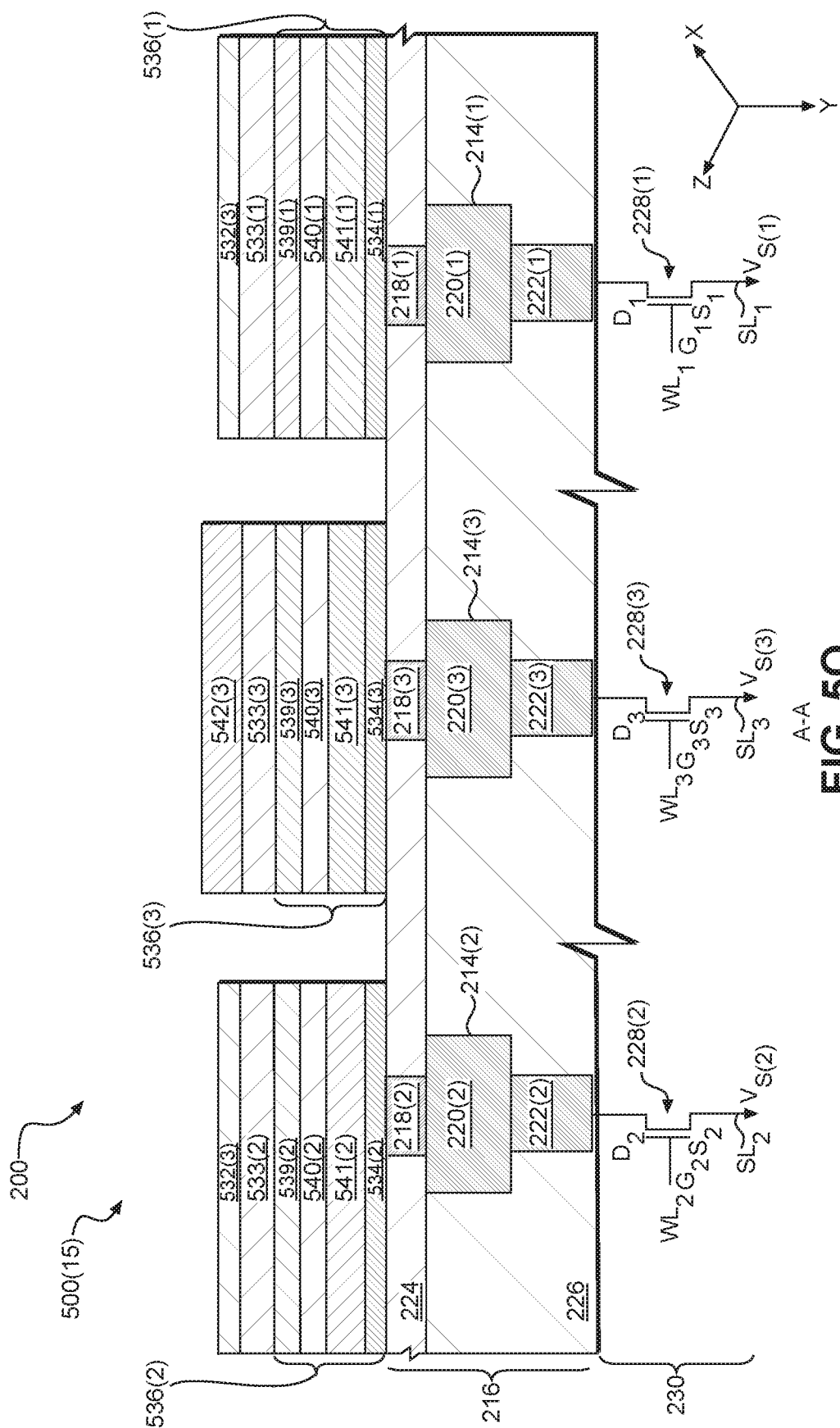
Figure 5P:
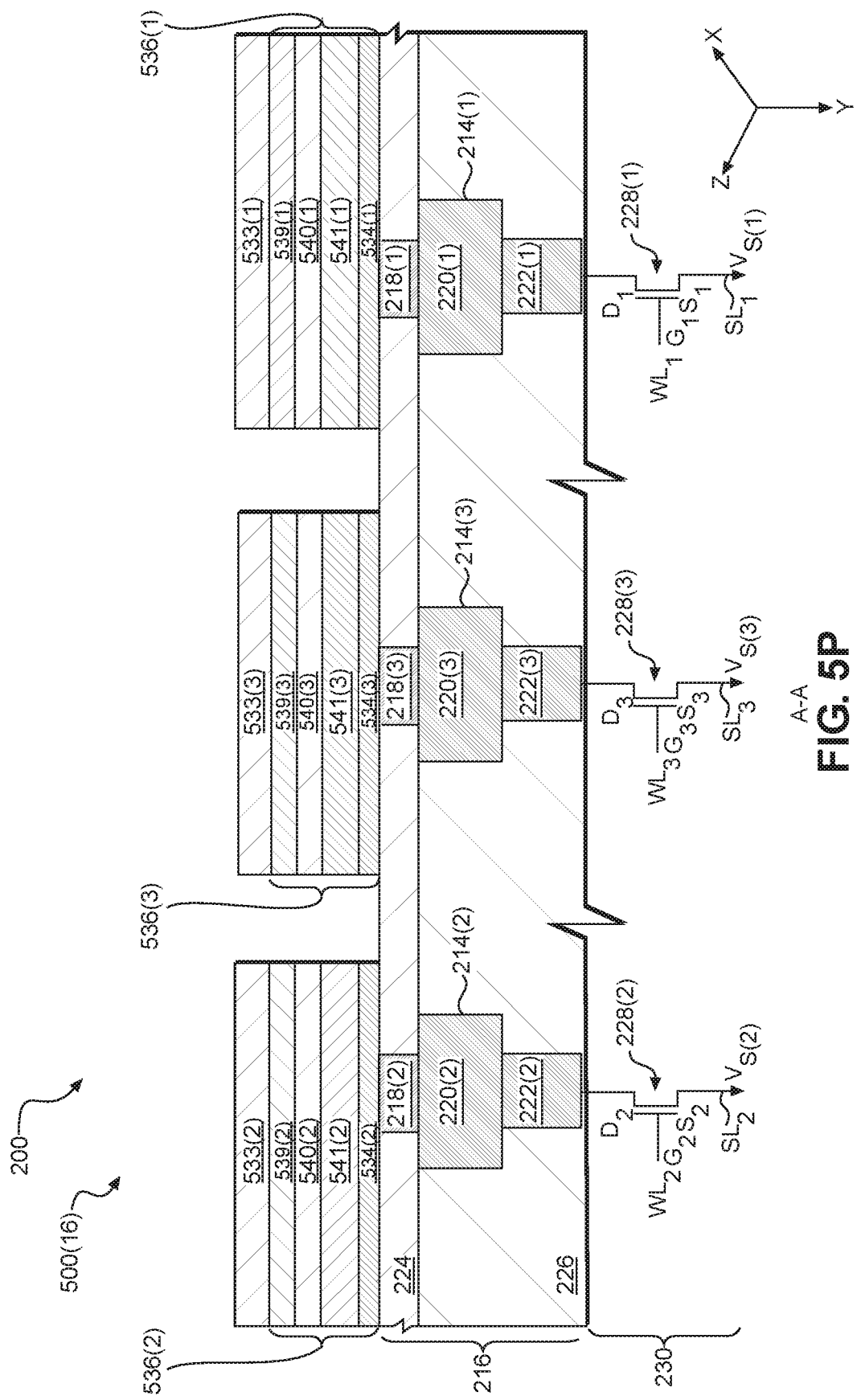
Figure 5Q:
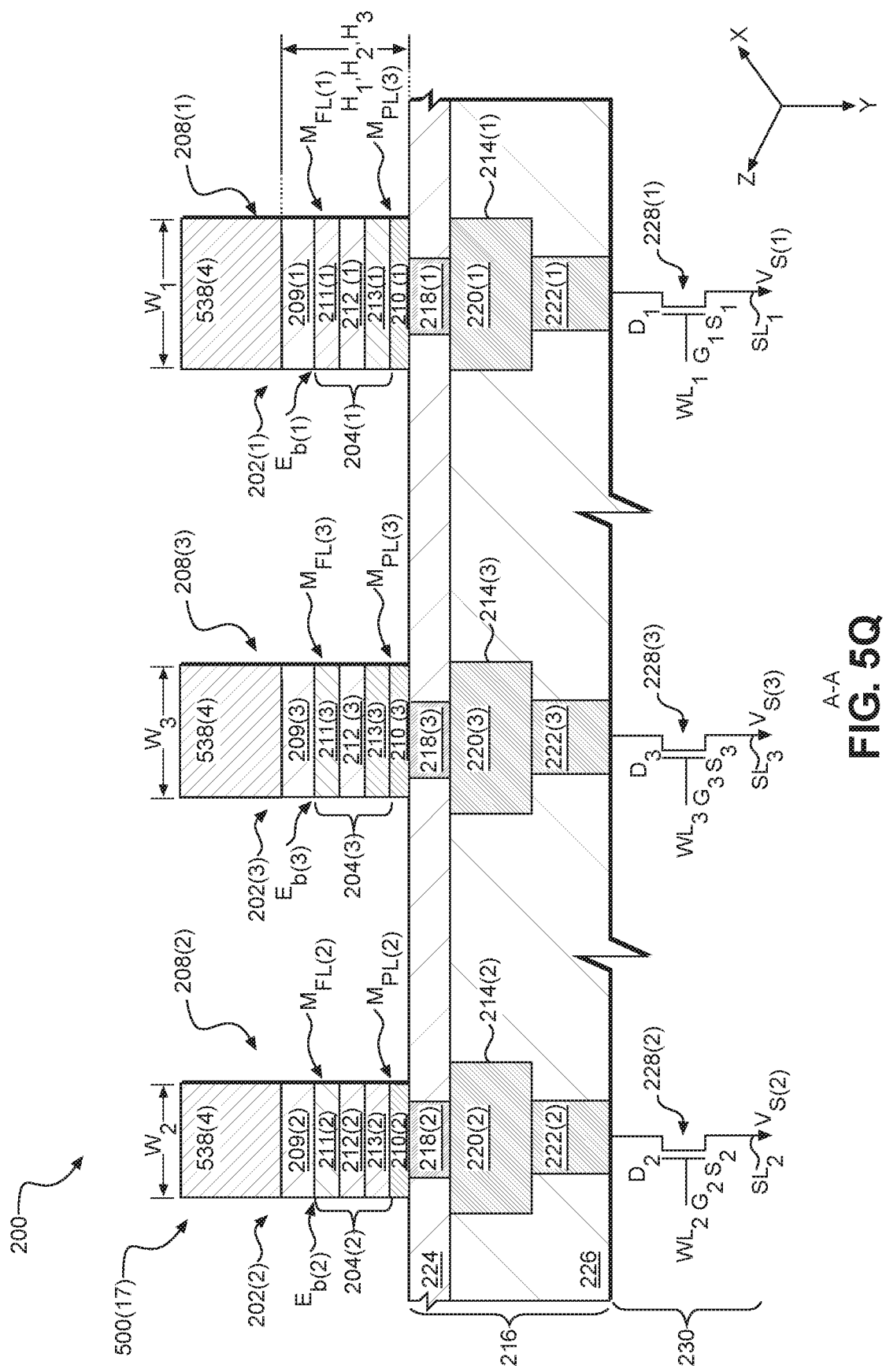
Figure 5R:
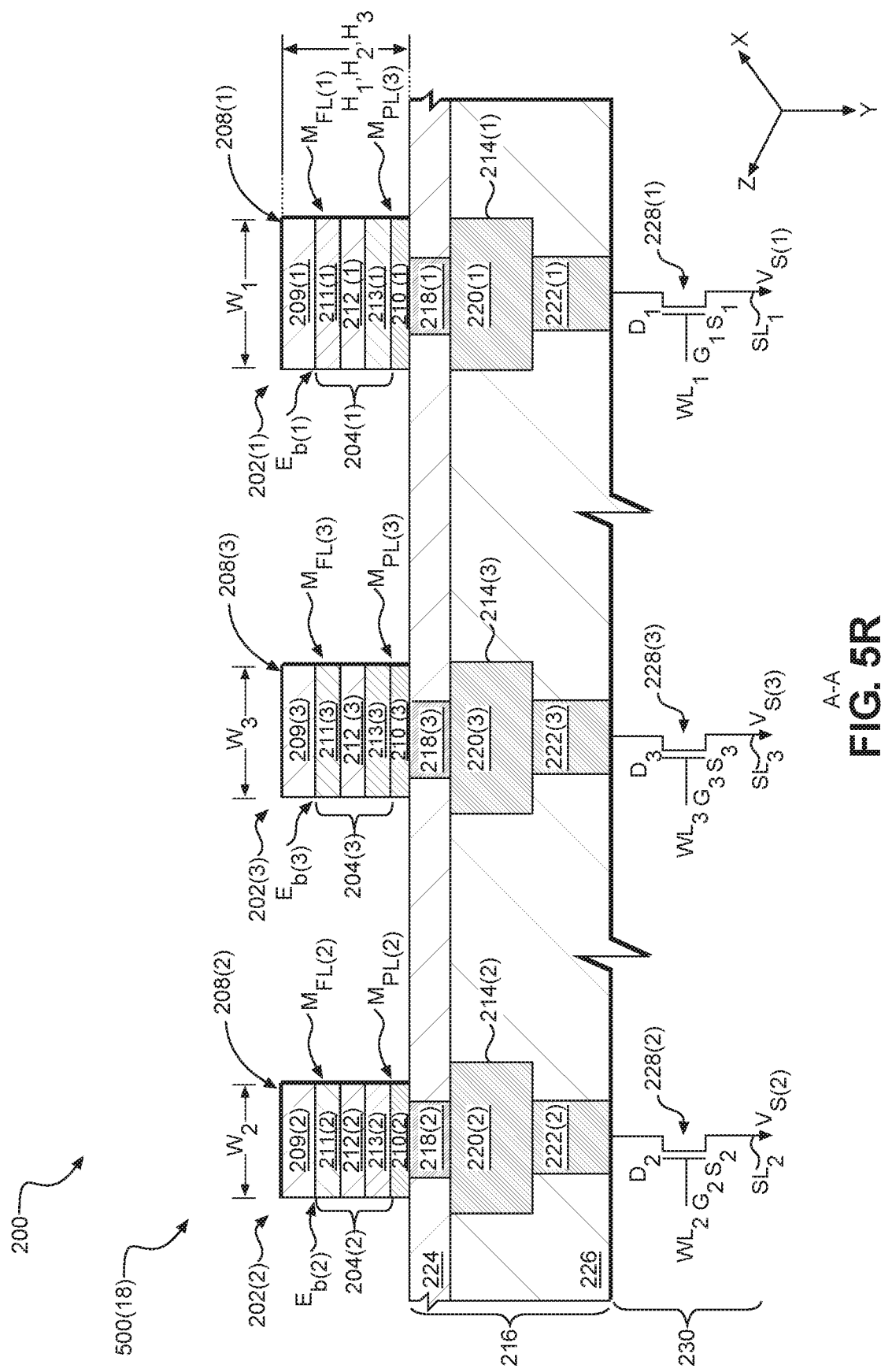

FIGS. 5A-5R illustrate an alternative method of fabricating the MTJs 202(1)-202(3) having MTJ stacks 204(1)-204(3) including varying materials and/or widths to vary energy barriers $E_{b(1)}$-$E_{b(3)}$ of the MTJ stacks 204(1)-204(3), as provided in FIG. 2B. The fabrication method illustrated in FIGS. 5A-5R is different from the fabrication method illustrated in FIGS. 4A-4S in that a bottom electrode film 534(1)-534(3) is included in each MTJ stack film 536(1)-536(3) in FIGS. 5A-5R. In contrast, the bottom electrode film 434 in FIGS. 4A-4S is included in the interconnect layer 216 and selectively removed after depositing each MTJ stack film 436(1)-436(3) to form each bottom electrode layer 210(1)-210(3). Thus, the alternative method of fabricating the MTJs 202(1)-202(3) illustrated in FIGS. 5A-5R is distinguished from the fabrication method illustrated in FIGS. 4A-4S by the manner in which the bottom electrode film 534(1)-534(3) is deposited.

FIGS. 5A-5B illustrate cross-sectional views of first and second fabrication stages 500(1), 500(2) of fabricating a first blocking layer 532(1) (shown in FIG. 5B) in the Y-axis direction over the second bottom interconnect 214(2) of the second MRAM array 208(2). FIGS. 5A and 5B illustrate forming the first blocking layer 532(1) over the second bottom interconnect 214(2) of the second MRAM array 208(2) and the third bottom interconnect 214(3) of the third MRAM array 208(3). In this example, a first photoresist mask 538(1) is used to form the first blocking layer 532(1). In this manner, the first blocking layer 532(1) is formed over the second bottom interconnect 214(2) of the second MRAM array 208(2) and the third bottom interconnect 214(3) of the third MRAM array 208(3).

FIG. 5C illustrates a cross-sectional view of a third fabrication stage 500(3) of depositing the first MTJ stack film 536(1) in the Y-axis direction over the first bottom interconnect 214(1) of the first MRAM array 208(1) and at least a portion of the first blocking layer 532(1). The third fabrication stage 500(3) in FIG. 5C further illustrates depositing a first top electrode film 533(1) over the first MTJ stack film 536(1). As shown in FIG. 5C, depositing the first MTJ stack film 536(1) includes depositing a first bottom electrode film 534(1), a first free film 539(1), a first tunnel barrier film 540(1), and a first pinned film 541(1). In this example, the first MTJ stack film 536(1) is deposited conformally over the interconnect layer 216 in the first MRAM array 208(1) and over the first blocking layer 532(1) in the second MRAM array 208(2) and the third MRAM array 208(3). The first MTJ stack film 536(1) can be formed by a process such as PVD and can comprise materials such as Ta/TaN, Co, Pt, PtMn, CoFe, CoFeB, MgO, Ru, and/or HfIr, Ta, TbCoFe, TbWFe, as non-limiting examples. Additionally, the first top electrode film 533(1) can be formed by a process such as PVD, and can comprise materials such as Ta, TaN, Ru, Ti, TiN, and/or W, as non-limiting examples. The first bottom electrode film 534(1) can be formed by a process such as PVD, and can comprise materials such as Ta, TaN, Ti/TiN, W, Ru, PtMn, and/or Co/Pt, as non-limiting examples.

FIG. 5D illustrates a cross-sectional view of a fourth fabrication stage 500(4) of depositing a first mask, which is first hard mask 542(1) in this example, in the Y-axis direction over a portion of the first top electrode film 533(1). As shown in FIG. 5D, the first hard mask 542(1) is deposited over the portion of the first top electrode film 533(1) over the first MTJ stack film 536(1) over the first bottom interconnect 214(1). In this manner, the first hard mask 542(1) covers the portion of the first top electrode film 533(1) above the first bottom interconnect 214(1), protecting a portion of the first top electrode film 533(1) and a portion of the first MTJ stack film 536(1) thereunder from etching, as will be discussed in further detail below. The first hard mask 542(1) can be deposited using processes such as CVD and PVD, and can comprise materials such as SiO2, SiNx, SiCN, SiON, and/or SiCON, as non-limiting examples.

FIG. 5E illustrates a cross-sectional view of a fifth fabrication stage 500(5) of removing a portion of the first top electrode film 533(1) and a portion of the first MTJ stack film 536(1) not under the first hard mask 542(1). In this regard, a portion of the first top electrode film 533(1) and a portion of the first MTJ stack film 536(1) not covered by the first hard mask 542(1) are removed. The first blocking layer 532(1) is not removed as it is used in this example to cover and protect the second bottom interconnect 214(2) and the third bottom interconnect 214(3). In this example, removal may include processes such as etching, ion miller physical etching, plasma chemical etching, and/or cleaning processes, as non-limiting examples. Etchants may include CF4, C12SF6, C4F8, and/or CHF3, as non-limiting examples.

FIGS. 5F-5G illustrate cross-sectional views of sixth and seventh fabrication stages 500(6), 500(7) of removing at least a portion of the first blocking layer 532(1) over the second bottom interconnect 214(2) of the second MRAM array 208(2). In this regard, FIG. 5F illustrates removing the first hard mask 542(1) and forming a second blocking layer 532(2) over the second bottom interconnect 214(2), the third bottom interconnect 214(3), and the first top electrode film 533(1). In this example, the second blocking layer 532(2) is formed in the Y-axis direction over the first blocking layer 532(1) and the first top electrode film 533(1) to protect a portion of the first top electrode film 533(1) and a portion of the first MTJ stack film 536(1) thereunder from etching, as will be discussed in further detail below. FIG. 5G illustrates removing a portion of the first blocking layer 532(1) and a portion of the second blocking layer 532(2) to expose the second bottom interconnect 214(2) of the second MRAM array 208(2). In this example, a second photoresist mask 538(2) is used to expose the portion of the first blocking layer 532(1) to be removed. In this manner, a second MTJ stack film 536(2) shown in a later step may be deposited above the exposed second bottom interconnect 214(2). In alternative methods, instead of forming the second blocking layer 532(2) over the first blocking layer 532(1), the first blocking layer 532(1) can be removed and the second blocking layer 532(2) can be deposited thereafter. However, this alternative method may not be desirable because removing the first blocking layer 532(1) may damage the interconnect layer 216 through mechanisms such as oxidative damage. The second photoresist mask 538(2) can be deposited using a process such as spin coating, as a non-limiting example.

FIG. 5H illustrates a cross-sectional view of an eighth fabrication stage 500(8) of depositing a second MTJ stack film 536(2) in the Y-axis direction over the second bottom interconnect 214(2) of the second MRAM array 208(2) and at least a portion of the second blocking layer 532(2). Further, FIG. 5H illustrates depositing a second top electrode film 533(2) over the second MTJ stack film 536(2). As shown in FIG. 5H, depositing the second MTJ stack film 536(2) includes depositing a second bottom electrode film 534(2), a second free film 539(2), a second tunnel barrier film 540(2), and a second pinned film 541(2). In this example, the second MTJ stack film 536(2) is deposited conformally over the interconnect layer 216 in the second MRAM array 208(2) and over the second blocking layer 532(2) in the first MRAM array 208(1) and the third MRAM array 208(3). The second MTJ stack film 536(2) can be formed by a process such as PVD and can comprise materials such as Ta/TaN, Co, Pt, PtMn, CoFe, CoFeB, MgO, Ru, HfIr, and/or Ta, as non-limiting examples. The second top electrode film 533(2) can be formed by a process such as PVD and can comprise materials such as Ta, TaN, Ru, Ti, TiN, and/or W, as non-limiting examples. The second bottom electrode film 534(2) can be formed by a process such as PVD and can comprise materials such as Ta, TaN, Ti/TiN, W, Ru, PtMn, and/or Co/Pt, as non-limiting examples.

FIG. 5I illustrates a cross-sectional view of a ninth fabrication stage 500(9) of depositing the second mask, which is second hard mask 542(2) in this example, in the Y-axis direction over a portion of the second top electrode film 533(2). As shown in FIG. 5I, the second hard mask 542(2) is deposited over the portion of the second top electrode film 533(2) over the second MTJ stack film 536(2) over the second bottom interconnect 214(2). In this manner, the second hard mask 542(2) covers the portion of the second top electrode film 533(2) above the second bottom interconnect 214(2), protecting the portion of the second top electrode film 533(2) and a portion of the second MTJ stack film 536(2) thereunder from etching, as will be discussed in further detail below. The second hard mask 542(2) can be deposited using processes such as CVD and PVD, and can comprise materials such as SiO2, SiNx, SiON, SiCON, and/or SiCN, as non-limiting examples.

FIG. 5J illustrates a cross-sectional view of a tenth fabrication stage 500(10) of removing a portion of the second top electrode film 533(2) and a portion of the second MTJ stack film 536(2) not under the second hard mask 542(2). In this regard, a portion of the second top electrode film 533(2) and a portion of the second MTJ stack film 536(2) not covered by the second hard mask 542(2) are removed. The second blocking layer 532(2) is not removed as it is used in this example to cover and protect the first top electrode film 533(1), the first MTJ stack film 536(1), and the third bottom interconnect 214(3). In this example, removal may include processes such as etching, ion miller physical etching, plasma chemical etching, and/or cleaning processes, as non-limiting examples. Etchants may include CF4, Cl2SF6, C4F8, and/or CHF3, as non-limiting examples.

FIGS. 5K-5L illustrate cross-sectional views of eleventh and twelfth fabrication stages 500(11), 500(12) of depositing a third blocking layer 532(3) in the Y-axis direction and removing at least a portion of the third blocking layer 532(3) over the third bottom interconnect 214(3) of the third MRAM array 208(3). In this regard, FIG. 5K illustrates removing the second hard mask 542(2) and forming the third blocking layer 532(3) over the third bottom interconnect 214(3), the second top electrode film 533(2), and the first top electrode film 533(1). In this example, the third blocking layer 532(3) is formed over the first top electrode film 533(1) and the second top electrode film 533(2) to protect portions of the first and second MTJ stack films 536(1), 536(2) below each of the first and second top electrode films 533(1), 533(2) from etching, as will be discussed in greater detail below. The third blocking layer 532(3) is also formed over the second blocking layer 532(2) to form the third blocking layer 532(3) without potentially damaging the interconnect layer 216, as similarly discussed above. FIG. 5L illustrates removing a portion of the third blocking layer 532(3) to expose the third bottom interconnect 214(3) of the third MRAM array 208(3). In this example, a third photoresist mask 538(3) is used to expose the portion of the third blocking layer 532(3) to be removed. In this manner, the third blocking layer 532(3) can cover the first top electrode film 533(1) and the second top electrode film 533(2) so that a third MTJ stack film 536(3) can be deposited above the exposed third bottom interconnect 214(3) without being deposited directly above the first and second top electrode films 533(1), 533(2). The third photoresist mask 538(3) can be deposited using processes such as spin coating and baking at high temperatures, such as temperatures between approximately 100-250° C., as non-limiting examples.

FIG. 5M illustrates a cross-sectional view of a thirteenth fabrication stage 500(13) of depositing the third MTJ stack film 536(3) in the Y-axis direction over the third bottom interconnect 214(3) of the third MRAM array 208(3). Further, FIG. 5M illustrates depositing a third top electrode film 533(3) over the third MTJ stack film 536(3). As shown in FIG. 5M, depositing the third MTJ stack film 536(3) includes depositing a third bottom electrode film 534(3), a third free film 539(3), a third tunnel barrier film 540(3), and a third pinned film 541(3). In this example, the third MTJ stack film 536(3) is deposited conformally over the interconnect layer 216 in the third MRAM array 208(3) and over the third blocking layer 532(3) in the first MRAM array 208(1) and the second MRAM array 208(2). Similarly, the third top electrode film 533(3) is deposited conformally over the third MTJ stack film 536(3). The third MTJ stack film 536(3) can be formed by a process such as PVD, and can comprise materials such as Ta/TaN, Co, Pt, PtMn, CoFe, CoFeB, MgO, Ru, Ta, and/or Hflr, as non-limiting examples. The third top electrode film 533(3) can be formed by a process such as PVD and can comprise materials such as Ta, TaN, Ru, Ti, TiN, and/or W, as non-limiting examples. The third bottom electrode film 534(3) can be formed by a process such as PVD and can comprise materials such as Ta, TaN, Ti/TiN, W, Ru, PtMn, and/or Co/Pt, as non-limiting examples.

FIG. 5N illustrates a cross-sectional view of a fourteenth fabrication stage 500(14) of depositing a third mask, which is third hard mask 542(3) in this example, in the Y-axis direction over a portion of the third top electrode film 533(3). As shown in FIG. 5N, the third hard mask 542(3) is deposited over the portion of the third top electrode film 533(3) over the third MTJ stack film 536(3) over the third bottom interconnect 214(3). In this manner, the third hard mask 542(3) covers the portion of the third top electrode film 533(3) above the third bottom interconnect 214(3), protecting the portion of the third top electrode film 533(3) and a portion of the third MTJ stack film 536(3) thereunder from etching, as will be discussed in further detail below. The third hard mask 542(3) can be deposited using processes such as CVD or PVD and can comprise materials such as SiO2, SiNx, SiON, SiCON, and/or SiCN, as non-limiting examples.

FIG. 5O illustrates a cross-sectional view of a fifteenth fabrication stage 500(15) of removing a portion of the third top electrode film 533(3) and a portion of the third MTJ stack film 536(3) not under the third hard mask 542(3). In this regard, a portion of the third top electrode film 533(3) and a portion of the third MTJ stack film 536(3) not covered by the third hard mask 542(3) are removed. The third blocking layer 532(3) covers and protects the first top electrode film 533(1) and the second top electrode film 533(2) from being removed. In this manner, the integrity of the first and second top electrode films 533(1), 533(2), as well as the first and second MTJ stack films 536(1), 536(2) thereunder, can be maintained so that each MTJ stack film 536(1), 536(2) and each top electrode film 533(1), 533(2) can later be formed into the first MTJ 202(1) and the second MTJ 202(2). In this example, removal may include processes such as etching, ion miller physical etching, plasma chemical etching, and/or cleaning processes, as non-limiting examples. Etchants may include CF4, Cl2SF6, C4F8, and/or CHF3, as non-limiting examples.

FIG. 5P illustrates a cross-sectional view of a sixteenth fabrication stage 500(16) of removing the third hard mask 542(3) and the third blocking layer 532(3). In this regard, the third hard mask 542(3) may be removed through processes including wet etching, dry etching, and/or cleaning processes, as non-limiting examples. The third blocking layer 532(3) may be removed through processes including wet etching, dry etching, and/or cleaning processes, as non-limiting examples. If the third hard mask 542(3) is made of the same material as the third blocking layer 532(3), the third hard mask 542(3) can be removed in a manner similar to and/or simultaneous with the removal of the third blocking layer 532(3). Where possible, this removal process can also be applied to removing any of the first, second, and third hard masks 542(1)-542(3) and the first, second, and third blocking layers 532(1)-532(3). In this example, removal may include processes such as etching, ion miller physical etching, plasma chemical etching, and/or cleaning processes, as non-limiting examples. Etchants may include CF4, Cl2SF6, C4F8, and/or CHF3, as non-limiting examples.

FIGS. 5Q-5R illustrate cross-sectional views of seventeenth and eighteenth fabrication stages 500(17), 500(18) of forming each MTJ stack 204(1)-204(3) such that each MTJ stack 204(1)-204(3) has an energy barrier $E_{b(1)}$-$E_{b(3)}$ different from the energy barrier $E_{b(1)}$-$E_{b(3)}$ of another MTJ stack 204(1)-204(3). In this regard, forming each MTJ stack 204(1)-204(3) includes depositing a fourth photoresist mask 538(4) to selectively expose portions of each top electrode film 533(1)-533(3) shown in FIG. 5P. By selectively exposing portion of each top electrode film 533(1)-533(3), portions of each top electrode film 533(1)-533(3) and each MTJ stack film 536(1)-536(3) of each MRAM array 208(1)-208(3) can be selectively removed. In this manner, the widths $W_1$-$W_3$ of each MTJ stack film 536(1)-536(3) can be controlled so as to form each MTJ stack 204(1)-204(3) with an energy barrier $E_{b(1)}$-$E_{b(3)}$ different from the energy barrier $E_{b(1)}$-$E_{b(3)}$ of another MTJ stack 204(1)-204(3). FIG. 5R illustrates removing the fourth photoresist mask 538(4) to form first, second, and third MTJs 202(1)-202(3) having first, second, and third MTJ stacks 204(1)-204(3) including varying materials and/or widths to vary energy barriers $E_{b(1)}$-$E_{b(3)}$ of the MTJ stacks 204(1)-204(3), as provided in FIG. 2B. By forming the first, second, and third MTJs 202(1)-202(3) in this manner, the MTJs 202(1)-202(3) and access transistors 228(1)-228(3) provided in FIG. 2B can be implemented in various MRAM bit cell devices in different MRAM arrays 208(1)-208(3) to provide different types of memory in the same semiconductor die 200 while still achieving distinct performance specifications.

FIGS. 6A-6C, 7A-7D, 8A-8C, and 9A-9D illustrate methods of forming MRAM bit cells having varying structures from the MTJs 202(1)-202(3) provided in FIGS. 2A and 2B. In this manner, the MTJs 202(1)-202(3) having varying energy barriers provided in FIG. 2B, and formed in exemplary fabrication processes such as FIGS. 4A-4S and 5A-5R, can be implemented in MRAM bit cells formed and provided in FIGS. 6A-6C, 7A-7D, 8A-8C, and 9A-9D in different MRAM arrays 208(1)-208(3) in the semiconductor die 200. By providing MTJs 202(1)-202(3) having varying energy barriers in MRAM bit cells in different MRAM arrays 208(1)-208(3), different types of memory can be provided in the semiconductor die 200 while still achieving distinct performance specifications, such as access times, data retention rates, bit cell endurances, array densities, and/or power consumption rates, as examples.

Figure 6A:
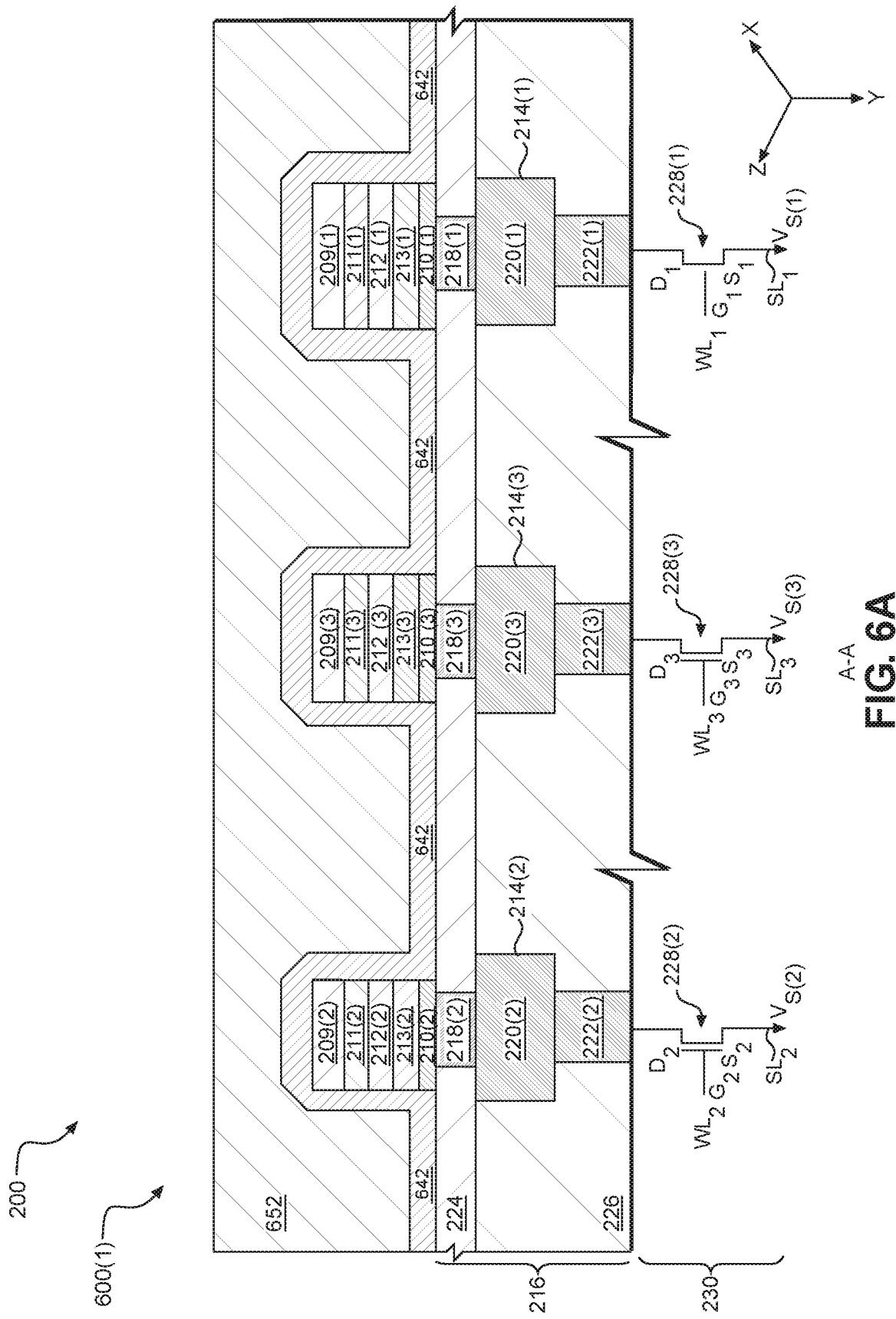
Figure 6C:
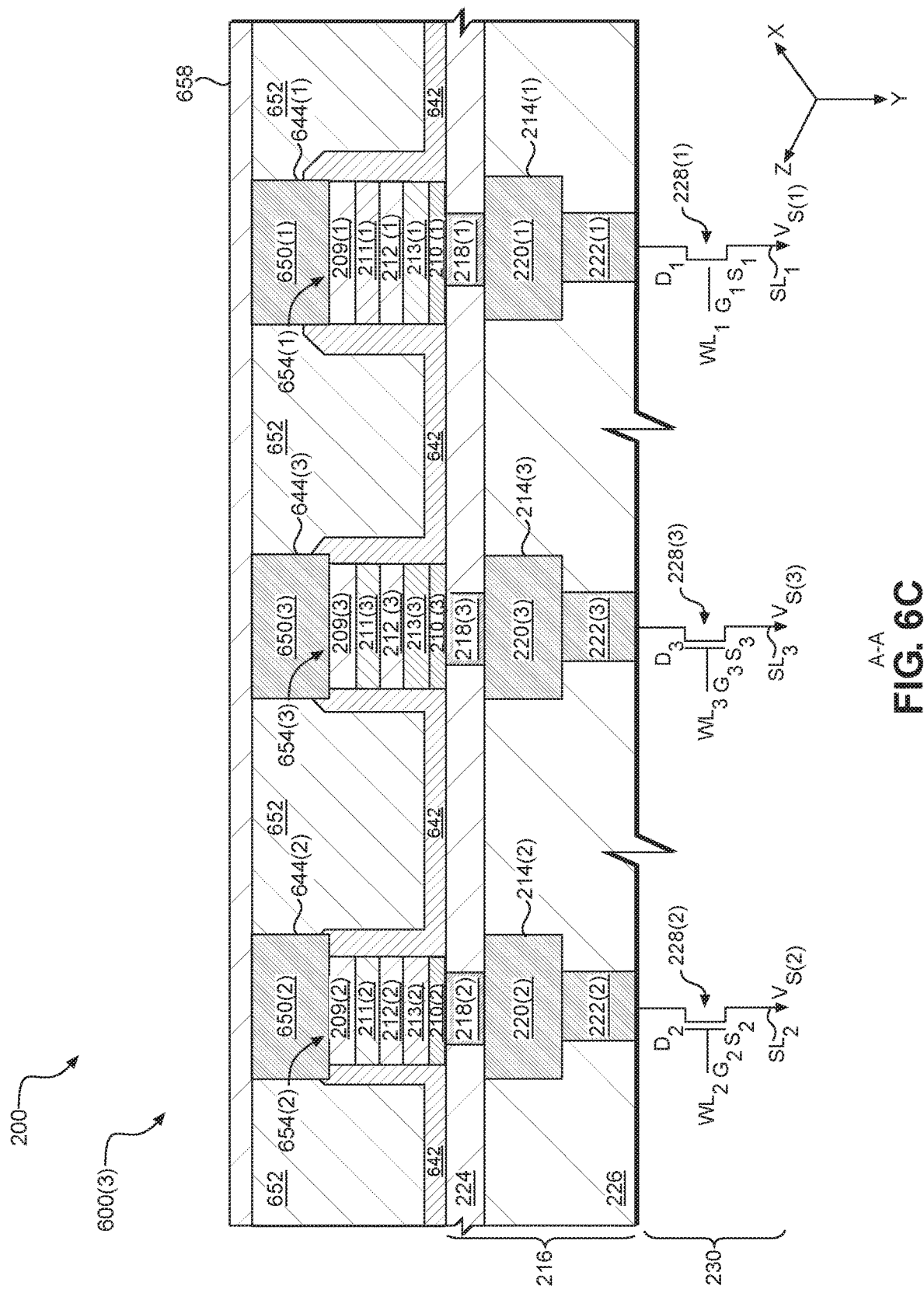

In this regard, FIGS. 6A-6C illustrate cross-sectional views at various stages of forming MRAM bit cells 201(1)-201(3) (shown in FIG. 6C) having a spacer film 642 over the interconnect layer 216 and a top metal line 650(1)-650(3) as a top interconnect 644(1)-644(3) in different MRAM arrays 208(1)-208(3) from the MTJ stacks 204(1)-204(3) having varying energy barriers $E_{b(1)}$-$E_{b(3)}$, as provided in FIG. 2B. In this regard, FIG. 6A illustrates a cross-sectional view of a first fabrication stage 600(1) of forming the spacer film 642 adjacent to each MTJ stack 204(1)-204(3). FIG. 6A further illustrates depositing a dielectric layer 652 adjacent to the spacer film 642 and over each MTJ stack 204(1)-204(3) in the Y-axis direction. As shown in FIG. 6A, the spacer film 642 is formed over each of the MTJs 202(1)-202(3) and over the interconnect layer 216 in a conformal manner. The dielectric layer 652 is deposited over the spacer film 642. The spacer film 642 can be deposited using processes such as CVD or PVD and can comprise materials such as SiO2, SiON, silicon carbide (SiC), SiCN, SiCON, aluminum oxide (AlOx), and/or SiNx, as non-limiting examples. The dielectric layer 652 can be deposited using processes such as CVD, PVD, spin coating, and/or ultraviolet (UV) curing and can comprise a material such as SiO2, as a non-limiting example. The dielectric layer 652 can be further processed by processes such as CMP, and cleaning processes, as non-limiting examples.

FIG. 6B illustrates a cross-sectional view of a second fabrication stage 600(2) of removing a portion of the dielectric layer 652 over each MTJ stack 204(1)-204(3) to expose a top surface 654(1)-654(3) of each top electrode layer 209(1)-209(3). In this regard, a first top photoresist mask 656 is used to expose the portion of the dielectric layer 652 to be removed. The selected portions of the dielectric layer 652 above the top surface 654(1)-654(3) of each top electrode layer 209(1)-209(3) are then removed. In this manner, the top metal lines 650(1)-650(3) can be formed therein. The first top photoresist mask 656 can be used in processes such as photolithography and etching and can comprise materials such as photoresist materials, as non-limiting examples. Removing the dielectric layer 652 can comprise processes such as dry etching, and cleaning processes, as non-limiting examples.

FIG. 6C illustrates a cross-sectional view of a third fabrication stage 600(3) of fabricating each top interconnect 644(1)-644(3) in the Y-axis direction over the top surface 654(1)-654(3) of each respective top electrode layer 209(1)-209(3). In this regard, each top interconnect 644(1)-644(3) includes a top metal line 650(1)-650(3), which is deposited over the top surface 654(1)-654(3) of each respective top electrode layer 209(1)-209(3). A top diffusion barrier 658 is formed above the top interconnect 644(1)-644(3). Each top interconnect 644(1)-644(3) can be deposited in processes such as PVD, electrical plating, CMP, and/or cleaning processes, and can comprise materials such as Ta/TaN, and Cu, as non-limiting examples. The top diffusion barrier 658 can be deposited using processes such as CVD or PVD and can comprise materials such as SiCN, and/or SiNx, as non-limiting examples. In this manner, the MTJs 202(1)-202(3) having varying energy barriers provided in FIG. 2B, and formed in exemplary fabrication processes such as FIGS. 4A-4S and 5A-5R, can be implemented in MRAM bit cells 201(1)-201(3) in different MRAM arrays 208(1)-208(3) in the semiconductor die 200.

Figure 7B:
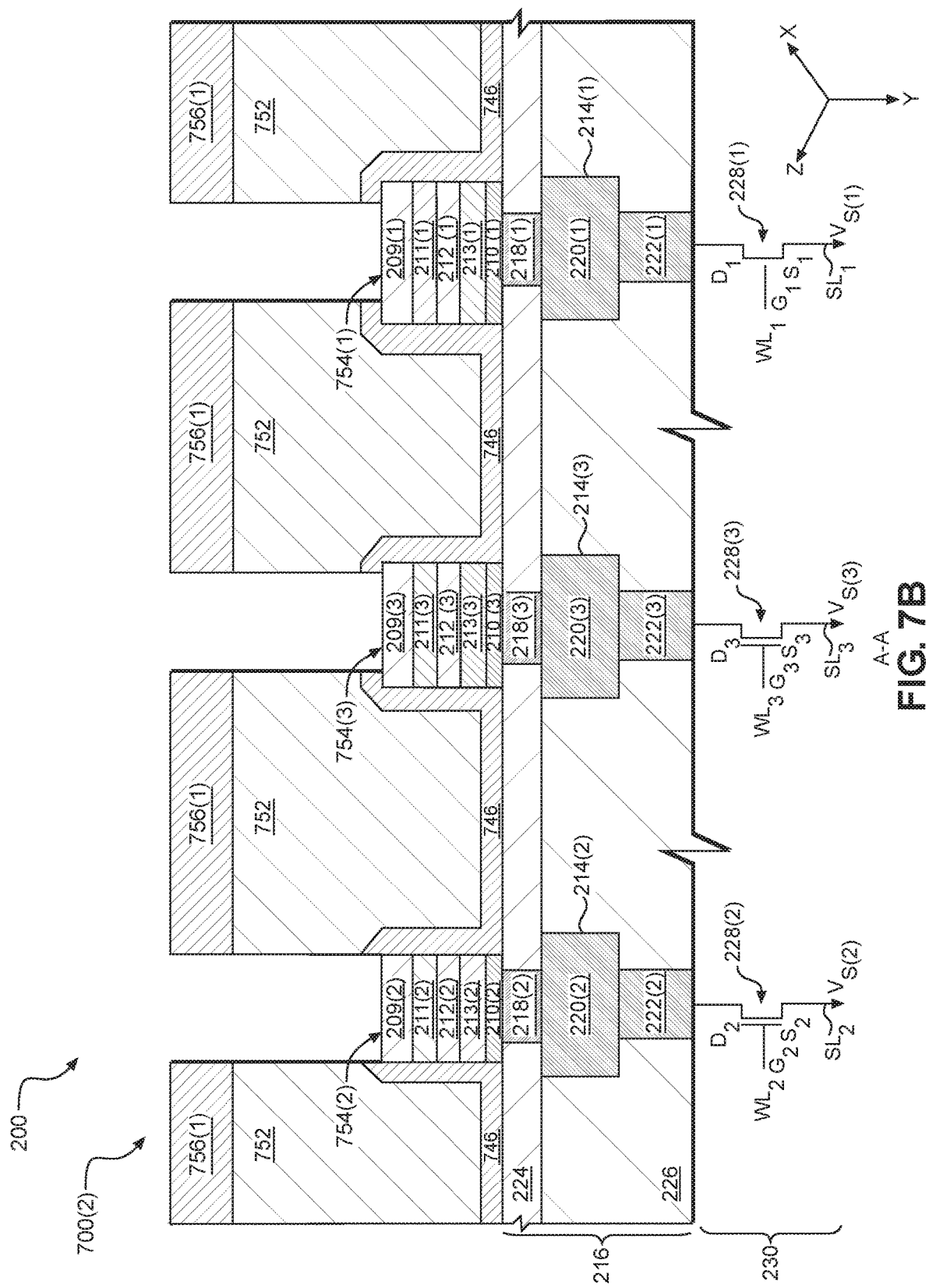

In this regard, FIGS. 7A-7D illustrate cross-sectional views at various stages of forming MRAM bit cells 201(1)-201(3) having a spacer film 746 over the interconnect layer 216 and a top via 748V(1)-748V(3) and a top metal line 750M(1)-750M(3) as a top interconnect 744(1)-744(3) in different MRAM arrays 208(1)-208(3) from the MTJ stacks 204(1)-204(3) having varying energy barriers $E_{b(1)}$-$E_{b(3)}$, as provided in FIG. 2B. In this regard, FIG. 7A illustrates a cross-sectional view of a first fabrication stage 700(1) of forming the spacer film 746 adjacent to each MTJ stack 204(1)-204(3). FIG. 7A further illustrates depositing a dielectric layer 752 adjacent to the spacer film 746 and over each MTJ stack 204(1)-204(3). As shown in FIG. 7A, the spacer film 746 is formed over each of the MTJs 202(1)-202(3) and over the interconnect layer 216 in a conformal manner. The dielectric layer 752 is deposited over the spacer film 746. The spacer film 746 can be deposited using processes such as CVD or PVD and can comprise materials such as SiO2, SiON, SiC, SiCN, SiCON, AlOx, and/or SiNx, as non-limiting examples. The dielectric layer 752 can be deposited using processes such as CVD, PVD, spin coating, and/or UV curing, and can comprise a material such as SiO2, as non-limiting examples. The dielectric layer 752 can be further processed by processes such as CMP and/or cleaning processes, as non-limiting examples.

FIG. 7B illustrates a cross-sectional view of a second fabrication stage 700(2) of removing a portion of the dielectric layer 752 over each MTJ stack 204(1)-204(3) to expose a top surface 754(1)-754(3) of each top electrode layer 209(1)-209(3). In this regard, a first top photoresist mask 756(1) is used to expose the portion of the dielectric layer 752 to be removed. The selected portions of the dielectric layer 752 above the top surface 754(1)-754(3) of each top electrode layer 209(1)-209(3) are then removed. The first top photoresist mask 756(1) can be used in processes such as spin coating, and photolithography, and can comprise materials such as photoresist materials, as non-limiting examples. Removing the dielectric layer 752 can comprise processes such as dry etching, and cleaning processes, as non-limiting examples.

Figure 7C:
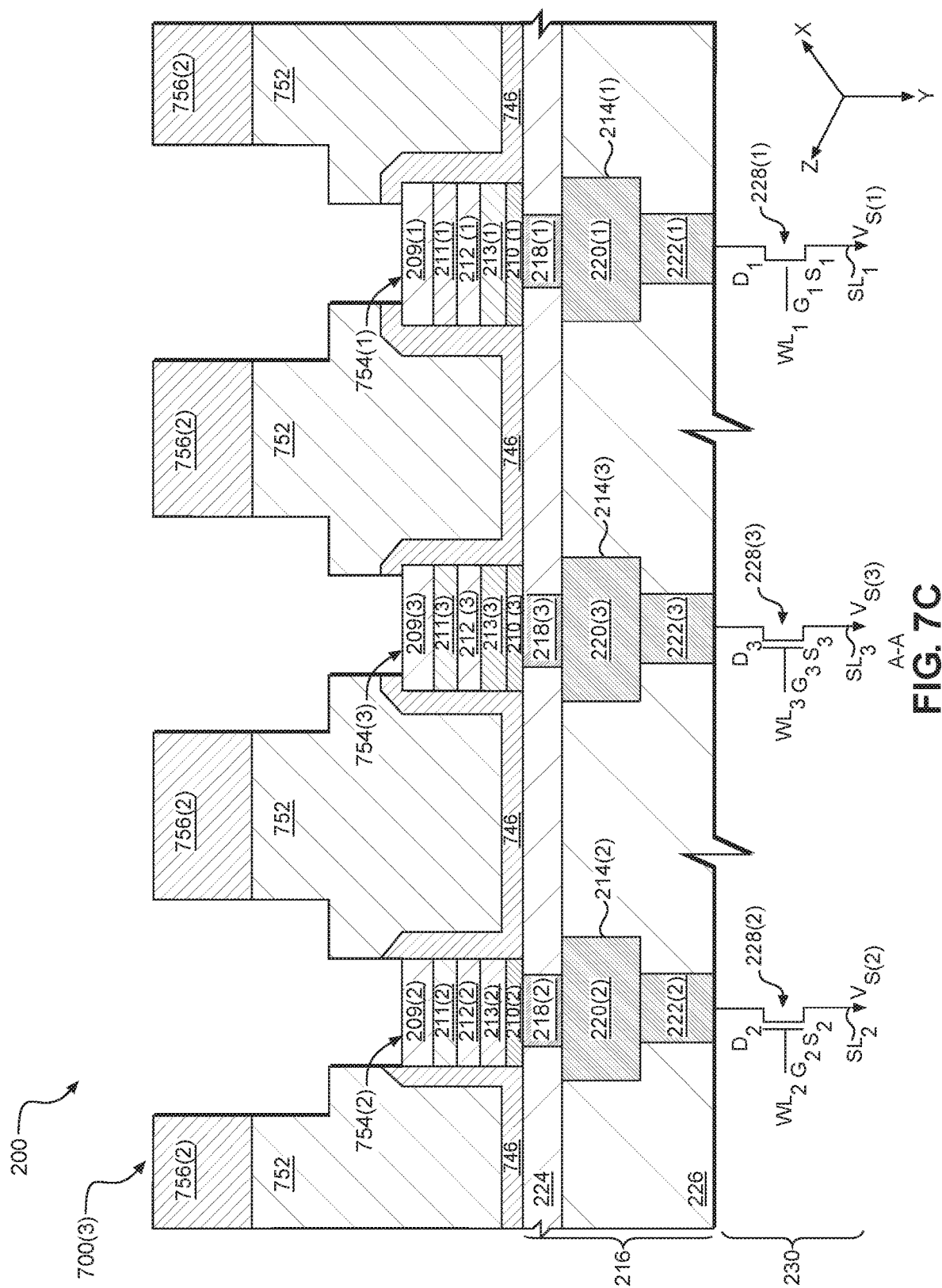

FIG. 7C illustrates a cross-sectional view of a third fabrication stage 700(3) of removing additional portions of the dielectric layer 752 over each MTJ stack 204(1)-204(3) to allow each top via 748V(1)-748V(3) and each top metal line 750M(1)-750M(3), shown in a later step, to be formed as each top interconnect 744(1)-744(3). In this regard, FIG. 7C illustrates using a second top photoresist mask 756(2) to expose the additional portions of the dielectric layer 752 to be removed. The selected additional portions of the dielectric layer 752 are then removed. The second top photoresist mask 756(2) can be used in processes such as spin coating, and photolithography and can comprise materials such as photoresist materials as non-limiting examples. Removing the dielectric layer 752 can comprise processes such as dry etching, and cleaning processes, as non-limiting examples.

FIG. 7D illustrates a cross-sectional view of a fourth fabrication stage 700(4) of forming each top interconnect 744(1)-744(3) in the Y-axis direction over the top surface 754(1)-754(3) of each respective top electrode layer 209(1)-209(3). In this regard, each top interconnect 744(1)-744(3) includes a top via 748V(1)-748V(3) and a top metal line 750M(1)-750M(3), which are deposited over the top surface 754(1)-754(3) of each respective top electrode layer 209(1)-209(3). A top diffusion barrier 758 is formed above the top interconnect 744(1)-744(3). Each top interconnect 744(1)-744(3) can be deposited in processes such as PVD, electrical plating, CMP, and/or cleaning processes, and can comprise materials such as Ta/TaN, and/or Cu, as non-limiting examples. The top diffusion barrier 758 can be deposited in processes such as CVD and PVD, and can comprise materials such as SiCN, and/or SiNx, as non-limiting examples. In this manner, the MTJs 202(1)-202(3) having varying energy barriers provided in FIG. 2B, and formed in exemplary fabrication processes such as FIGS. 4A-4S and 5A-5R, can be implemented in MRAM bit cells 201(1)-201(3) in different MRAM arrays 208(1)-208(3) in the semiconductor die 200.

Figure 8A:
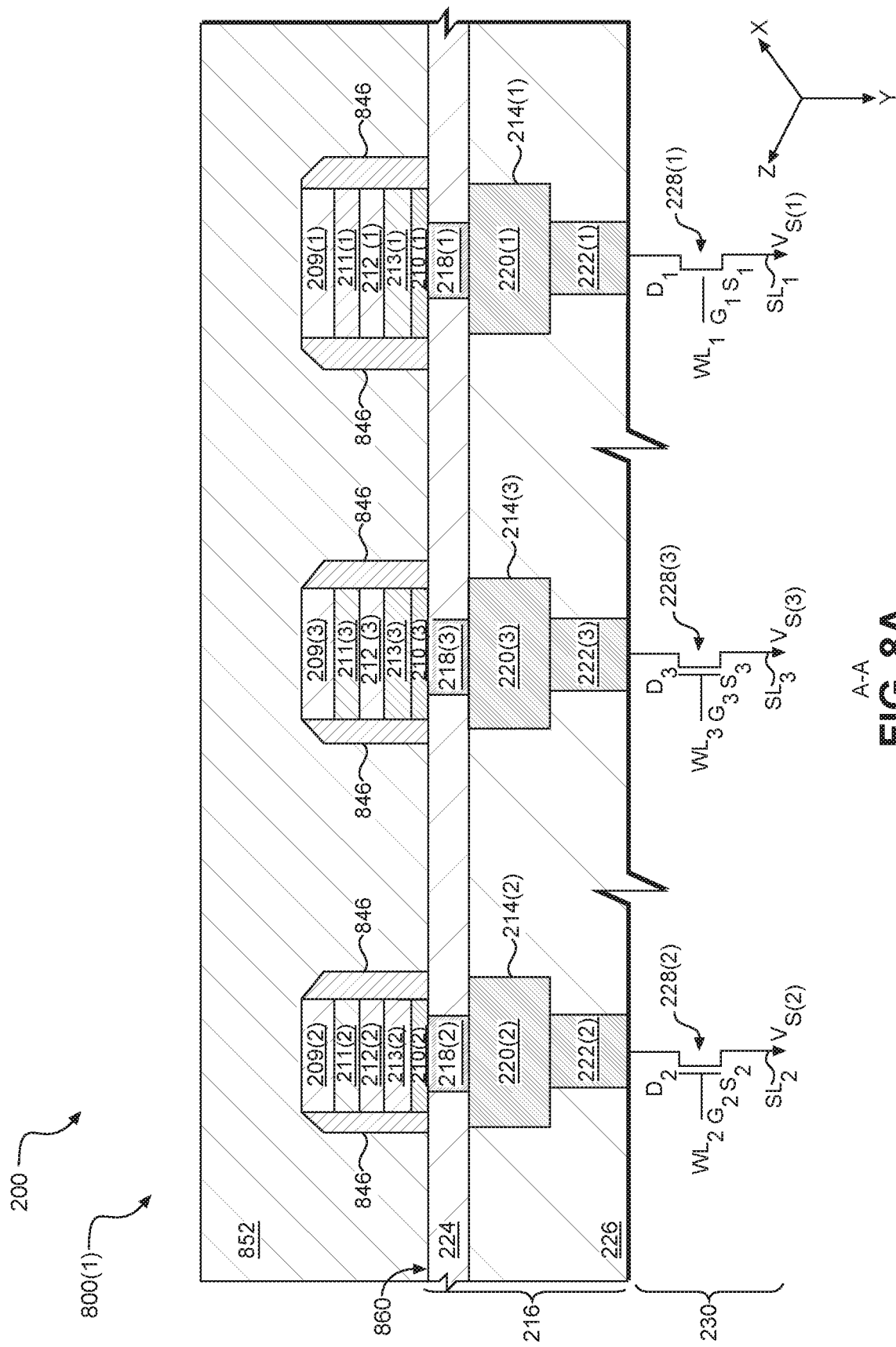
Figure 8B:
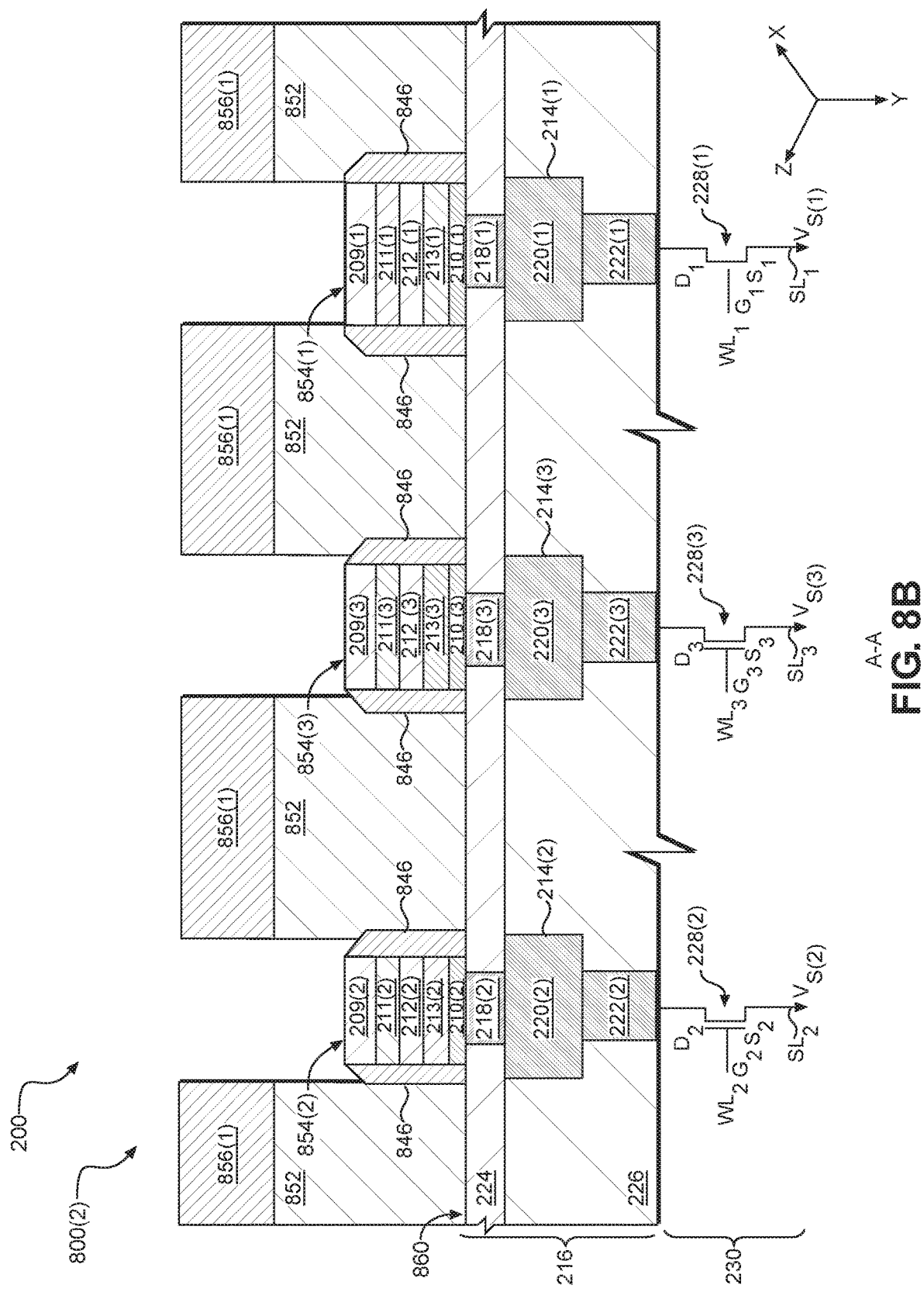

In this regard, FIGS. 8A-8C illustrate cross-sectional views at various stages of forming MRAM bit cells 201(1)-201(3) having a spacer film 846 adjacent to each MTJ stack 204(1)-204(3) and a top via 850(1)-850(3) as a top interconnect 844(1)-844(3) in different MRAM arrays 208(1)-208(3) from the MTJ stacks 204(1)-204(3) having varying energy barriers $E_{b(1)}$-$E_{b(3)}$, as provided in FIG. 2B. In this regard, FIG. 8A illustrates a cross-sectional view of a first fabrication stage 800(1) of forming the spacer film 846 adjacent to each MTJ stack 204(1)-204(3) to expose a top surface 860 of the interconnect layer 216 of the semiconductor die 200 and a top surface 854(1)-854(3) of each top electrode layer 209(1)-209(3) from the spacer film 846. FIG. 8A further illustrates depositing a dielectric layer 852 adjacent to the spacer film 846, over each MTJ stack 204(1)-204(3), and over the exposed top surface 860 of the interconnect layer 216. As shown in FIG. 8A, the spacer film 846 is formed laterally adjacent to each of the MTJs 202(1)-202(3). The dielectric layer 852 is deposited over the spacer film 846 and the top surface 860 of the interconnect layer 216. The spacer film 846 can be deposited using processes such as CVD, PVD, and/or dry etch back, and can comprise materials such as SiO2, SiON, SiC, SiCN, SiCON, AlOx, and/or SiNx, as non-limiting examples. The dielectric layer 852 can be deposited using processes such as CVD and/or PVD and can comprise a material such as SiO2. The dielectric layer 852 can be further processed by processes such as CMP and/or cleaning processes, as non-limiting examples.

FIG. 8B illustrates a cross-sectional view of a second fabrication stage 800(2) of removing a portion of the dielectric layer 852 over each MTJ stack 204(1)-204(3) to expose a top surface 854(1)-854(3) of each top electrode layer 209(1)-209(3). In this regard, a first top photoresist mask 856(1) is used to expose the portion of the dielectric layer 852 to be removed. The selected portions of the dielectric layer 852 above the top surface 854(1)-854(3) of each top electrode layer 209(1)-209(3) are then removed. In this manner, the top metal lines 850(1)-850(3) can be formed therein in a later step. The first top photoresist mask 856(1) can be used in processes such as spin coating, photolithography, and baking, and can comprise materials such as photoresist materials as non-limiting examples. Removing the dielectric layer 852 can comprise processes such as dry etching, and cleaning processes, as non-limiting examples.

FIG. 8C illustrates a cross-sectional view of a third fabrication stage 800(3) of fabricating each top interconnect 844(1)-844(3) in the Y-axis direction over the top surface 854(1)-854(3) of each respective top electrode layer 209(1)-209(3). In this regard, each top interconnect 844(1)-844(3) includes a top metal line 850(1)-850(3), which is deposited over the top surface 854(1)-854(3) of each respective top electrode layer 209(1)-209(3). A top diffusion barrier 858 is formed above the top interconnect 844(1)-844(3). Each top interconnect 844(1)-844(3) can be deposited in processes such as PVD, electrical plating, CMP, and/or cleaning processes, and can comprise materials such as Ta/TaN, and/or Cu, as non-limiting examples. The top diffusion barrier 858 can be deposited in processes such as CVD or PVD and can comprise materials such as SiCN, and/or SiNx, as non-limiting examples. In this manner, the MTJs 202(1)-202(3) having varying energy barriers $E_{b(1)}$-$E_{b(3)}$ provided in FIG. 2B, and formed in exemplary fabrication processes such as FIGS. 4A-4S and 5A-5R, can be implemented in MRAM bit cells 201(1)-201(3) in different MRAM arrays 208(1)-208(3) in the semiconductor die 200.

Figure 9A:
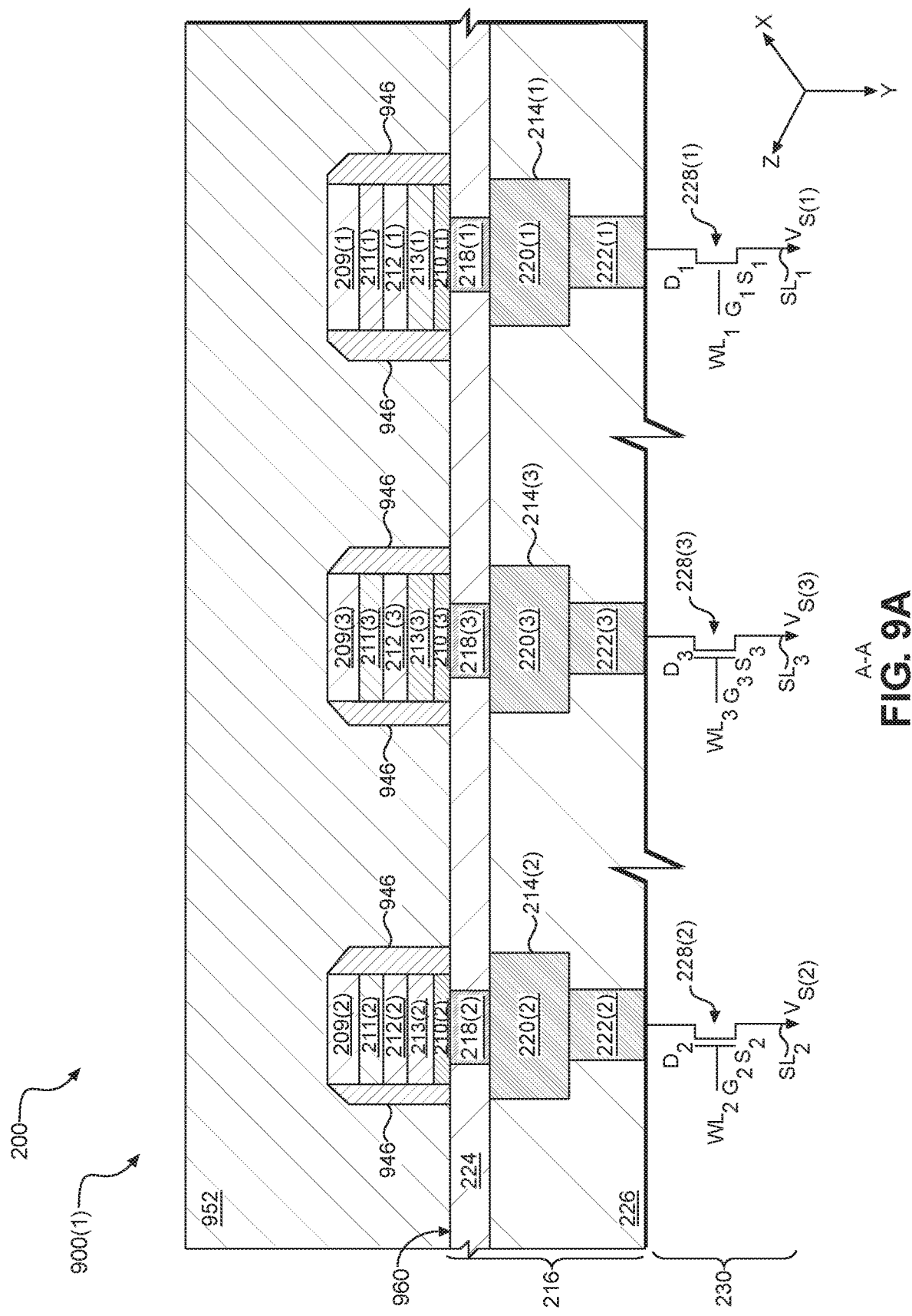
FIGS. 9A-9D are cross-sectional diagrams illustrating exemplary process steps of fabricating MRAM bit cells having a top surface of an interconnect layer exposed from a spacer film and a top via over MTJ stacks in different MRAM arrays having varying energy barriers as provided in FIGS. 2A and 2B.
Figure 9B:
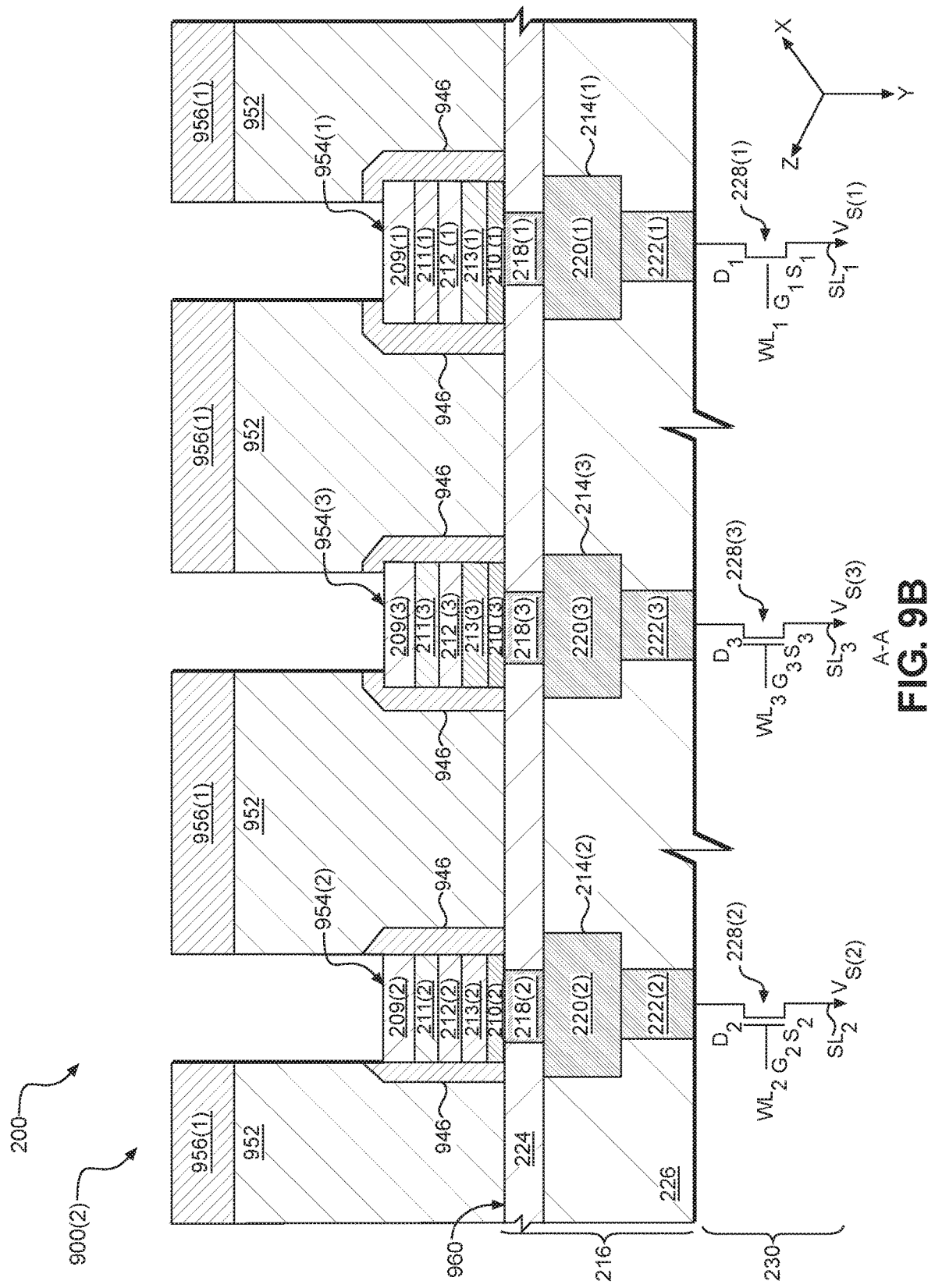
Figure 9C:
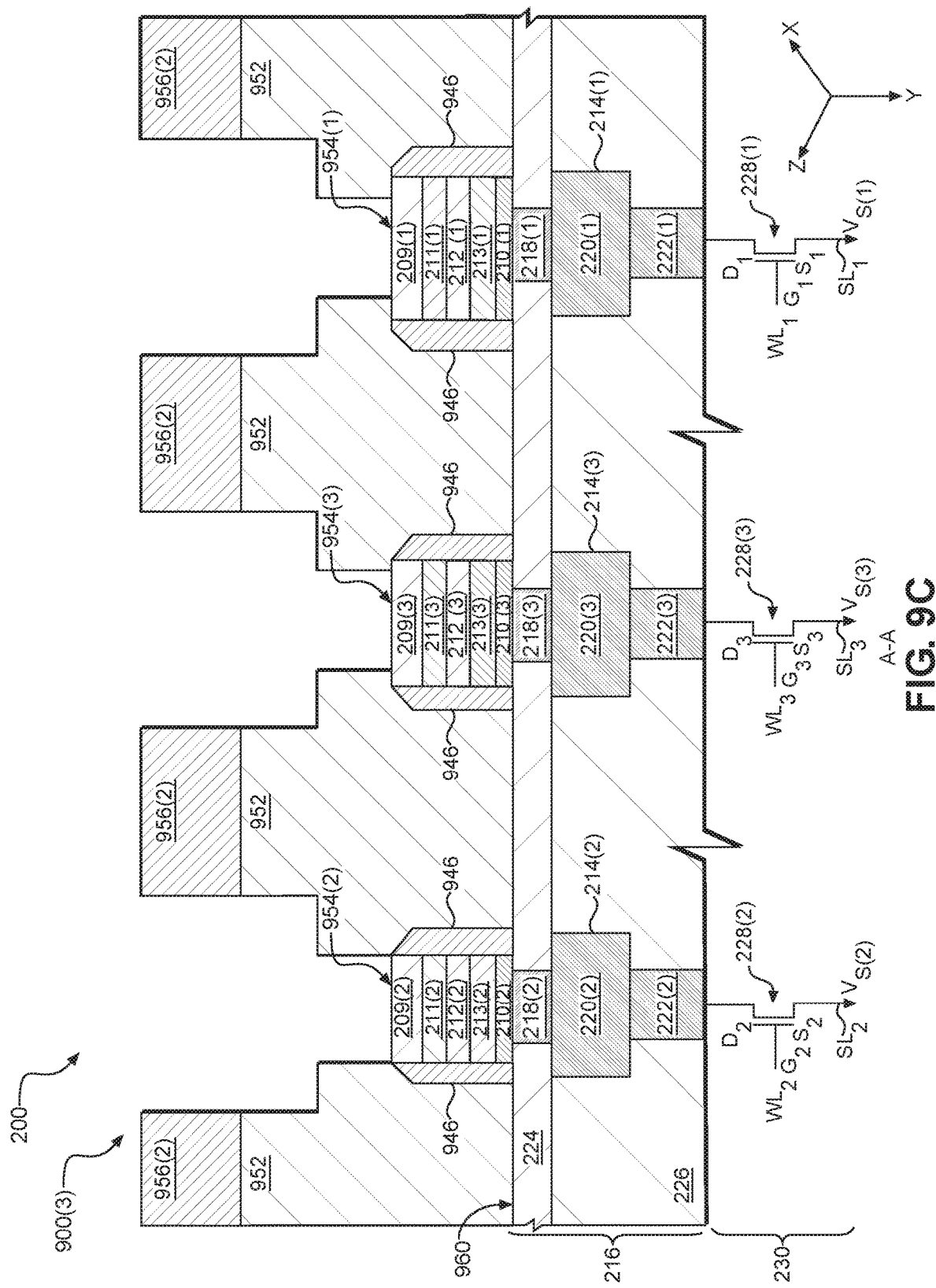

In this regard, FIGS. 9A-9C illustrate cross-sectional views at various stages of fabricating MRAM bit cells 201(1)-201(3) having a spacer film 946 adjacent to each MTJ stack 204(1)-204(3) and a top via 948V(1)-948V(3) and a top metal line 950M(1)-950M(3) as a top interconnect 944(1)-944(3) in different MRAM arrays 208(1)-208(3) from the MTJ stacks 204(1)-204(3) having varying energy barriers $E_{b(1)}$-$E_{b(3)}$, as provided in FIG. 2B. In this regard, FIG. 9A illustrates a cross-sectional view of a first fabrication stage 900(1) of forming the spacer film 946 adjacent to each MTJ stack 204(1)-204(3) to expose a top surface 960 of the interconnect layer 216 of the semiconductor die 200 and a top surface 954(1)-954(3) of each top electrode layer 209(1)-209(3) from the spacer film 946. FIG. 9A further illustrates depositing a dielectric layer 952 adjacent to the spacer film 946, over each MTJ stack 204(1)-204(3), and over the exposed top surface 960 of the interconnect layer 216. As shown in FIG. 8A, the spacer film 946 is formed laterally adjacent to each of the MTJs 202(1)-202(3). The dielectric layer 952 is deposited over the spacer film 946 and the top surface 960 of the interconnect layer 216. The spacer film 946 can be deposited using processes such as CVD, PVD, and/or dry etch back, and can comprise materials such as SiO2, SiON, SiC, SiCN, SiCON, AlOx, and/or SiNx, as non-limiting examples. The dielectric layer 952 can be deposited using processes such as CVD, PVD, spin coating, and/or UV curing, and can comprise a material such as SiO2, as non-limiting examples. The dielectric layer 952 can be further processed by processes such as CMP and/or cleaning processes, as non-limiting examples.

FIG. 9B illustrates a cross-sectional view of a second fabrication stage 900(2) of removing a portion of the dielectric layer 952 over each MTJ stack 204(1)-204(3) to expose a top surface 954(1)-954(3) of each top electrode layer 209(1)-209(3). In this regard, a first top photoresist mask 956(1) is used to expose the portion of the dielectric layer 952 to be removed. The selected portions of the dielectric layer 952 above the top surface 954(1)-954(3) of each top electrode layer 209(1)-209(3) are then removed. The first top photoresist mask 956(1) can be used in processes such as spin coating, photolithography, baking, and/or cleaning processes, and can comprise materials such as photoresist materials, as non-limiting examples. Removing the dielectric layer 952 can comprise processes such as dry etching, and cleaning processes, as non-limiting examples.

FIG. 9C illustrates a cross-sectional view of a third fabrication stage 900(3) of removing additional portions of the dielectric layer 952 over each MTJ stack 204(1)-204(3) to allow each top via 948V(1)-948V(3) and each top metal line 950M(1)-950M(3) to be formed as each top interconnect 944(1)-944(3). In this regard, FIG. 9C illustrates using a second top photoresist mask 956(2) to expose the additional portions of the dielectric layer 952 to be removed. The selected additional portions of the dielectric layer 952 are then removed. The second top photoresist mask 956(2) can be used in processes such as spin coating, photolithography, baking, and/or cleaning processes, and can comprise materials such as photoresist materials, as non-limiting examples. Removing the dielectric layer 952 can comprise processes such as dry etching, and cleaning processes, as non-limiting examples.

Figure 9D:
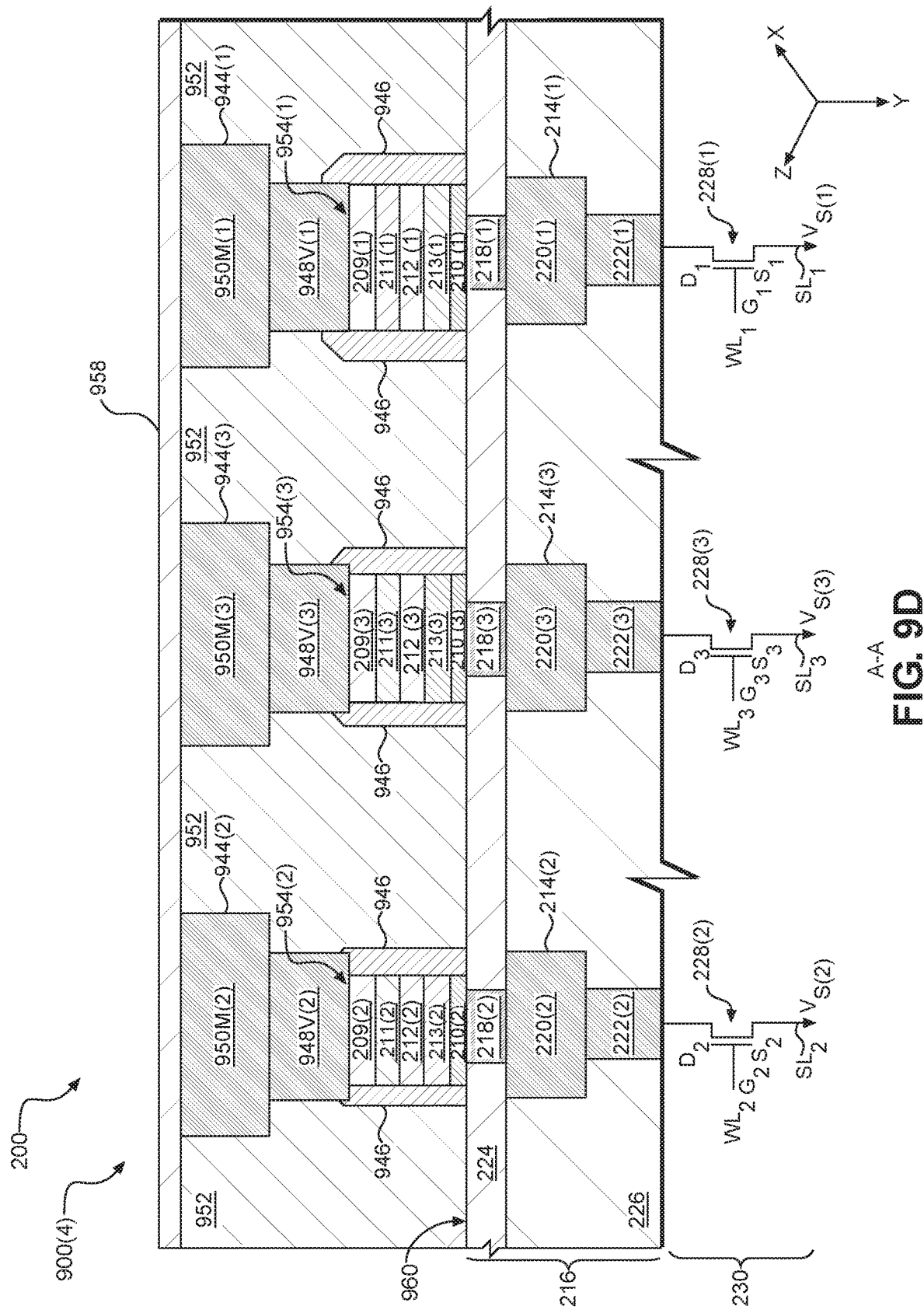

FIG. 9D illustrates a cross-sectional view of a fourth fabrication stage 900(4) of forming each top interconnect 944(1)-944(3) in the Y-axis direction over the top surface 954(1)-954(3) of each respective top electrode layer 209(1)-209(3). In this regard, each top interconnect 944(1)-944(3) includes a top via 948V(1)-9V(3) and a top metal line 950M(1)-950M(3), which are deposited over the top surface 954(1)-954(3) of each respective top electrode layer 209(1)-209(3). A top diffusion barrier 958 is formed above the top interconnects 944(1)-944(3). Each top interconnect 944(1)-944(3) can be deposited in processes such as PVD, electrical plating, CMP, and/or cleaning processes, and can comprise materials such as Ta/TaN, and/or Cu, as non-limiting examples. The top diffusion barrier 958 can be deposited in processes such as CVD and/or PVD and can comprise materials such as SiCN, and/or SiNx, as non-limiting examples. In this manner, the MTJs 202(1)-202(3) having varying energy barriers $E_{b(1)}$-$E_{b(3)}$ provided in FIG. 2B, and formed in exemplary fabrication processes such as FIGS. 4A-4S and 5A-5R, can be implemented in MRAM bit cells 201(1)-201(3) in different MRAM arrays 208(1)-208(3) in the semiconductor die 200.

Varying energy barriers of MTJs in different MRAM arrays in a semiconductor die to facilitate use of MRAM for different memory applications according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 10:
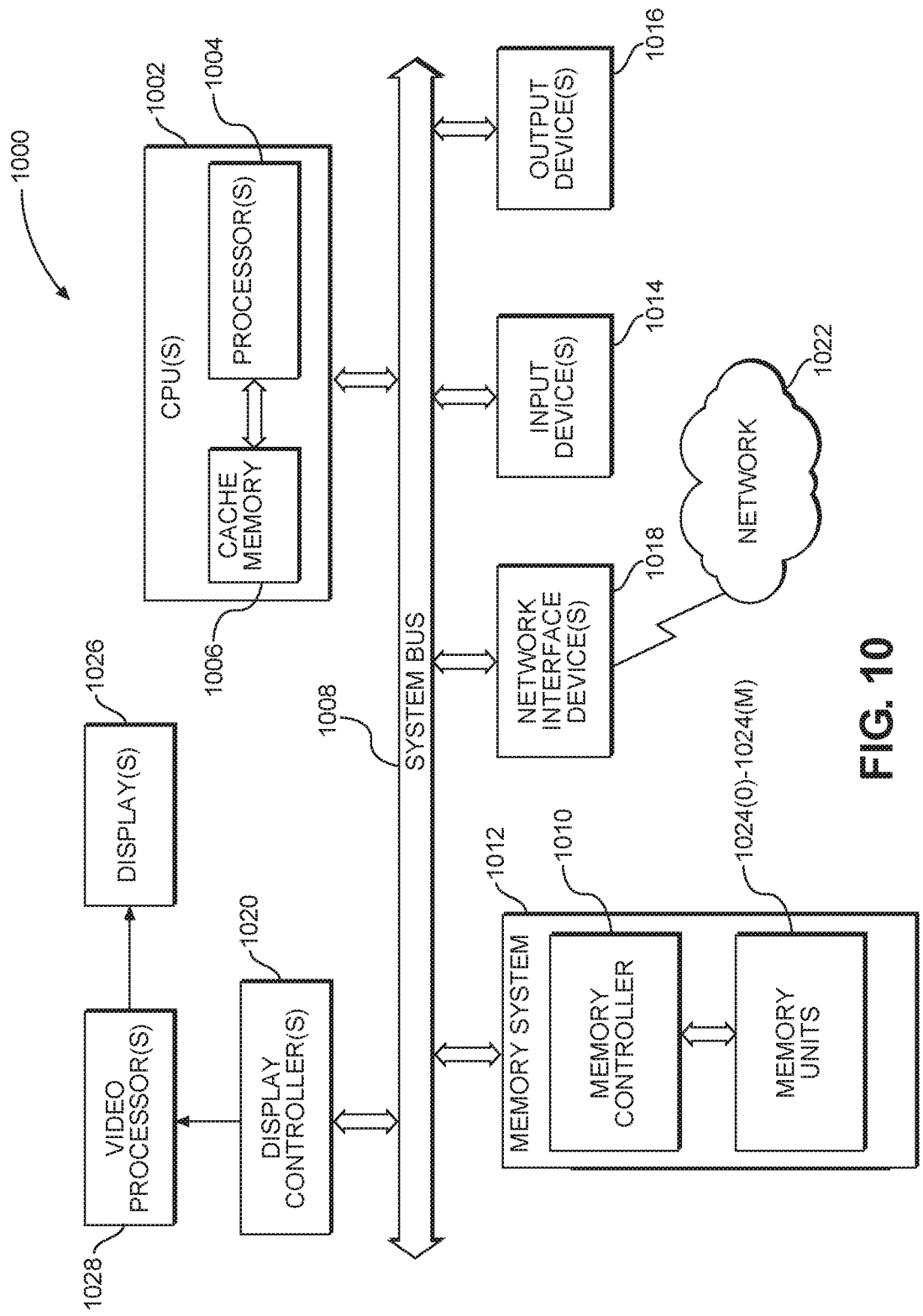
FIG. 10 is a block diagram of an exemplary processor-based system that can include MTJ stacks having varying energy barriers that can be provided in MTJs in MRAM bit cells in different MRAM arrays to provide different types of memory in a semiconductor die while still achieving distinct performance specifications.

In this regard, FIG. 10 illustrates an example of a processor-based system 1000 that can employ MRAM bit cells in MRAM arrays in a semiconductor die having MTJs with varying energy barriers, as illustrated in FIGS. 6A-6C, 7A-7D, 8A-8C, and 9A-9D. In this example, the processor-based system 1000 includes one or more central processing unit(s) (CPU(s)) 1002, each including one or more processors 1004. Although not shown, the CPU(s) 1002 can include at least one CPU core. The CPU(s) 1002 may be a master device. The CPU(s) 1002 may have cache memory 1006 coupled to the processor(s) 1004 for rapid access to temporarily stored data. The CPU(s) 1002 is coupled to a system bus 1008 and can intercouple master and slave devices included in the processor-based system 1000. As is well known, the CPU(s) 1002 communicates with these other devices by exchanging address, control, and data information over the system bus 1008. For example, the CPU(s) 1002 can communicate bus transaction requests to a memory controller 1010 as an example of a slave device. Although not illustrated in FIG. 10, multiple system buses 1008 could be provided, wherein each system bus 1008 constitutes a different fabric.

Other master and slave devices can be connected to the system bus 1008. As illustrated in FIG. 10, these devices can include a memory system 1012, one or more input devices 1014, one or more output devices 1016, one or more network interface devices 1018, and one or more display controllers 1020, as examples. The input device(s) 1014 can include any type of input device, including, but not limited to, input keys, switches, voice processors, etc. The output device(s) 1016 can include any type of output device, including, but not limited to, audio, video, other visual indicators, etc. The network interface device(s) 1018 can be any devices configured to allow exchange of data to and from a network 1022. The network 1022 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1018 can be configured to support any type of communications protocol desired. The memory system 1012 can include one or more memory units 1024(0)-1024(M).

The CPU(s) 1002 may also be configured to access the display controller(s) 1020 over the system bus 1008 to control information sent to one or more displays 1026. The display controller(s) 1020 sends information to the display(s) 1026 to be displayed via one or more video processors 1028, which process the information to be displayed into a format suitable for the display(s) 1026. The display(s) 1026 can include any type of display, including, but not limited to, a cathode ray tube (CRT), a liquid crystal display (LCD), a plasma display, a light emitting diode (LED) display, etc.

In another example, a semiconductor die including a first means for storing data and a second means for storing data can be provided. The first means for storing data comprises a first means for storing a fixed magnetic moment having a first fixed magnetic moment, and a first means for storing a programmable magnetic moment having a first programmable magnetic moment. The first means for storing data also comprises a first means for transferring spin polarization of electrons disposed between the first means for storing the fixed magnetic moment and the first means for storing the programmable magnetic moment. The first means for storing data has a first energy barrier. The second means for storing data comprises a second means for storing a fixed magnetic moment having a second fixed magnetic moment, and a second means for storing a programmable magnetic moment having a second programmable magnetic moment. The second means for storing data also comprises a second means for transferring spin polarization of electrons disposed between the second means for storing the fixed magnetic moment and the second means for storing the programmable magnetic moment. The second means for storing data has a second energy barrier different from the first energy barrier.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The arbiters, master devices, and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A method of varying energy barriers of magnetic tunnel junctions (MTJs) in different magneto-resistive random access memory (MRAM) arrays in a semiconductor die, comprising:
    while leaving a first via exposed, forming a first blocking layer over a second via of a second MRAM array, wherein the second via is in an interconnect layer of the semiconductor die;
    depositing a first MTJ stack film over the first via of a first MRAM array and at least a portion of the first blocking layer over the second via, wherein the first via is in the interconnect layer of the semiconductor die;
    depositing a first top electrode film over the first MTJ stack film;
    depositing a first mask over a portion of the first top electrode film over the first MTJ stack film over the first via;
    removing a portion of the first top electrode film and a portion of the first MTJ stack film not under the first mask to form a first top electrode layer over a first MTJ stack over the first via of the first MRAM array;
    removing the first mask;
    removing at least a portion of the first blocking layer over the second via of the second MRAM array;
    forming a second blocking layer over the first MTJ stack of the first MRAM array;
    depositing a second MTJ stack film over the second via of the second MRAM array and at least a portion of the second blocking layer;
    depositing a second top electrode film over the second MTJ stack film;
    depositing a second mask over a portion of the second top electrode film over the second MTJ stack film over the second via; and removing a portion of the second top electrode film and a portion of the second MTJ stack film not under the second mask to form a second top electrode layer over a second MTJ stack over the second via of the second MRAM array.

2. The method of claim 1, wherein:
depositing the first MTJ stack film over the first via of the first MRAM array and at least the portion of the first blocking layer comprises depositing a first pinned film, a first tunnel barrier film, and a first free film over the first via of the first MRAM array and at least the portion of the first blocking layer; and
depositing the second MTJ stack film over the second via of the second MRAM array and at least the portion of the second blocking layer comprises depositing a second pinned film, a second tunnel barrier film, and a second free film over the second via of the second MRAM array and at least the portion of the second blocking layer, wherein the interconnect layer further comprises a bottom electrode film over the first via of the first MRAM array and the second via of the second MRAM array.

3. The method of claim 2, further comprising:
removing a portion of the bottom electrode film not under the first MTJ stack and the second MTJ stack to form a first bottom electrode layer under the first MTJ stack and a second bottom electrode layer under the second MTJ stack.

4. The method of claim 3, further comprising:
forming a spacer film adjacent to the first MTJ stack and the second MTJ stack; depositing a dielectric layer adjacent to the spacer film and over the first MTJ stack and the second MTJ stack;
removing a portion of the dielectric layer over the first MTJ stack and the second MTJ stack to expose a first top surface of the first top electrode layer and a second top surface of the second top electrode layer;
forming a first top electrode via over the first top surface of the first top electrode layer; and
forming a second top electrode via over the second top surface of the second top electrode layer.

5. The method of claim 4, wherein forming the spacer film adjacent to the first MTJ stack and the second MTJ stack comprises forming the spacer film adjacent to the first MTJ stack and the second MTJ stack to expose a top surface of the interconnect layer of the semiconductor die.

6. The method of claim 2, wherein:
depositing the first pinned film comprises depositing one or more of Cobalt (Co), Platinum (Pt), and Nickel (Ni); and
depositing the second pinned film comprises depositing one of more of Co, Pt, and Ni.

7. The method of claim 1, wherein:
depositing the first MTJ stack film over the first via of the first MRAM array and at least the portion of the first blocking layer comprises depositing a first bottom electrode film, a first pinned film, a first tunnel barrier film, and a first free film over the first via of the first MRAM array and at least the portion of the first blocking layer; and
depositing the second MTJ stack film over the second via of the second MRAM array and at least the portion of the second blocking layer comprises depositing a second bottom electrode film, a second pinned film, a second tunnel barrier film, and a second free film over the second via of the second MRAM array and at least the portion of the second blocking layer.

8. The method of claim 7, wherein:
depositing the first free film comprises depositing one or more of Cobalt (Co), Iron (Fe), and Boron (B) such that the first free film has a first effective anisotropy energy constant; and
depositing the second free film comprises depositing one or more of Co, Fe, and B such that the second free film has a second effective anisotropy energy constant less than the first effective anisotropy energy constant.

9. The method of claim 1, further comprising:
forming the first blocking layer over a third via of a third MRAM array, wherein the third via is in the interconnect layer of the semiconductor die;
removing at least a portion of the first blocking layer over the third via of the third MRAM array;
forming the second blocking layer over a third MTJ stack of the third MRAM array; removing at least a portion of the second blocking layer over the third via of the third MRAM array;
depositing a third MTJ stack film over the third via of the third MRAM array;
depositing a third top electrode film over the third MTJ stack film;
depositing a third mask over a portion of the third top electrode film over the third MTJ stack film over the third via; and
removing a portion of the third top electrode film and a portion of the third MTJ stack film not under the third mask to form a third top electrode layer over the third MTJ stack over the third via of the third MRAM array.

10. A method of varying energy barriers of magnetic tunnel junctions (MTJs) in different magneto-resistive random access memory (MRAM) arrays in a semiconductor die, comprising:
while leaving a first via exposed, forming a first blocking layer over a second via of a second MRAM array, wherein the second via is in an interconnect layer of the semiconductor die;
forming a first MTJ stack film over the first via of a first MRAM array and at least a portion of the first blocking layer over the second via, wherein the first via is in the interconnect layer of the semiconductor die;
forming a first top electrode layer over the first MTJ stack film;
removing at least a portion of the first blocking layer over the second via of the second MRAM array;
forming a second blocking layer over the first MTJ stack film of the first MRAM array;
forming a second MTJ stack film over the second via of the second MRAM array and at least a portion of the second blocking layer; and
forming a second top electrode layer over the second MTJ stack film.

11. The method of claim 10, wherein:
forming the first MTJ stack film over the first via of the first MRAM array comprises depositing a first bottom electrode film, a first pinned film, a first tunnel barrier film, and a first free film over the first via of the first MRAM array; and
forming the second MTJ stack film over the second via of the second MRAM array comprises depositing a second bottom electrode film, a second pinned film, a second tunnel barrier film, and a second free film over the second via of the second MRAM array.

12. The method of claim 10, further comprising:
removing the second blocking layer and the first blocking layer over a third via of a third MRAM array, wherein the third via is in the interconnect layer of the semiconductor die;
forming a third MTJ stack film over the third via of the third MRAM array; and
forming a third top electrode layer over the third MTJ stack film.

13. The method of claim 12, wherein:
forming the third MTJ stack film over the third via of the third MRAM array comprises depositing a third bottom electrode film, a third pinned film, a third tunnel barrier film, and a third free film over the third via of the third MRAM array.

14. The method of claim 12, wherein:
forming the second MTJ stack film further comprises forming the second MTJ stack film to have a second energy barrier that is lower than a first energy barrier of the first MTJ stack film; and
forming the third MTJ stack film further comprises forming the third MTJ stack film to have a third energy barrier that is lower than the second energy barrier of the second MTJ stack.

15. The method of claim 10, wherein:
forming the second MTJ stack film further comprises forming the second MTJ stack film to have a second energy barrier that is lower than a first energy barrier of the first MTJ stack film.

\* \* \* \* \*